United States Patent
Matsumoto et al.

(10) Patent No.: US 7,529,158 B2
(45) Date of Patent: May 5, 2009

(54) OPTICAL NEAR-FIELD GENERATOR AND RECORDING APPARATUS USING THE OPTICAL NEAR-FIELD GENERATOR

(75) Inventors: Takuya Matsumoto, Hachiouji (JP); Hideki Saga, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 491 days.

(21) Appl. No.: 10/455,373

(22) Filed: Jun. 6, 2003

(65) Prior Publication Data

US 2004/0085862 A1 May 6, 2004

(30) Foreign Application Priority Data

Nov. 1, 2002 (JP) .............................. 2002-319251

(51) Int. Cl.
    *G11B 11/00* (2006.01)
(52) U.S. Cl. .................................. 369/13.33; 369/13.13
(58) Field of Classification Search .............. 369/13.13, 369/13.33
    See application file for complete search history.

(56) References Cited

U.S. PATENT DOCUMENTS

| 6,567,373 | B1 * | 5/2003 | Kato et al. .................. 369/300 |
| 6,649,894 | B2 * | 11/2003 | Matsumoto et al. ...... 250/201.3 |
| 6,768,556 | B1 * | 7/2004 | Matsumoto et al. ......... 356/601 |
| 6,821,596 | B2 * | 11/2004 | Terao et al. ................. 428/64.1 |
| 6,949,732 | B2 * | 9/2005 | Kiguchi et al. .............. 250/216 |
| 2003/0223316 | A1 * | 12/2003 | Saga et al. ............... 369/13.33 |
| 2007/0041119 | A1 * | 2/2007 | Matsumoto et al. ...... 369/13.33 |
| 2007/0096854 | A1 * | 5/2007 | Matsumoto et al. ......... 335/208 |
| 2007/0286031 | A1 * | 12/2007 | Matsumoto .............. 369/13.13 |
| 2008/0191122 | A1 * | 8/2008 | Hongo et al. ............. 259/201.5 |

FOREIGN PATENT DOCUMENTS

JP          2003-149694       *    5/2003      .............. 369/13.13

OTHER PUBLICATIONS

Justin B. Judkins and Richard W. Ziolkowski, "Finite-Difference Time-Domain Modeling of Nonperfectly Conducting Metallic Thin-Film Gratings", J. Opt. Soc. Am. A/vol. 12, No. 9, Sep. 1995, pp. 1974-1983.

* cited by examiner

*Primary Examiner*—Tan X Dinh
(74) *Attorney, Agent, or Firm*—Reed Smith LLP; Juan Carlos A. Marquez, Esq.

(57) ABSTRACT

A near-field optical probe and optical near-field generator are provided. A problem of a probe having a scatterer in which optical near-field noises are generated at the parts other than for a point at which an intense optical near-field is generated, is solved. In one example of the probe, a surface of the parts except for a vertex of the scatterer at which the intense optical near-field is generated is etched so that an etching depth becomes not less than a penetration depth of the optical near-field. The probe facilitates control of noises when a sample is observed or recording marks are reproduced.

33 Claims, 44 Drawing Sheets

F I G. 9A
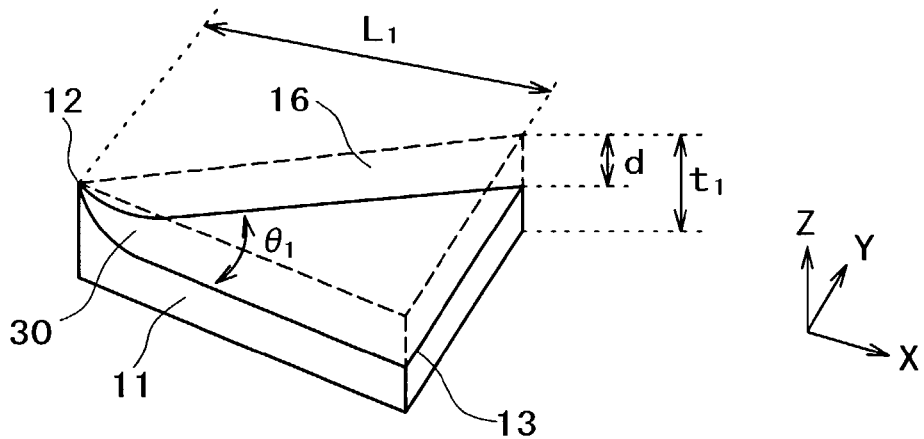
F I G. 9B
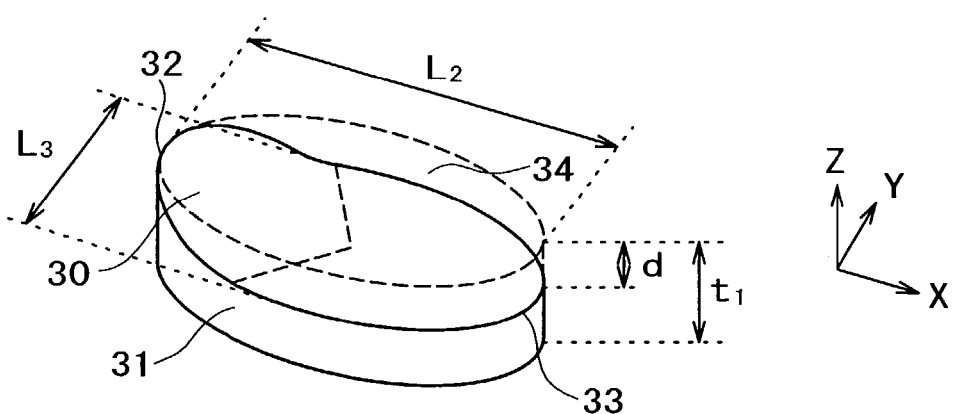
F I G. 9C
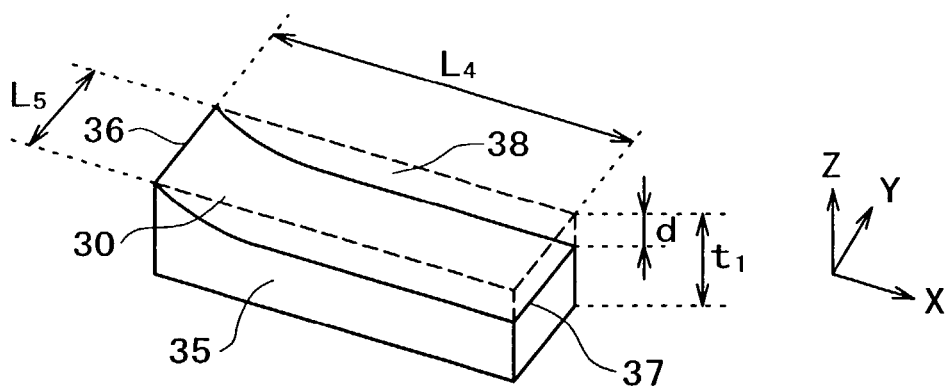

FABLICATING A
PATTERN EMBEDED
IN A SUBSTRATE

ETCHING

FABLICATING A
PATTERN EMBEDED
IN A SUBSTRATE

ETCHING

FABLICATING
A PATTERN WITH
TWO LAYERS THAT
IS EMBEDED IN
A SUBSTRATE

ETCHING

FABLICATING
A PATTERN WITH
TWO LAYERS THAT
IS EMBEDED IN
A SUBSTRATE

ETCHING

FABLICATING A PATTERN WITH TWO LAYERS THAT IS EMBEDED IN A SUBSTRATE

ETCHING

OPTICAL NEAR-FIELD GENERATOR AND RECORDING APPARATUS USING THE OPTICAL NEAR-FIELD GENERATOR

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

This invention generally relates optical recording and, more particularly, to a near-field optical probe and an optical near-field generator that generates an optical near-field.

2. Discussion of Background

In recent years, a probe that uses a planar metal scatterer has been proposed for optical recording. This is a probe in which a planar metal scatterer 351 in the shape of a triangle is formed on a flat substrate, as shown in FIGS. 43A and 43B. FIG. 43A shows a probe in which a single metal scatterer 351 is formed, and FIG. 43B shows a probe in which two metal scatterers 351 are formed. When light polarized in an X-direction is made to enter the probe, an optical near-field localized at a vertex 352 is generated. Particularly, by matching the wavelength of the incident light with resonance of plasmons, an extremely intense optical near-field can be generated (see Technical Digest of 6th International Conference on Near Field Optics and Related Techniques, the Netherlands, Aug. 27-31, 2000, p.55).

In the case of FIG. 43A, the optical near-field is generated from the vertex 352 of the metal scatterer 351, while in the case of FIG. 43B the two metal scatterers 354 are arranged so that a spacing between vertices thereof is a few tens of manometers to generate the optical near-field localized between the vertices 353. Note that in this description an optical near-field means localized light, namely light whose wave number has an imaginary component.

[Non-Patent Reference 1]

Technical Digest of 6th International Conference on Near Field Optics and Related Techniques, the Netherlands, Aug. 27-31, 2000, p.55.

The probe that uses the above-mentioned planar scatterer in the shape of a triangle is capable of realizing an extremely high optical near-field generation efficiency. With this probe, if the frequency of light and the resonance frequency of the plasmons generated in the metal are matched, an extremely high efficiency can be obtained.

However, when using a planar scatterer as described above, weak optical near-fields are generated at parts of the scatterer (hereinafter referred to as "the parts") except for the vertex at which the optical near-field is generated. For example, in the case where a scatterer in the shape of a triangle as shown in FIGS. 1A and 1B is used, in order to generate plasmon resonance, it is preferable that the length of the scatterer ($L_1$) is set not larger than light wavelength. At this time, vertices 13 other than the vertex 12 at which an intense optical near-field is generated also exist within a light spot for excitation. Unfortunately, weak optical near-fields are also generated at these vertices 13. If the optical near-fields are generated also at the vertices 13 in this way, when observing a sample or reproducing recording marks, scattered light that is generated therefrom is detected as noise.

SUMMARY OF THE INVENTION

It is the object of this invention to lessen influence of the optical near-fields generated at the parts except for the point at which the intense optical near-field is generated.

The above-mentioned object is attained by configuring the probe to have such a structure as follows. A scatterer is shaped so that the optical near-field is generated only at a single point, specifically, the thicknesses of the parts except for the single point at which the optical near-field is generated are reduced so that a spacing between the surface except for the single point and a sample (or medium) becomes larger than a spacing between the single point at which the optical near-field is generated and the sample (or medium).

It is advisable to reduce the thickness so that the spacing between the surface of the parts except for the single point at which the optical near-field is generated and the sample (or medium) become not less than the penetration depth of optical near-field. Here, the penetration depth of optical near-field is defined as a distance at which the light intensity becomes ½ of the light intensity on the scatterer surface.

As shown in FIG. 2, the optical near-field intensity decreases with increasing distance from the surface of a scatterer, and the penetration depth normally ranges from 2 nm to 10 nm. If the scatterer is made thinner so that a gap between a surface except for a single point at which the optical near-field is generated and the sample (or medium) becomes equal to or larger than the penetration depth of optical near-field, optical near-fields that are generated at the parts except for the vertex at which the optical near-field is generated become unable to reach the sample or medium.

Accordingly, it is possible to reduce a noise component caused by the optical near-fields that are generated at the parts except for the single vertex at which the optical near-field is generated can be made small. The scatterer is arranged so that a direction of the plane of that scatterer is substantially in parallel to a direction of the surface of the sample or recording medium.

The direction of the plane of the scatterer means a direction of the plane of the scatterer that is recognized before it is reduced in thickness. Further, being substantially parallel means that an angle formed by the plane of the scatterer and the surface of the sample or recording medium is in within 10 degrees. Note that a vertex includes not only a point at which a first line (side) and a second line (side) intersect but also cases where that point has a predetermined curvature.

The above-mentioned scatterer is chosen to be a planar scatterer (such as a scatterer of a planar triangle, sector, or trapezoid) that has a vertex whose radius of curvature is smaller than the wavelength of the incident light and whose width decreases gradually with decreasing distance to the vertex. The surface of each scatterer is etched except for the vicinity of the vertex existing at a part with reduced widths. When light form the light source is made to enter the scatterer, charges inside the scatterer concentrate at the vertex existing at the part with reduced widths and consequently the intense optical near-field is generated in the vicinity of the vertex.

Particularly, if the wavelength of the incident light, the material and length of the scatterer, etc. are adjusted so that the plasmon resonance may occur, an extremely intense optical near-field is generated in the vicinity of the vertex existing at the part with reduced widths. Although at this time a weak optical near-field is also generated at an edge on the opposite side of the vertex, since this part is set away from the sample or medium, it does not reach the sample or medium.

The above-mentioned scatterer may be a scatterer that is in the shape of a planar circle, ellipse, or rectangle whose surface is etched except for a single vertex. In the case of ellipses, when light polarized in a direction of the major axis is made to enter, the plasmon resonance occurs to generate the intense optical near-field at two vertices lying on the major axis. However, by etching a surface corresponding to one vertex, it is possible to prevent the optical near-field generated thereat from reaching the sample or recording medium.

The above-mentioned to-be-etched portion is etched away so that, for example, the etched part becomes substantially horizontal to a plane of the scatterer before having been etched, and a boundary region between the etched surface and the non-etched part becomes a slope. Here, being substantially horizontal means that an angle formed by the etched surface and the plane of the scatterer is within 10 degrees.

The above-mentioned scatterer may be arranged so that the plane of the planar scatterer becomes substantially perpendicular to the surface of the sample or recording medium. Here, being substantially perpendicular means that an angle formed by the plane of the scatterer and the surface of the sample or recording medium is in the range of 80 degrees to 90 degrees inclusive.

Note that in the case where the scatterer is arranged almost parallel to the sample or medium, being planar means that it is elongated in XY (plane)-directions rather than in a Z-axis (thickness) direction. On the other hand, in the case where the scatterer is arranged almost perpendicular to the sample or medium, being planar means that it is elongated in XY (thickness) directions rather than in a Z-axis (plane) direction.

The invention can lessen influence of the optical near-fields generated in the parts except for the point at which the intense optical near-field is generated with the probe that uses the scatterer.

The invention encompasses other embodiments of a method, a system, and an apparatus, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

FIG. 9A is a perspective view of a triangular scatterer such that an interface between an etched portion and a non-etched portion is a curved surface;

FIG. 9B is a perspective view of a circular or elliptical scatterer such that an interface between an etched portion and a non-etched portion is a curved surface;

FIG. 9C is a perspective view of a rectangular scatterer such that an interface between an etched portion and a non-etched portion is a curved surface;

FIG. 21A is a view showing a measure for preventing wearing of a scatterer where a reinforcement film is formed in the vicinity of the vertex at which the optical near-field is generated;

FIG. 21B is a view showing a measure for preventing wearing of a scatterer where a scatterer is embedded below a substrate surface;

FIG. 21C is a view showing a measure for preventing wearing of a scatterer where a pad is formed in the surroundings of a scatterer;

DESCRIPTION OF THE PREFERRED EMBODIMENTS

An invention for a near-field optical probe and optical near-field generator is disclosed. Numerous specific details are set forth in order to provide a thorough understanding of the present invention. It will be understood, however, to one skilled in the art, that the present invention may be practiced without some or without all of these specific details.

(Embodiment 1)

Figure 1A:
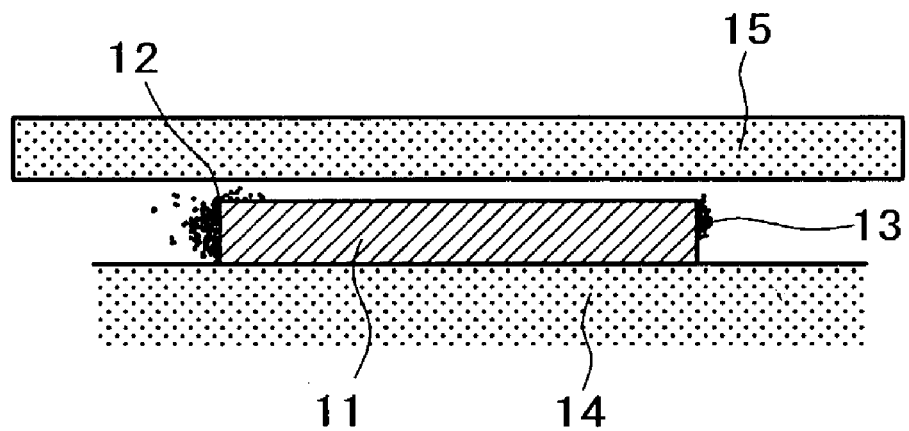
FIG. 1A is a cross-sectional view of a shape of a conventional optical near-field generator.
Figure 1B:
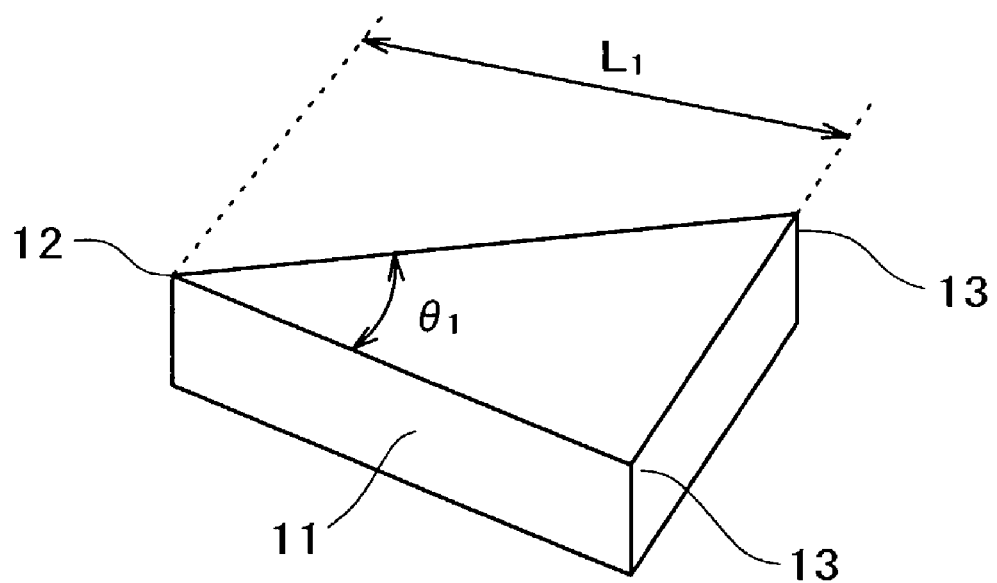
FIG. 1B is a perspective view of a shape of a conventional optical near-field generator.
Figure 2:
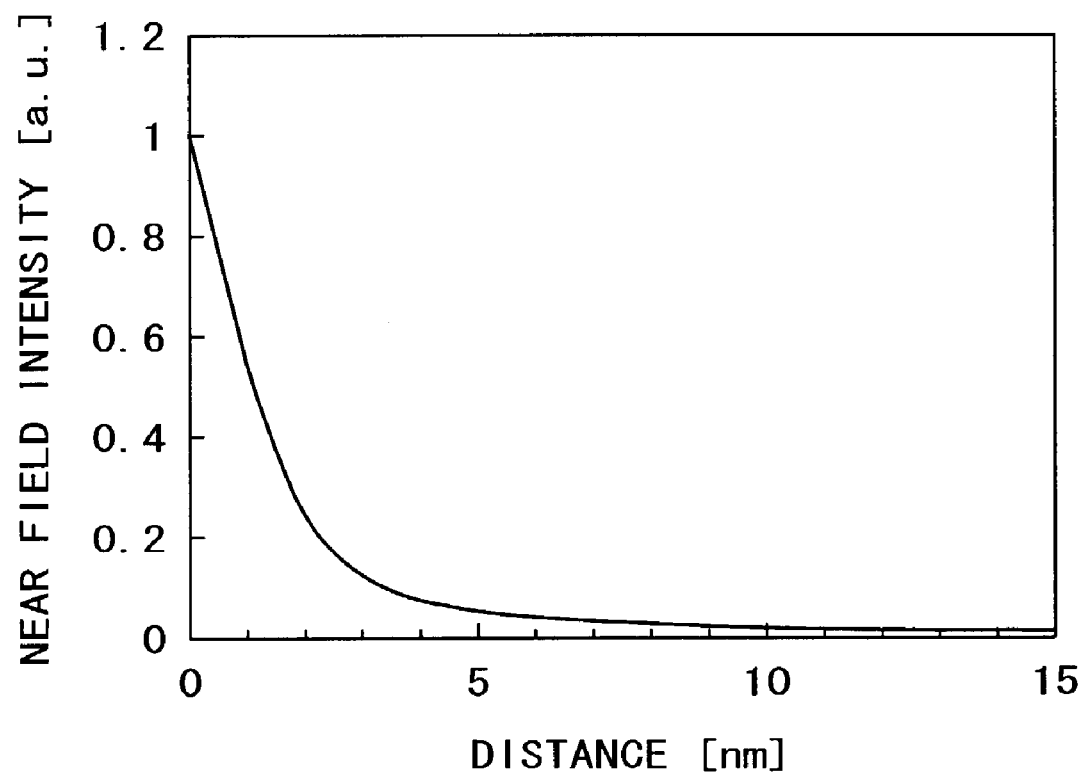
FIG. 2 is a view showing a relationship between the optical near-field intensity and the distance from the scatterer.
Figure 3A:
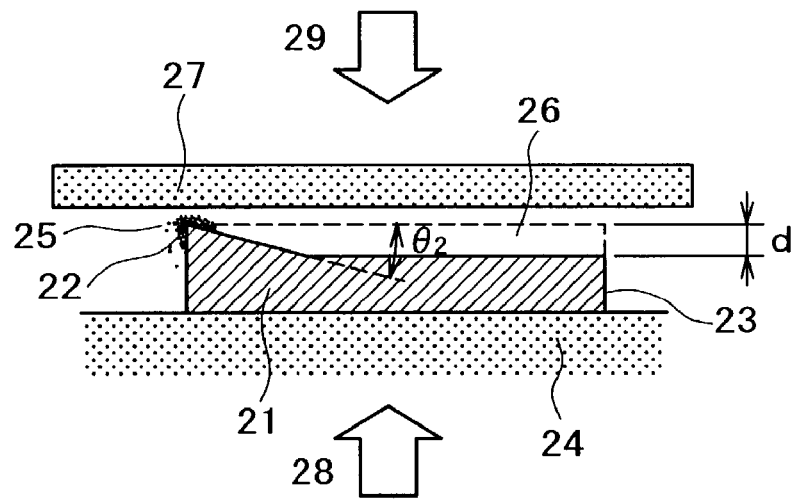
FIG. 3A is a cross-sectional view showing a scatterer and its surroundings.
Figure 3B:
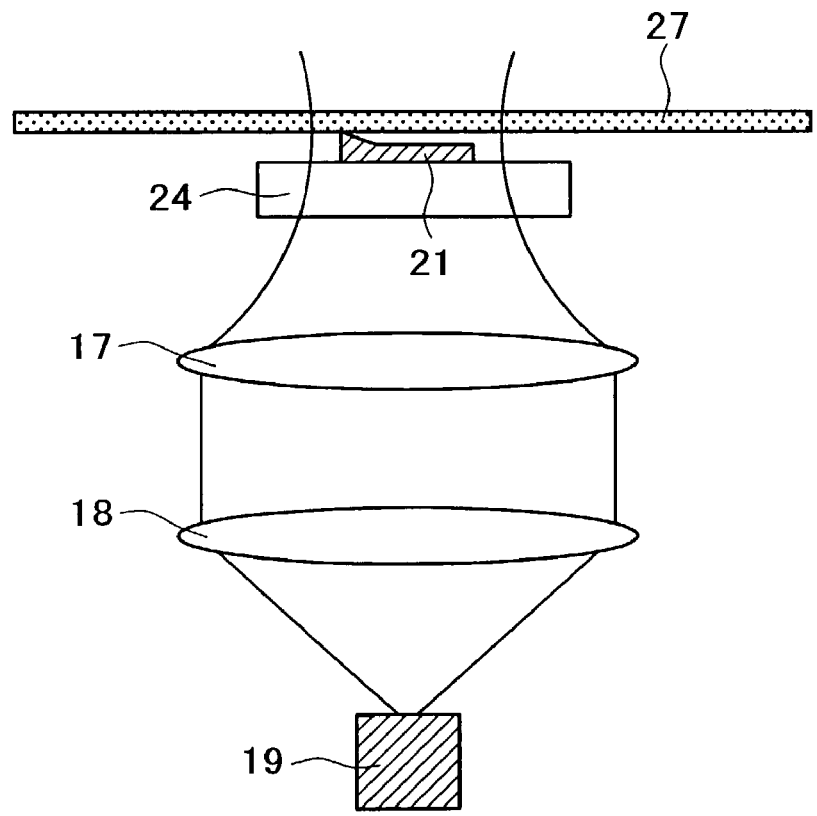
FIG. 3B is a general cross-sectional view including the scatterer.
Figure 44A:
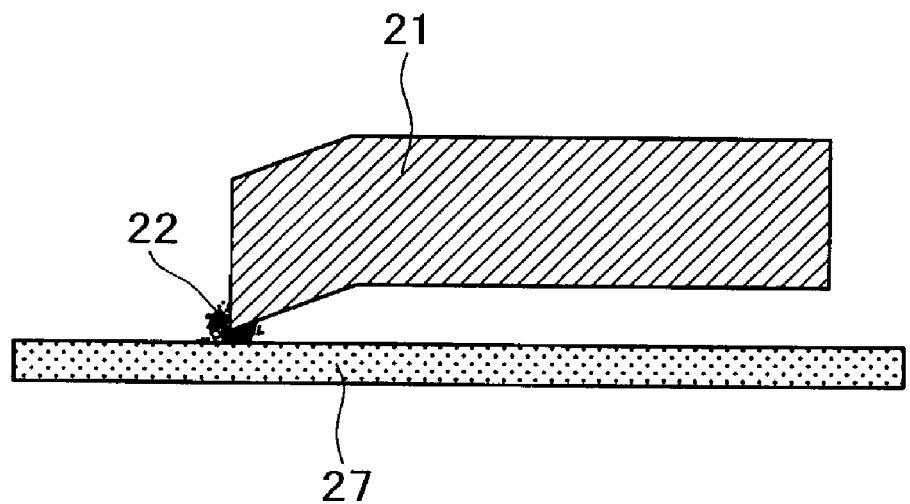
FIG. 44A is a view showing a probe structure of this invention.
Figure 44B:
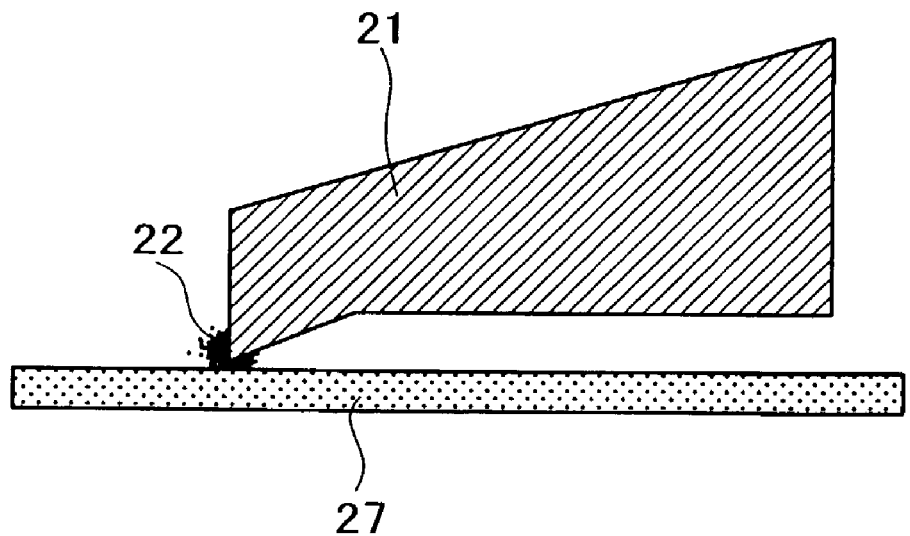
FIG. 44B is another view showing another probe structure of this invention.

An optical near-field generator of this invention is composed of a planar scatterer 21 such that an intense optical near-field 25 is generated at a vertex 22 thereof, and a substrate 24 that supports it, as shown in FIGS. 3A and 3B. The planar scatterer is arranged so that a direction of a plane of the scatterer becomes substantially parallel to the surface of a sample or recording medium 27, and the surface of the scatterer is etched away so that etching depth d from the surface becomes not less than the penetration depth of optical near-field at the parts except for the vicinity of the vertex 22 where the intense optical near-field is generated (surroundings 26 of vertices or an edge 23 on the opposite side). In other words, the surface of the scatterer is separated by a distance d not less than the penetration depth of optical near-field from the recording medium 27 at the parts except for the vicinity of the vertex 22 that is intended to generate the optical near-field (surroundings 26 of the vertices or edge 23 on the opposite side). When light from a light source 19 is made to enter the scatterer 21 through a converging element 17, the intense optical near-field is generated at the vertex 22, and concurrently a weak optical near-field is also generated at an edge 23 of the opposite side of the vertex 22. However, since the etching depth d is not less than the penetration depth of the optical near-field, the optical near-field generated in the vicinity of the opposite-side edge 23 does not reach the sample or recording medium 27. That is, the light intensity measured on the surface of the sample or recording medium 27 becomes negligibly small in the vicinity of the opposite-side edge 23. Note that in this description, the vertex includes not only a point at which a first line (side) and a second line (side) intersect actually but also such points as have a predetermined curvature. Further, the light may be made to enter from a direction indicated by the arrow 29. Although FIGS. 3A and 3B show a case where the scatterer is thinned by d, the parts except for the vertex 22 that generates the optical near-field may be separated from the sample (or medium) 27 by a gap not less than the penetration depth of optical near-field, as shown in FIG. 44.

The material of the scatterer is chosen to be one that has conductivity such as metals (such as gold, silver, copper, aluminum, magnesium, titanium, and chromium) and semiconductors (such as Si and GaAs). It is preferable that a substrate on which the scatterer is formed is one that has optical transparency (here, the transparent substrate is defined as one whose transmittance is equal to 70% or more). The reason is that the optical transparency enables the light to enter the scatterer through the substrate (that is, the light is made to enter the scatterer in a direction indicated by the arrow 28 in FIG. 3A). For example, the material of the substrate on which the scatterer is formed is one selected from among $SiO_2$, sapphire, GaN, etc.

Figure 4A:
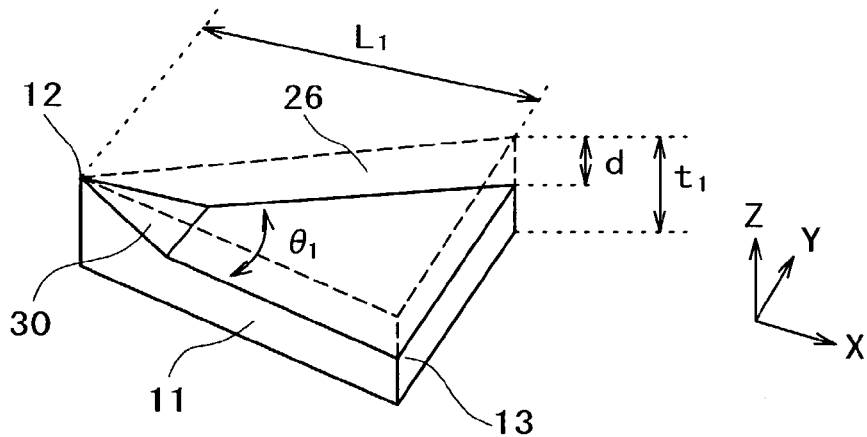
FIG. 4A is a view showing a triangular scatterer.

The above-mentioned scatterer is shaped to be a planar scatterer (such as a triangle, a sector, and a trapezoid all of which are planar) that has a vertex whose radius of curvature is smaller than the wavelength of the incident light and its width gradually decreases with decreasing distance to the vertex. FIG. 4A shows an embodiment in which the scatterer is in the shape of a triangle. In this embodiment, the parts except for the vertex 12 are etched so that an etched surface becomes substantially horizontal to the plane of the scatterer and that a boundary region 30 between the etched part and the non-etched part becomes a slope. When the light form the light source is made to enter so that its polarization direction is in line with the x-direction in the figure, electric charges in the scatterer 11 oscillate in the same direction as the polarization direction and gather in the vertex 12. Consequently, an intense optical near-field is generated in the vicinity of the vertex 12. Particularly, if the wavelength of the incident light, the material of the scatterer, the length $L_1$ thereof, etc. are adjusted so that the plasmon resonance may occur, an extremely intense optical near-field is generated in the vicinity of the vertex 12. Although optical near-fields are generated also in the vicinity of the vertices 13, the optical near-fields do not reach the surface of the sample or medium because the vertices 13 and their surroundings 16 are etched so that the etching depth d is not less than the penetration depth of optical near-field. Note that, if the slope of the boundary region 30 ($\theta_2$ in FIG. 3A) is too large, the boundary region 30 hinders vibration of electrons in the scatterer, which decreases the optical near-field intensity generated in the vertex 22. It is preferable that the slope $\theta_2$ of the boundary region 30 is set not more than 60 degrees.

Figure 5A:
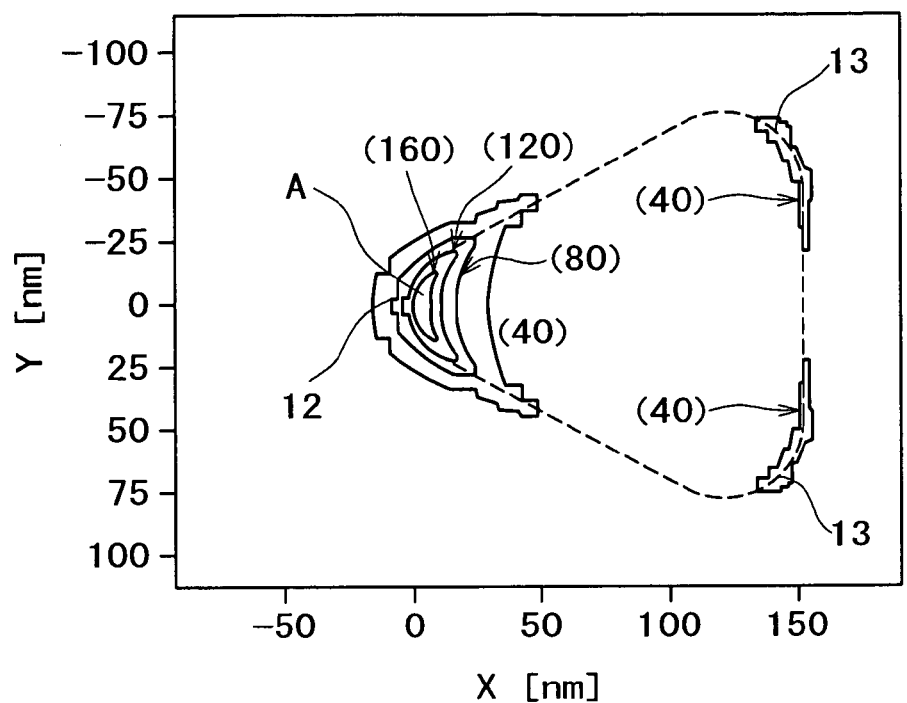
FIG. 5A is a distribution of a conventional optical near-field generator.
Figure 5B:
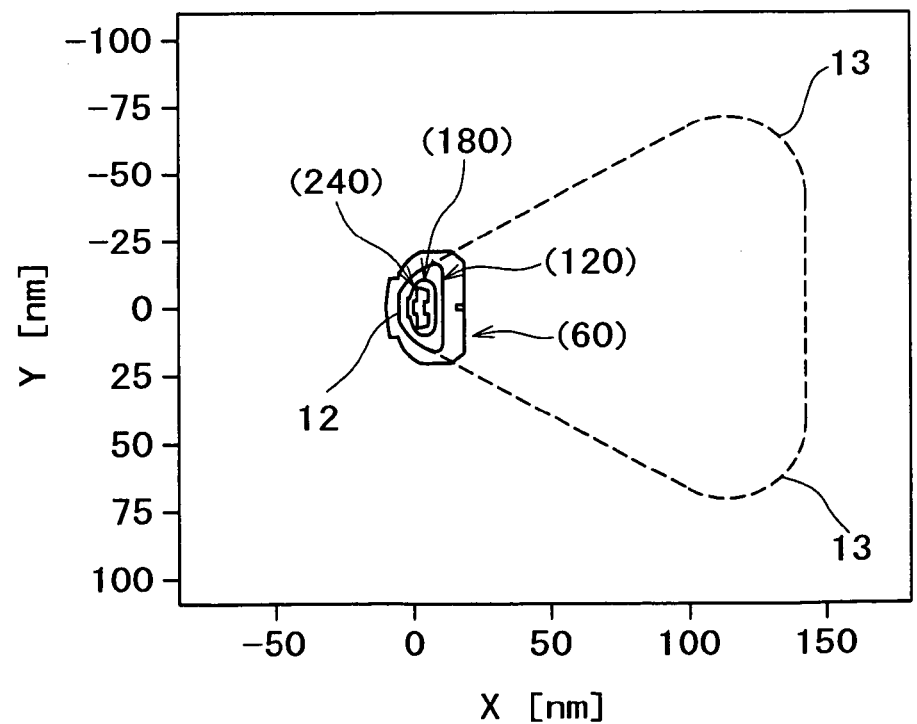
FIG. 5B is a distribution of an optical near-field generator of this invention.
Figure 6:
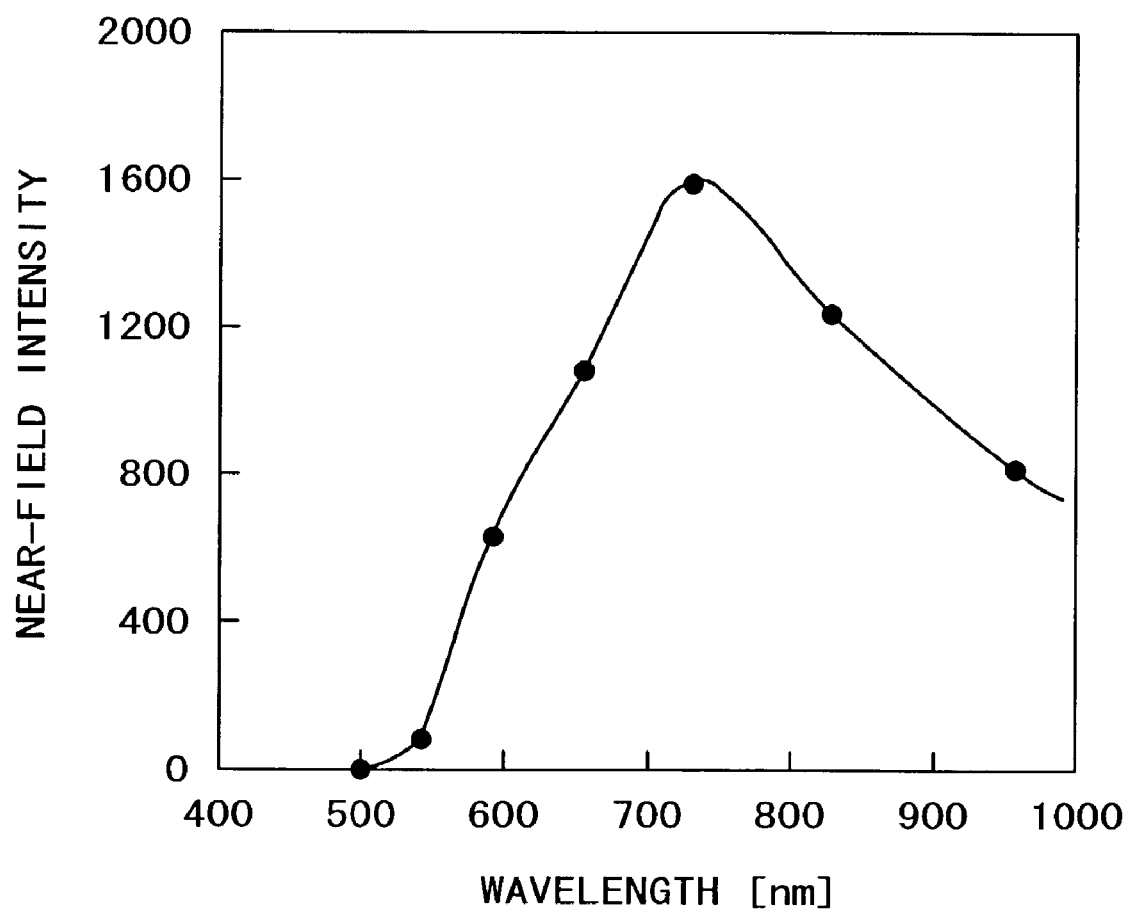
FIG. 6 is a view showing resonance characteristics of a triangular scatterer such that the surfaces of the parts of the scatterer (hereinafter referred to as "the parts") except for the vertex part are etched.

FIGS. 5A and 5B show an intensity distribution of optical near-field in the vicinity of a scatterer in the shape of a triangle. This was obtained by using a Finite Difference Time Domain (FDTD) method (Journal of Optical Society of America A, Vol.12, No.9, pp.1974-1983, 1995). FIG. 5A shows a case where the surface is not etched; FIG. 5B shows a case where the surface is etched. It is assumed that the material of the scatterer is gold and the scatterer is placed in the air. The scatterer was specified as follows: the radius of curvature of the vertex 12 was 20 nm; the thickness $t_1$ was 30 nm; the apex angle $\theta_1$ of the vertex 12 was 60 degrees; the length $L_1$ was 150 nm; the etching depth d of the etched part was 5 nm; and the slope $\theta_2$ of the boundary region 30 between the etched part and the non-etched part was 30 degrees. The light wavelength was chosen to be 780 nm and an observation plane was assumed to lie in a plane away from the vertex by 5 nm. The intensity value represents a ratio of the optical near-field intensity and the intensity of the incident light. As shown in this figure, by etching the surface of the scatterer, the intensity in the vicinity of the vertex 13 can be reduced. In addition, etching the surface also reduces the size of the light spot (spread of the optical near-field). It is considered that this is because part of the scatterer in the vicinity of the vertex 12 was etched, and consequently the optical near-field generated in that part (symbol A in FIG. 5A) became unable to reach the sample or medium. FIG. 6 shows light wavelength dependence of the optical near-field intensity that is generated at the vertex 12 (an observation plane is located away from the vertex 12 by 2 nm). As shown in this figure, the plasmon resonance occurs at about 700 nm wavelength, where the optical near-field intensity becomes a maximum.

Figure 4B:
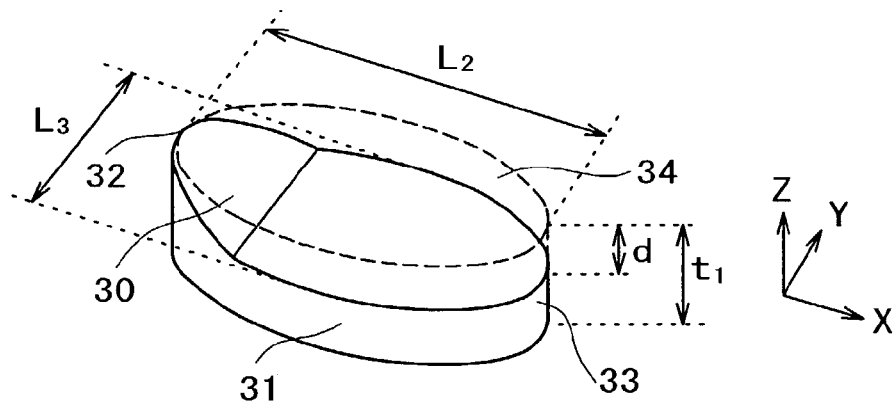
FIG. 4B is a view showing a circular or elliptical scatterer.

The above-mentioned scatterer may be in the shape of a planar circle or ellipse whose surface is etched except for the vicinity of a single vertex. Its example is shown in FIG. 4B. In this embodiment, the vertex 33 and its surroundings were etched horizontally, and a boundary region 30 between the etched part and the non-etched part was etched to be a slope. When the light is made to enter this scatterer with its polarization direction being in line with the X-direction, the optical near-fields are generated at the vertex 32 and at the vertex 33 on the opposite side thereof. However, since the vertex 33 and its surroundings 34 are etched so that the etching depth d is not less than the perpetration depth of optical near-field, the optical near-field that is generated in the vicinity of the vertex 33 dose not reach the surface of the sample or medium.

Figure 7A:
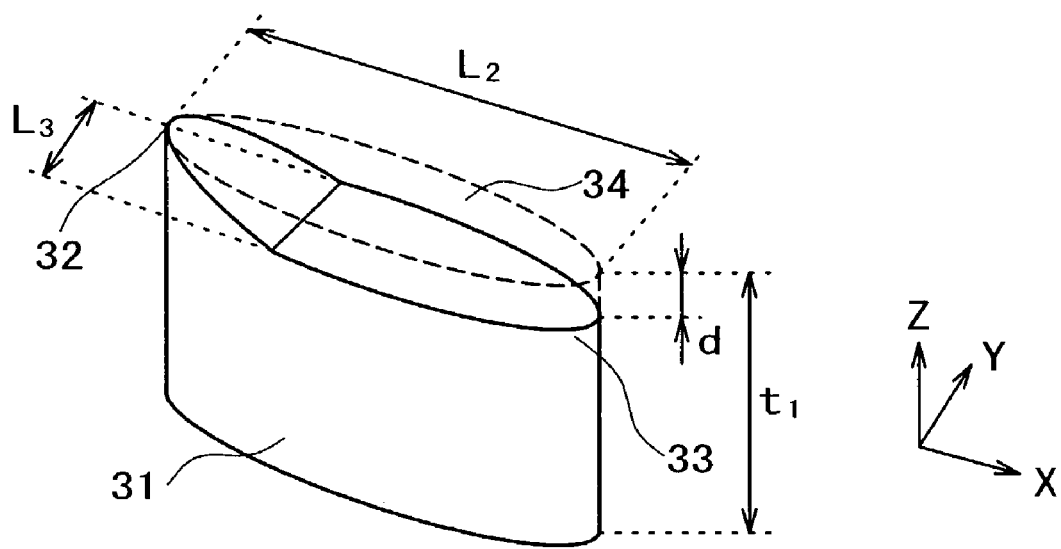
FIG. 7A is a view showing a elliptical scatterer such that the surfaces of the parts except for the vertex part are etched.

To generate the intense optical near-field at the above-mentioned vertex 32, it is preferable to adopt the following geometry: the scatterer is in the shape of an ellipse, the vertex 32 is a point on the major axis of the ellipse, and the polarization direction of the incident light is set parallel to the major axis. Particularly, if the plasmon resonance is excited by adjusting the major-axis length $L_2$ and the minor-axis length $L_3$ of the ellipse, the material of the scatterer, the light wavelength, etc. an extremely intense optical near-field can be generated. In this embodiment, the scatterer was specified as follows: the material of the scatterer was gold, the major-axis length $L_2$ was 100 nm, the minor-axis length $L_3$ was 40 nm, the thickness $t_1$ was 35 nm, the etching depth d was 10 nm, and the wavelength of the incident light was 633 nm. Incidentally, the size of the light spot becomes smaller as the minor-axis length $L_3$ becomes smaller. Therefore, the minor-axis length $L_3$ may be made smaller than the thickness $t_1$, as shown in FIG. 7A. In the embodiment of FIG. 7A, the scatterer was specified as follows: the material of the scatterer was gold, the major-axis length $L_2$ was 100 nm, the minor-axis length $L_3$ was 10 nm, the thickness $t_1$ was 40 nm, and the etching depth d was 10 nm.

Figure 4C:
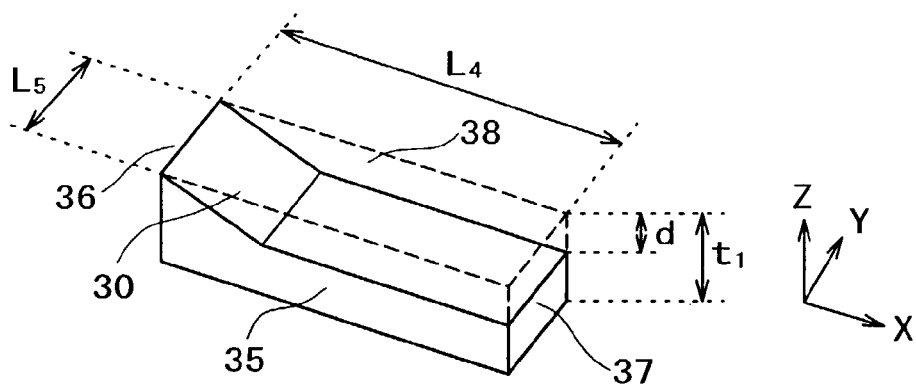
FIG. 4C is a view showing a rectangular scatterer.

The shape of the above-mentioned scatterer may be a rectangular parallelepiped whose surface is etched except for the vicinity of one edge. Its example is shown in FIG. 4C. In this embodiment, the edge 37 and its surroundings were etched horizontally, and the boundary region 30 between the etched part and the non-etched part was etched to be a slope. When the light is made to enter this scatterer with its polarization direction being in line with the X-direction, the optical near-fields are generated at the vicinity of the edge 36 and at the vicinity of the edge 37 on the opposite side. However, since the edge 37 and its surroundings 38 are etched so that the etching depth d becomes not less than the penetration depth of optical near-field, the optical near-field generated in the vicinity of the edge 37 does not reach the surface of the sample or medium.

Figure 7B:
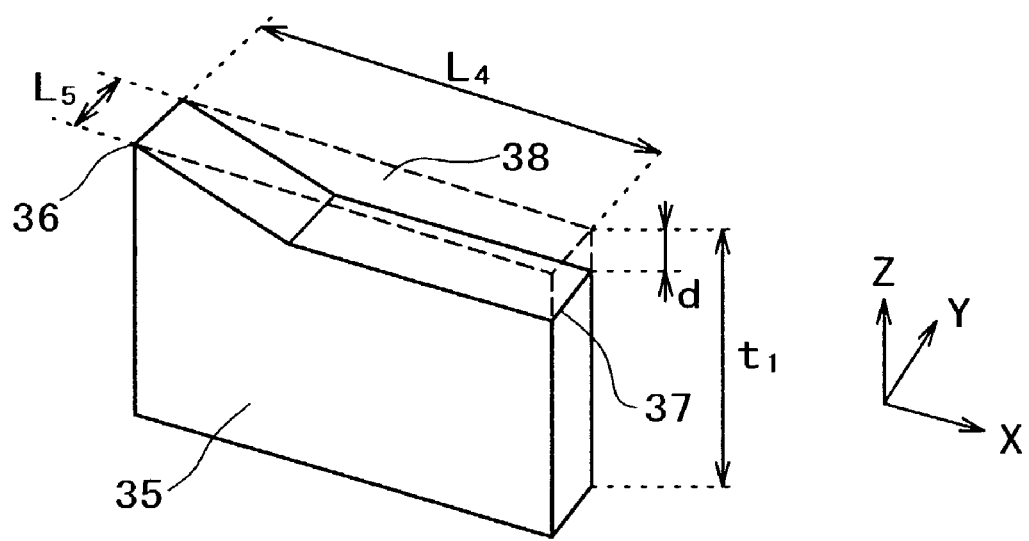
FIG. 7B is a view showing a rectangular scatterer such that the surfaces of the parts except for the vertex part are etched.
Figure 8:
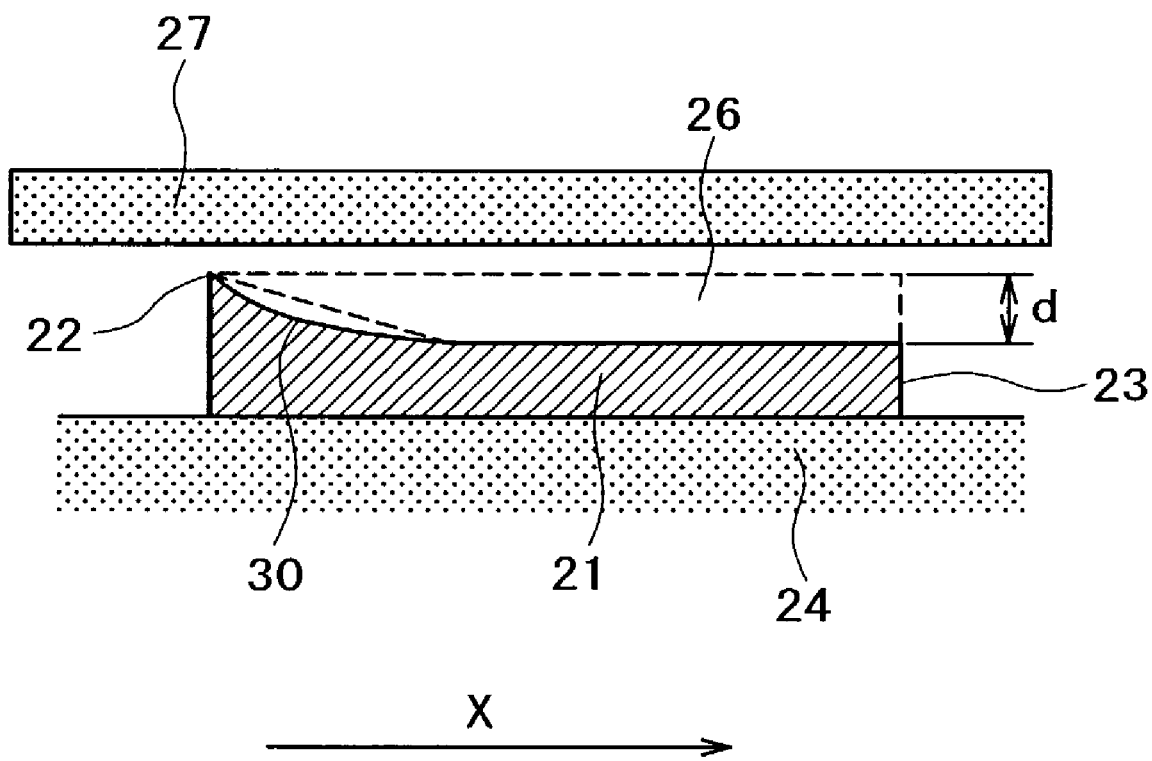
FIG. 8 is a cross-sectional view of a scatterer such that an interface between an etched portion and a non-etched portion is a curved surface.

To generate the intense optical near-field at the above-mentioned edge 36, it is preferable that the edge 36 is made to be a short edge, and then the polarization direction of the incident light is set parallel to the long edge (X-direction in FIG. 4C). Particularly, if the plasmon resonance is excited by adjusting the long-side length $L_4$, the short-side length $L_5$, and the light wavelength, the intense optical near-field can be generated. In this embodiment, the scatterer was specified follows: the long-side length $L_4$ was 100 nm, the short-side length $L_5$ was 40 nm, the thickness $t_1$ was 35 nm, the etching depth d was 5 nm, and the wavelength of the incident light was 633 nm. Incidentally, the size of the light spot becomes smaller as the short-side length $L_5$ becomes smaller. Therefore, the short-side length $L_5$ may be smaller than the thickness $t_1$, as shown in FIG. 7B. In the embodiment of FIG. 7B, the scatterer was specified as follows: the material of the scatterer was gold, the long-side length $L_4$ was 100 nm, the short-side length $L_5$ was 10 nm, the thickness $t_1$ was 40 nm, and the etching depth d was 10 nm.

The above-mentioned to-be-etched portion (numeral 26 in FIG. 3A) may be etched away so that an interface 30 between the etched portion and the non-etched portion becomes a curved surface, as shown in FIGS. 8, 9A, 9B, and 9C. When measuring a sample with fine irregularity, by etching the scatterer this way, the vertex 22 at which the optical near-field is generated can easily come into a recessed part. Therefore, this geometry makes it possible to measure the shape of the sample more accurately.

Figure 10:
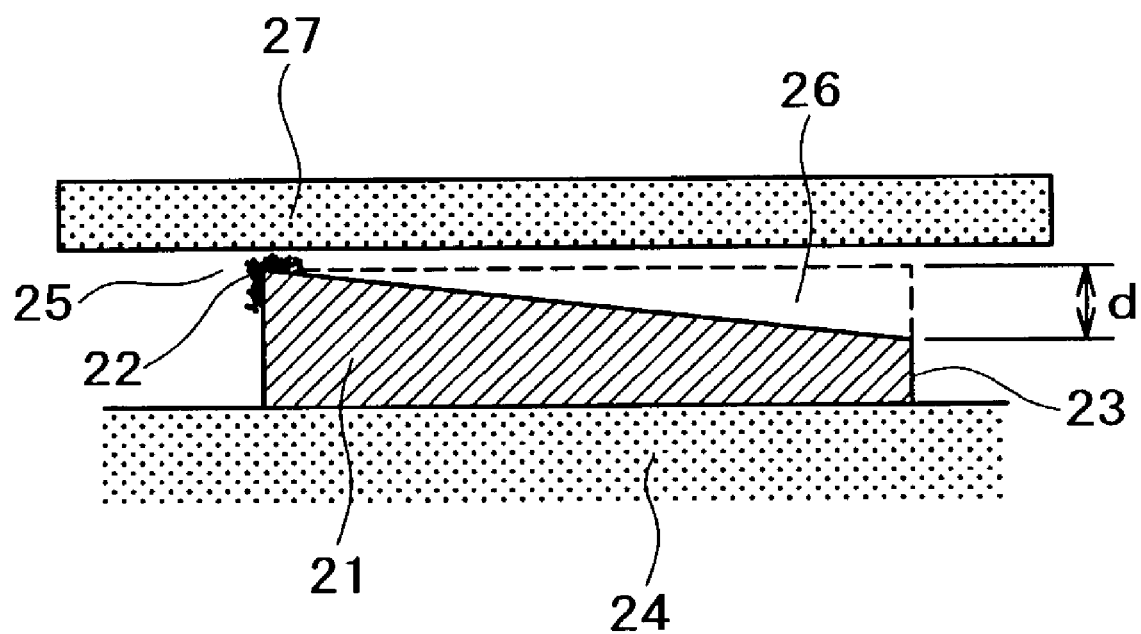
FIG. 10 is a cross-sectional view of a scatterer such that a to-be-etched part is etched to be a slope.
Figure 11A:
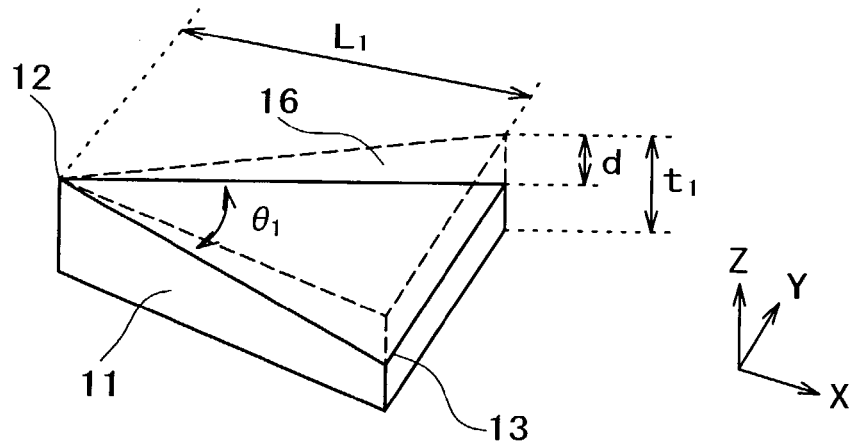
FIG. 11A is a perspective view of a triangular scatterer such that a to-be-etched part is etched to be a slope.
Figure 11B:
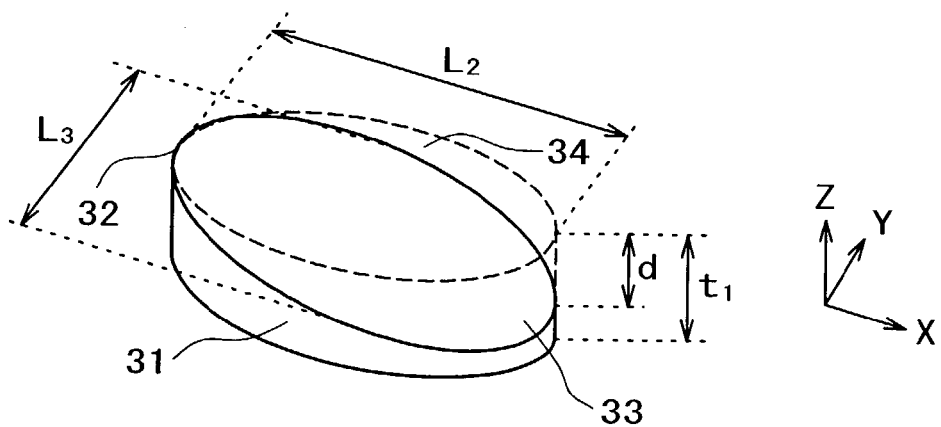
FIG. 11B is a perspective view of a circular or elliptical scatterer such that a to-be-etched part is etched to be a slope.
Figure 11C:
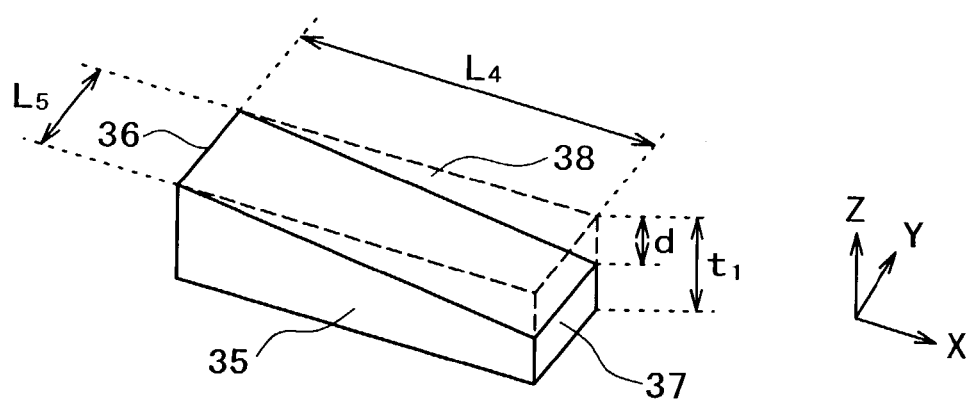
FIG. 11C is a perspective view of a rectangular scatterer such that a to-be-etched part is etched to be a slope.

The above-mentioned to-be-etched portion (numeral 26 in FIG. 3A) may be etched away so that the surface of the etched part becomes a slope to the plane of the scatterer, as shown in FIG. 10. The etching depth d at a vertex or the edge 23 on the opposite side of the vertex 22 at which the intense optical near-field is generated is set not less than the penetration depth of optical near-field. Etching the surface this way can strengthen the mechanical strength of a protruded part of the vertex 22. FIGS. 11A, 11B, and 11C show examples of cases where the shape of the scatterer is chosen to be a triangle, an ellipse, or a rectangle. In the case of the triangle as shown in FIG. 11A, the scatterer was specified as follows: the material of the scatterer was gold; the radius of curvature of the vertex 12 was 20 nm; the thickness $t_1$ was 40 nm; the apex angle $\theta_1$ of the vertex was 60 degrees; the length $L_1$ was 150 nm; the etching depth d of the etched part was 10 nm; and the light wavelength was 780 nm. In the case of the ellipse as shown in FIG. 11B, the scatterer was specified as follows: the material of the scatterer was gold; the major-axis length $L_2$ was 100 nm; the minor-axis length $L_3$ was 40 nm; the thickness $t_1$ was 40 nm; the etching depth d of the etched part was 10 nm; and the wavelength of the incident light was 633 nm. In the case of the rectangle as shown in FIG. 11C, the scatterer was specified as follows: the long-side length $L_4$ was 100 nm; the short-side length $L_5$ was 40 nm; the thickness $t_1$ was 35 nm; the etching depth d was 10 nm; and the wavelength of the incident light was 633 nm.

Figure 12:
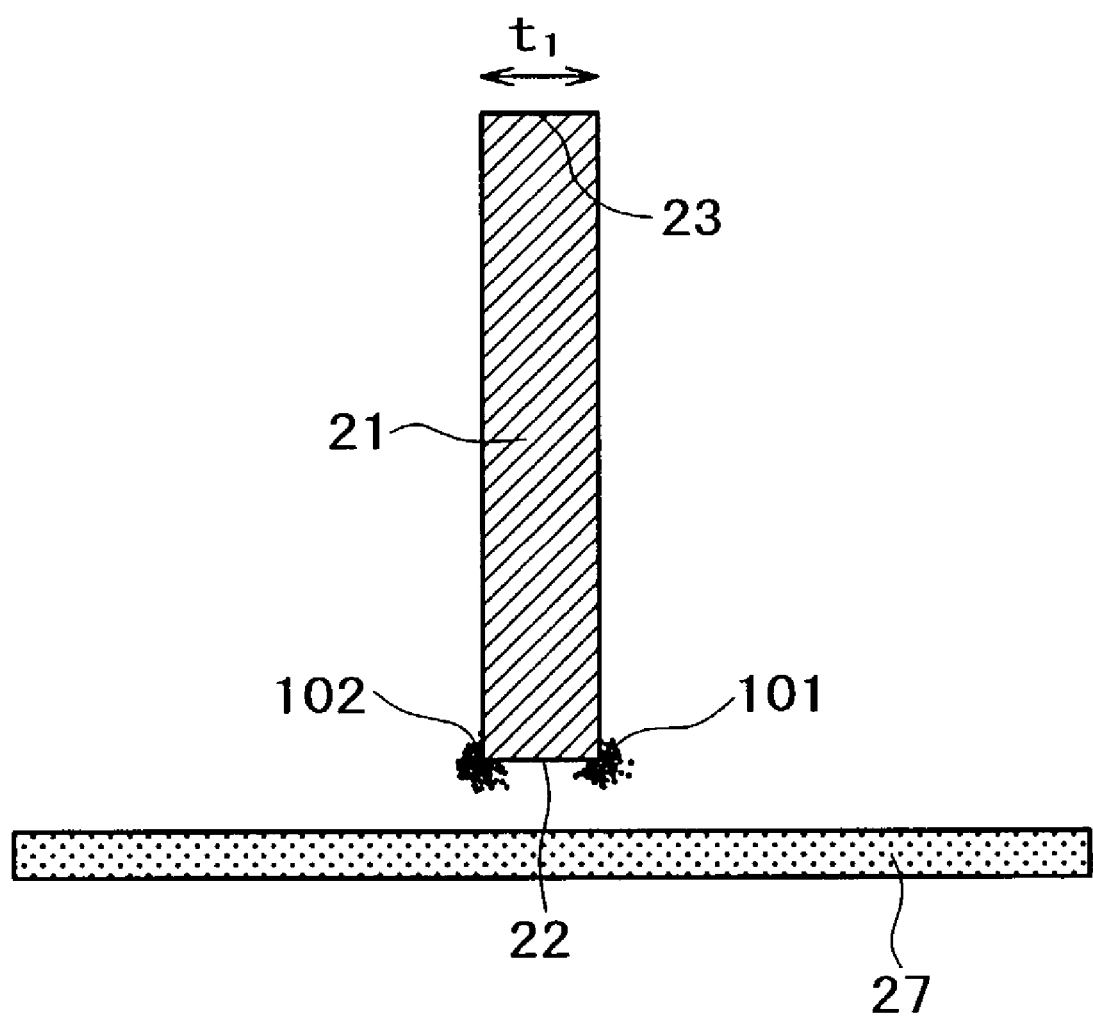
FIG. 12 is a cross-sectional view of a conventional planar scatterer in the case where it is arranged perpendicular to a sample or recording medium.
Figure 13A:
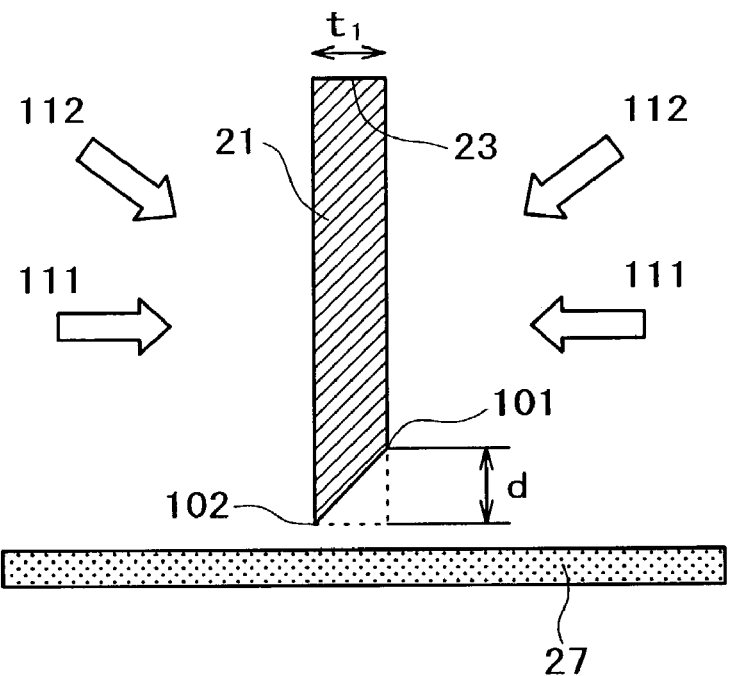
FIG. 13A is a cross-sectional view of a planar scatterer where a vertex of a single-side plane is etched to be a slope where it is arranged perpendicular to the sample or recording medium and a vertex of a single-side plane or vertices of double-side planes are etched to be a slope (or slopes)
Figure 13B:
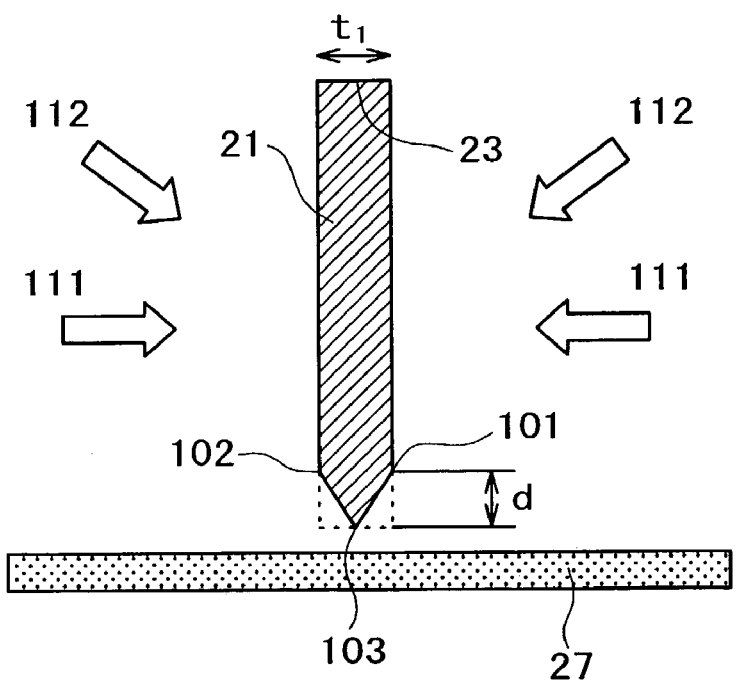
FIG. 13B is a cross-sectional view of a planar scatterer where vertices of double-side planes are etched to be slopes where it is arranged perpendicular to the sample or recording medium and a vertex of a single-side plane or vertices of double-side planes are etched to be a slope (or slopes)

The above-mentioned scatterer may be arranged so that the plane of the scatterer is inclined to the surface of the sample (or recording medium) or the plane of the scatterer is substantially perpendicular to the surface of the sample or recording medium. Here, being substantially perpendicular means that an angle formed by the plane of the scatterer and the surface of the sample or recording medium is in the range of 80 degrees to 90 degrees inclusive. FIGS. 13A and 13B show embodiments of cases where an angle formed by the plane of the scatterer and the surface of the sample or recording medium is set substantially perpendicular. In the embodiment of FIG. 13A, the parts except for the vicinity of a vertex 102 on one of the two planes of the scatterer at which the optical near-field is generated was etched so that etching depth d became not less than the penetration depth of optical near-field. (At this time, the light may be made to enter from a side, as shown by the arrow 111, and may be made to enter obliquely, as shown by the arrow 112.) Note that in this description, in the case where a direction of a planar surface of the scatterer is set substantially perpendicular to the medium or sample, the thickness of the scatterer means a thickness in a direction perpendicular to the sample (including medium) that is irradiated with the optical near-field. Therefore, in the embodiments of FIGS. 13A and 13B, a direction shown by d indicates a direction of thickness. In the embodiment of FIG. 13B, the two planes were etched except for the vicinity of a vertex 103 that exists between a vertex 101 on one plane at which the optical near-field was generated and the vertex 102 on the other plane on the opposite side of the one plane at which the optical near-field was generated so that the etching depth d became not less than the penetration depth of optical near-field. If the two planes were not etched this way, optical near-fields would be generated at the vertices 101, 102 on the one plane (right plane) of the scatterer and on the other plane on the opposite side (left plane), respectively, as shown in FIG. 12, and hence resolution would be reduced. Etching the vertex parts as described above allows only the optical near-field that is generated at either the vertex 102 on the one plane (in the case where only the one plane was etched) or the vertex 103 (in the case where the both planes were etched) to reach the sample or medium to reach the sample or medium. Therefore, the resolution is improved.

Figure 14A:
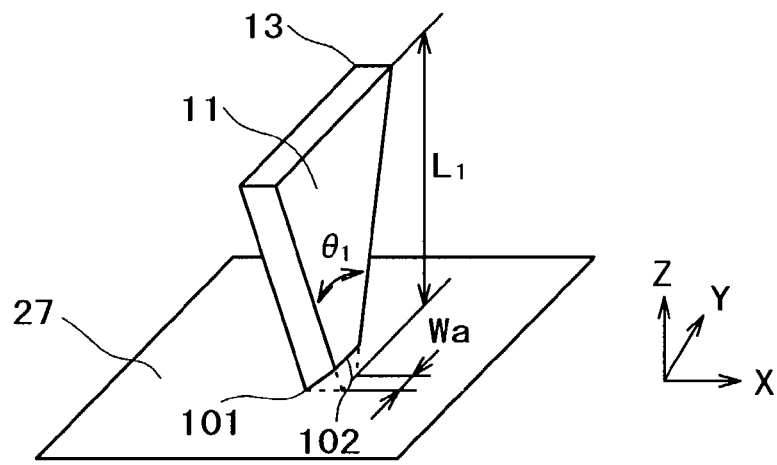
FIG. 14A is a perspective view of a triangular planar scatterer arranged perpendicular to a sample or recording medium and a vertex of a single-side plane is etched to be a slope.
Figure 14B:
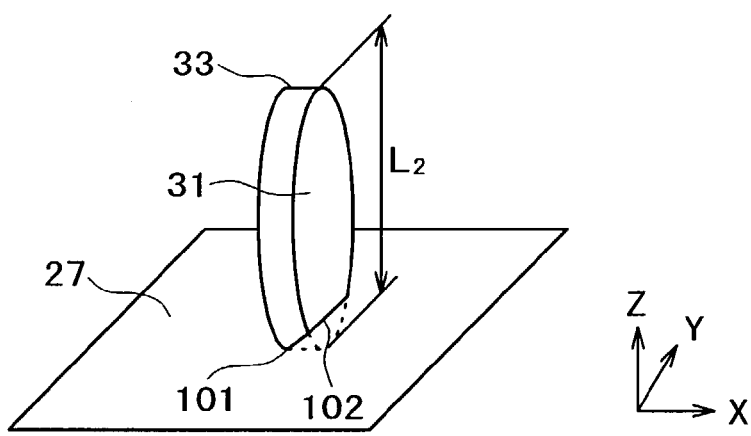
FIG. 14B is a perspective view of a circular or elliptical planar scatterer arranged perpendicular to a sample or recording medium and a vertex of a single-side plane is etched to be a slope.
Figure 14C:
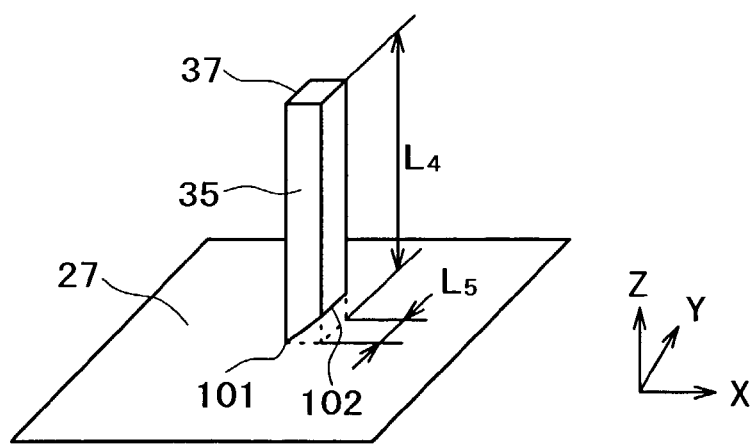
FIG. 14C is a perspective view of a triangular planar scatterer arranged perpendicular to a sample or recording medium and a vertex of a single-side plane is etched to be a slope.
Figure 15:
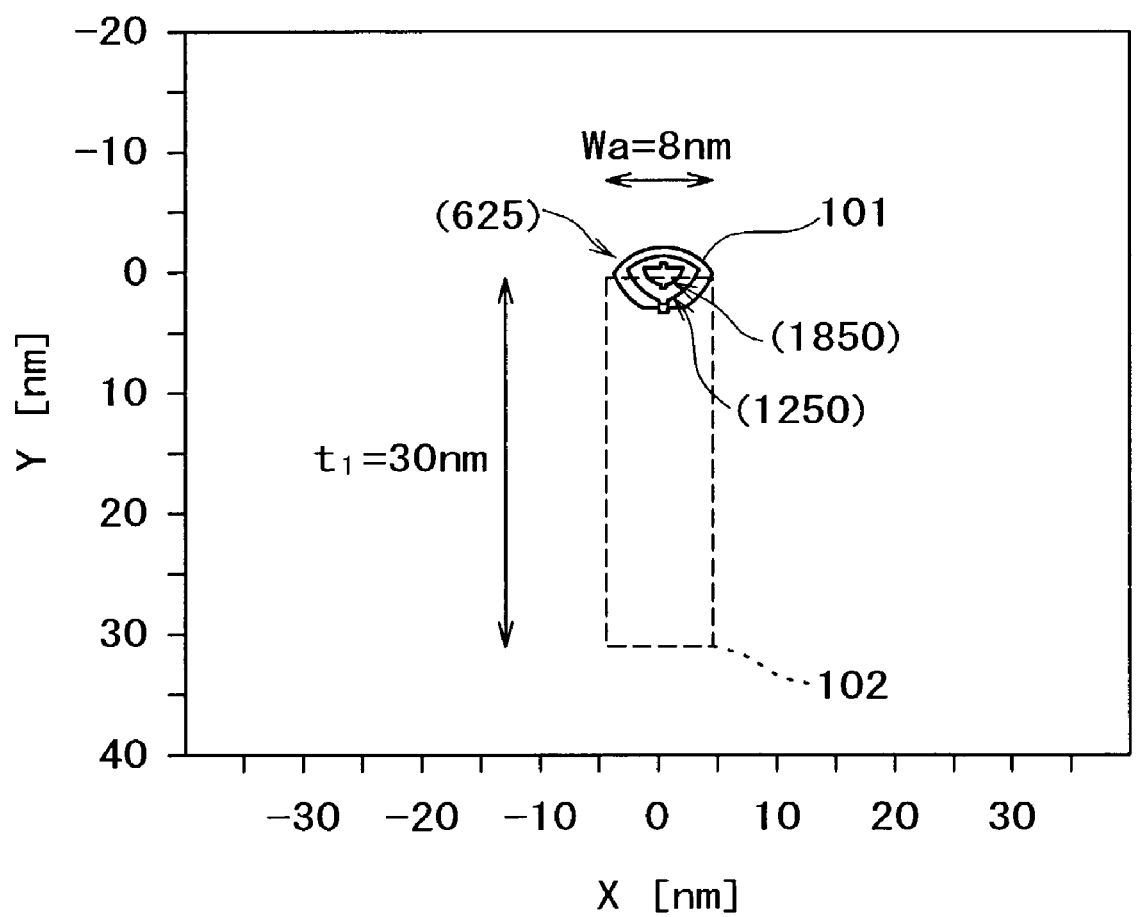
FIG. 15 is a diagram showing an intensity distribution of optical-near field for a case where a triangular scatterer is arranged perpendicular to the sample or recording medium and a vertex of a single-side plane is etched to be a slope.

FIGS. 14A, 14B, and 14C show actual shapes of the scatterer. In the embodiment of FIG. 14A, the shape of scatterer was chosen to be a triangle. The scatterer was specified as follows: the material of the scatterer was gold; the width $w_a$ of the vertex 91 was 10 nm; the width $t_1$ was 30 nm; the apex angle $\theta_1$ of the vertex 91 was 60 degrees; the length $L_1$ was 150 nm; the etching depth d of the etched part was 10 nm; and the light wavelength was 635 nm. An intensity distribution of the optical near-field in this case is shown in FIG. 15. This distribution was calculated by the FDTD method. This intensity distribution was measured on a plane 2 nm away from the vertex 101. The intensity value represents a ratio of the optical near-field intensity and the intensity of the incident light. As shown in this figure, the intense optical near-field was generated at the vertex 101 side. In the embodiment of FIG. 14B, the shape of the scatterer was chosen to be an ellipse. The scatterer was specified as follows: the material of the scatterer was gold; the major-axis length $L_2$ was 100 nm; the minor-axis length was 40 nm; the width $t_1$ was 30 nm; the etching depth d was 10 nm; and the light wavelength was 633 nm. In the embodiment of FIG. 14C, the shape of the scatterer was chosen to be a rectangle. The scatterer was specified as follows: the long-side length $L_4$ was 100 nm; the short-side length $L_5$ was 40 nm; the width $t_1$ was 30 nm; the etching depth d was 10 nm; and the wavelength of the incident light was 633 nm.

Figure 16A:
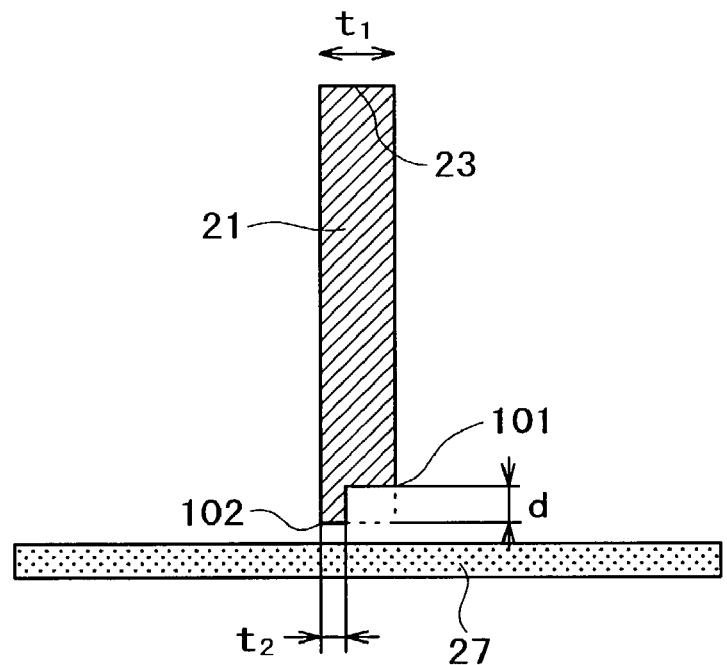
FIG. 16A is a cross-sectional view of a planar scatterer where a vertex of a single-side plane is etched where it is arranged perpendicular to the sample or recording medium and a vertex of a signal-side plane or vertices of double-side planes are etched to be in the shape of stairs.
Figure 16B:
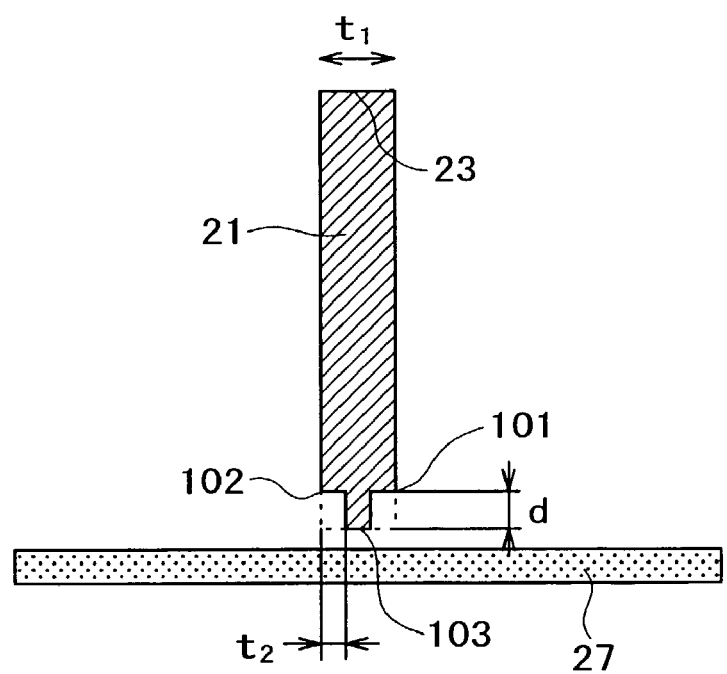
FIG. 16B is a cross-sectional view of a planar scatterer where vertices of double-side planes are etched where it is arranged perpendicular to the sample or recording medium and a vertex of a signal-side plane or vertices of double-side planes are etched to be in the shape of stairs.

FIGS. 16A and 16B show examples in each of which the to-be-etched part in the above-mentioned point is formed to be a staircase. For example, the scatterer is etched so that the etching depth d becomes 10 nm, the width $t_1$ becomes 30 nm, and the width $t_2$ of a tip becomes 5 nm. When measuring a sample with fine irregularity, by etching the scatterer this way, the tip part 102 or 103 can easily come into a recessed part. Therefore, this geometry makes it possible to measure the shape of the sample more accurately.

Figure 17A:
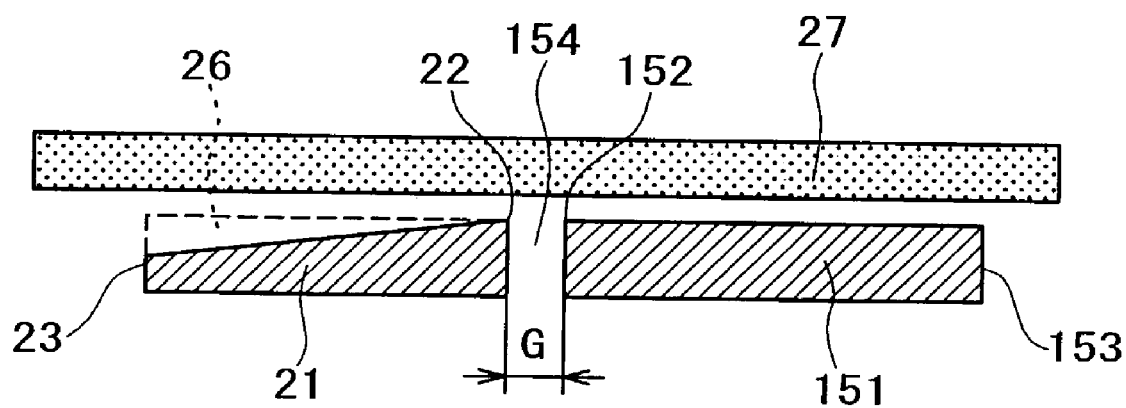
FIG. 17A is a cross-sectional view for a case showing a combination of two scatterers when a second scatterer is formed in the vicinity of a first scatterer where the surface of the second scatterer is not etched.
Figure 17B:
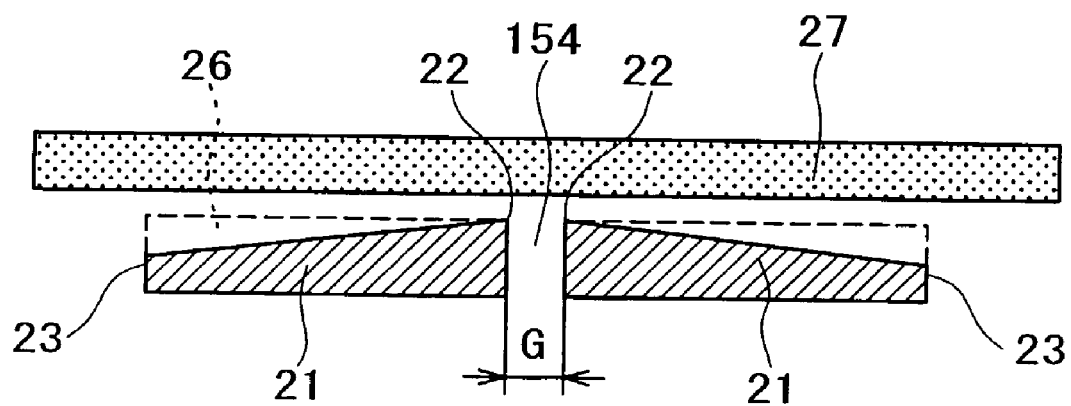
FIG. 17B is a cross-sectional view for a case showing a combination of two scatterers when a second scatterer is formed in the vicinity of a first scatterer where the surface of the second scatterer is etched.

FIGS. 17A and 17B show cases where a second scatterer 151 having conductivity is formed close to the vertex 22 of the above-mentioned scatterer at which the optical near-field is generated in order to enhance the optical near-field intensity further. In this arrangement, if the gap (G) 154 between the vertex 22 of a first scatterer at which the optical near-field is generated and a second scatterer is made smaller than the light wavelength, electric charges gathering in the vertex 22 and electric charges in the second scatterer interact with each other, whereby the intense optical near-field is generated at the gap 154 between the two scatterers.

The surface of the second scatterer does not necessarily need to be etched in the same manner as the first scatterer if a point or edge 153 on the opposite side of a proximate point 152 to the first scatterer does not exist in the spot of the incident light (FIG. 17A). However, if the point or edge 153 on the opposite side of the proximal point 152 to the first scatterer exists in the spot of the incident light, it is preferable to etch the surface except for the vicinity of the most proximal point 152 to the first scatterer similarly with the first scatterer as shown in FIG. 17B.

Figure 18:
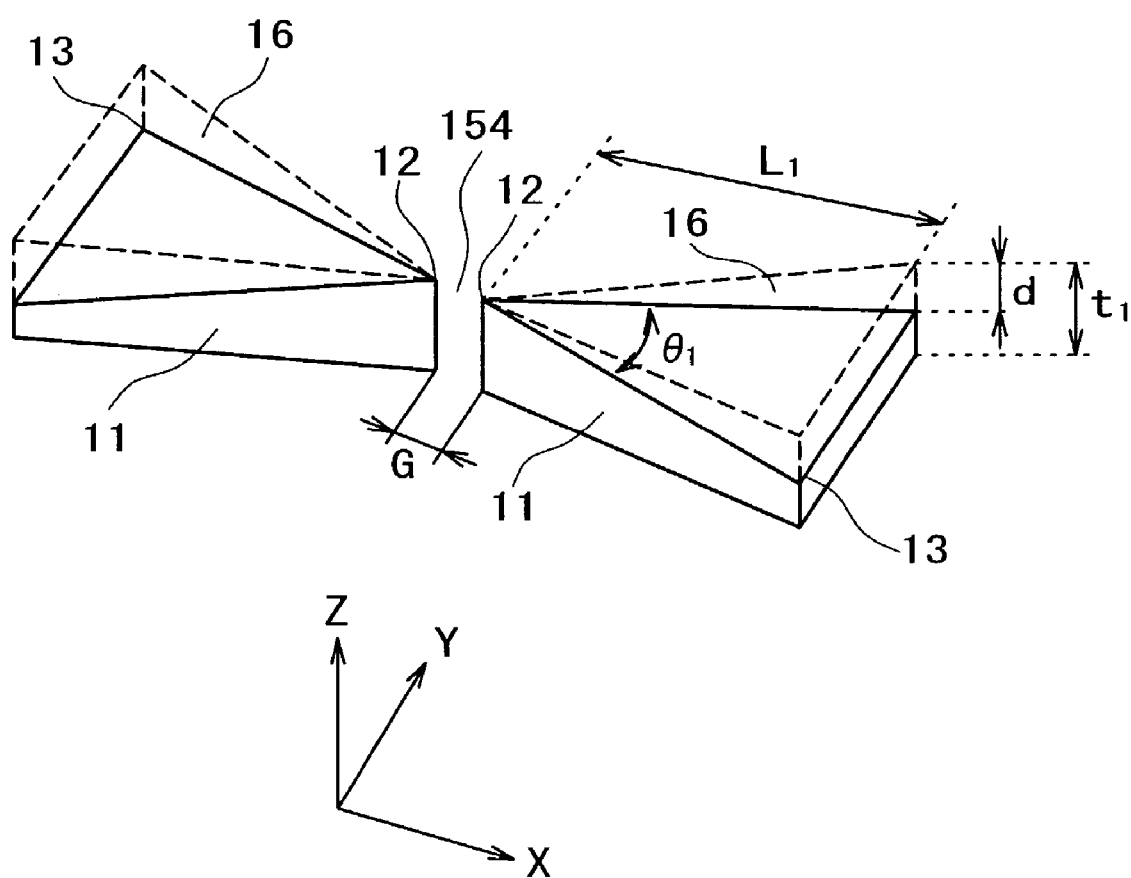
FIG. 18 is a view showing a combination of two scatterers each with an etched surface arranged side by side.

The first and second scatterers do not necessarily need to be in the same shape. However, forming the two scatterers in the same shape enables the both scatterer to excite the plasmon resonance simultaneously, so that the intenser optical near-field can be generated between the two scatterers. As an example, FIG. 18 shows the shape of a combination of two scatterers each in the shape of a triangle. When light polarized in the X-direction is made to enter the combination of two scatterers, electric charges in the scatterers gather at the respective vertices 12, and interact with each other. Consequently, the intense optical near-field is generated at the gap 154 between the two vertices. In this embodiment, each scatterer that constitutes the combination of two scatterers was specified as follows: the material of the scatterer was gold, the radius of curvature of the vertex 12 was 20 nm; the thickness $t_1$ was 40 nm; the apex angle $\theta_1$ of the vertex 12 was 60 degrees; the length $L_1$ was 150 nm; the etching depth d of the etched part was 150 nm; the gap G was 5 nm; and the light wavelength was 780 nm.

Figure 19:
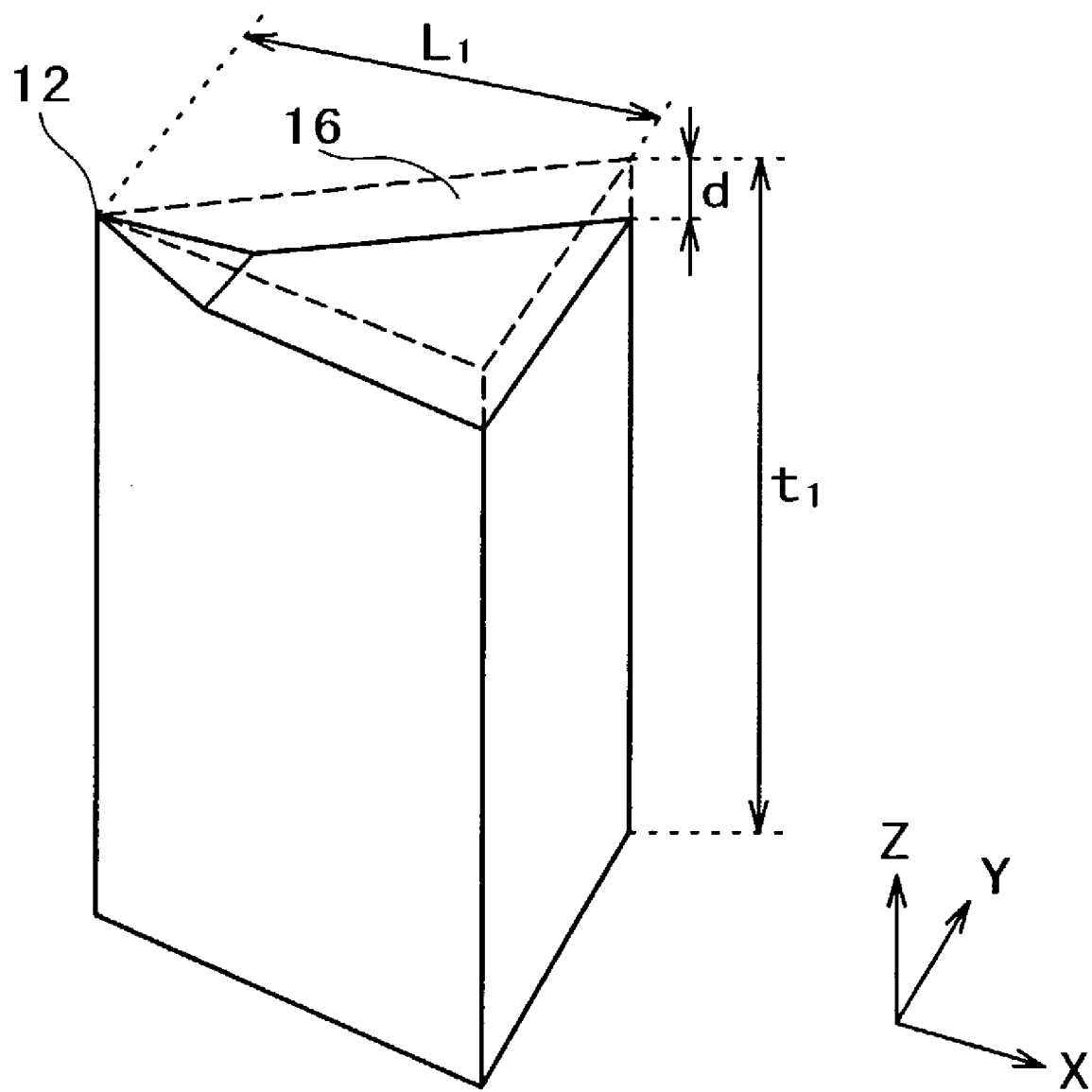
FIG. 19 is a view showing a scatterer that is elongated in a Z-axis (thickness) direction rather than in XY (plane) directions.

As shown in FIG. 19, the above-mentioned scatterer may be enlarged in a thickness direction (Z-axis direction), so that it is elongated in the Z-axis direction (the thickness direction) rather than in XY (plane)-directions. Enlargement in the thickness direction this way facilitates dissipation of heat generated in the scatterer. Therefore, a limit value of incident light power (if the power is large, a scatterer may be broken by heating.) can be increased. In this embodiment, the outer peripheral shape of a scatterer was made triangular, and a surface part 16 except for the vertex 12 was etched. The scatterer was specified as follows: a distance $L_1$ between the vertex 12 and an edge on the opposite side thereof was 150 nm, the thickness $t_1$ was 300 nm, and the etching depth d was 10 nm.

Figure 20A:
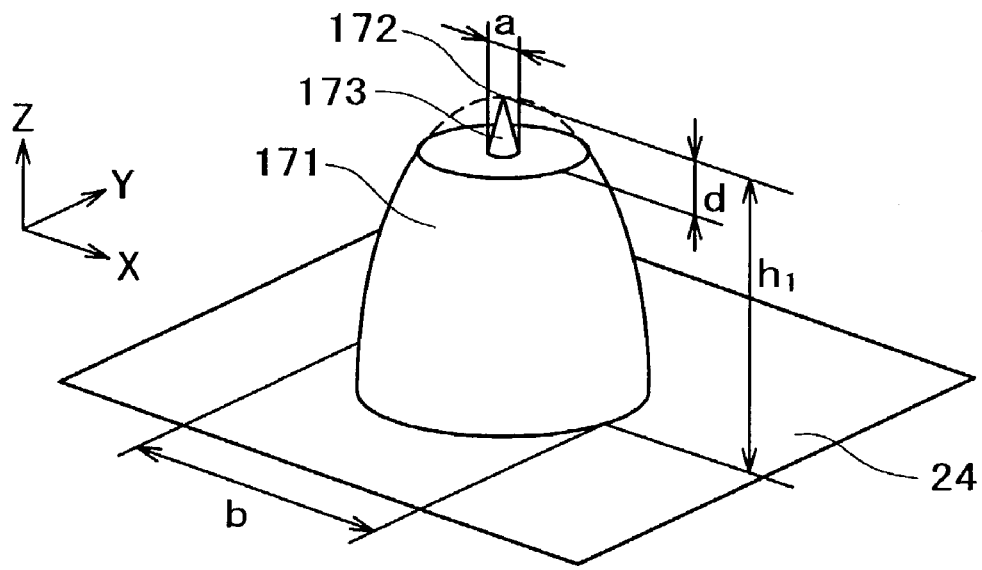
FIG. 20A is a view for a case where the peripheral part of a tip of a scatterer in the shape of a hemisphere or hemispheroid is etched.
Figure 20B:
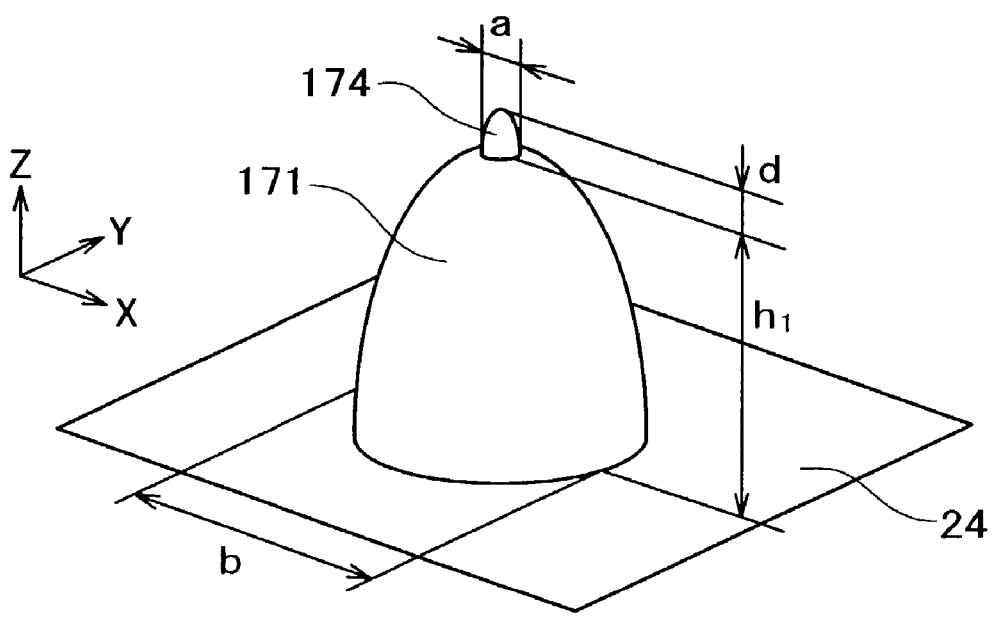
FIG. 20B is a view for a case where a protrusion is formed on the tip of a scatterer in the shape of a hemisphere or hemispheroid.

The above-mentioned scatterer may be a scatterer of a small sphere or hemisphere whose diameter is smaller than the wavelength of an incident light or a scatterer of a small spheroid or hemispheroid whose major-axis length is smaller than the wavelength of the incident light. If the parts except for a single point on the surface of either of these scatterers at which the optical near-field is generated is etched, the radius of curvature of the point at which the optical near-field is generated can be made small and thereby spread of the optical near-field can be narrowed further. That is, the resolution can be improved. Its examples are shown in FIGS. 20A and 20B. In the example of FIG. 20A, a scatterer in the shape of a hemispheroid was formed on the substrate 24 and the parts except for a point 172 at which the optical near-field is generated are etched. When light with its polarization direction being in line with a direction perpendicular to the surface of the sample or recording medium (Z-direction) is made to enter this scatterer, an optical near-field localized in the vicinity of the point 172 is generated. It is preferable that the height $h_1$ of the hemispheroid is set not larger than the light wavelength and the etching depth d is set not less than the penetration depth of optical near-field. The smaller the width a at the base of a protrusion 173 formed after etching, the higher the obtained resolution becomes. It is preferable that the wavelength of the incident light is set to a wavelength at which the plasmon resonance is generated. In this embodiment, the scatterer was specified as follows: the height $h_1$ of the hemispheroid was 100 nm; the width b was 40 nm; the etching depth was 10 nm; the width a at the base of the protrusion was 15 nm; and the material of the scatterer was gold. In the example of FIG. 20B, a minute protrusion 174 was formed on the surface of the spherical scatterer instead of etching the parts except for the point 172. Even if the protrusion is formed this way, the same effect as that of the above-mentioned scatterer that was formed by etching can be obtained. In this embodiment, the scatterer was specified as follows: the height $h_1$ d of the hemispheroid was 100 nm; the width b was 40 nm; the height of the protrusion d was 10 nm; the width a at the base was 15 nm; and the material of the scatterer was gold.

(Embodiment 2)

The embodiment 2 shows an embodiment for preventing wearing of the scatterer.

Figure 21A:
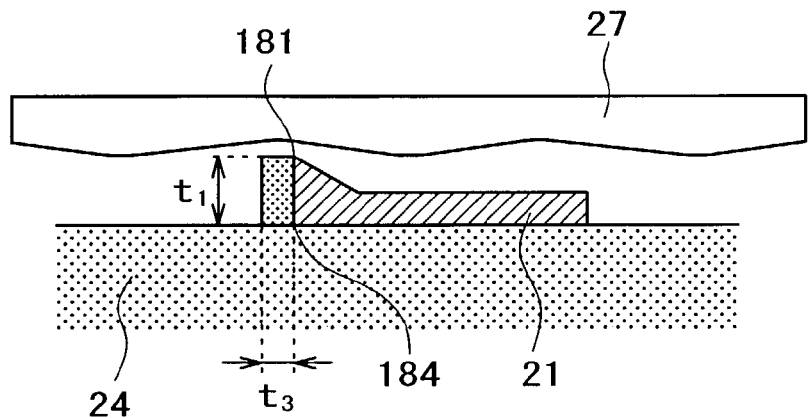
FIGS. 21A, 21B, and 21C are views each showing a measure for preventing wearing of a scatterer.

In the case where the above-mentioned planar scatterer arranged so that the surface thereof is substantially parallel to the medium surface is used to measure an uneven sample, it is preferable that the scatterer is formed on the substrate surface, as shown in FIGS. 3A and 3B. This is because the vertex 22 where an optical near-field is generated can easily come into a recessed part. However, the vertex 22 tends to wear in this case. To prevent this, it is advisable that as shown in FIG. 21A, side faces of the scatterer in the vicinity of a vertex 181 are covered with a material of high hardness. Here, the vicinity of the vertex 18 is defined as a range located within 50 nm from the vertex 181. In this embodiment, a scatterer that had a length $L_1$ of 150 nm, an angle $\theta_1$ of 60 degrees, a thickness $t_1$ of 30 nm, whose material was gold, whose shape was a triangle, and whose surface was etched by d=5 nm was formed, and a film that was made up with one material selected from among carbon, diamond, Si, and SiN and had a width $t_3$ of 10 nm was formed on part of side faces of the scatterer that was within 30 nm from the vertex 181.

Figure 21B:
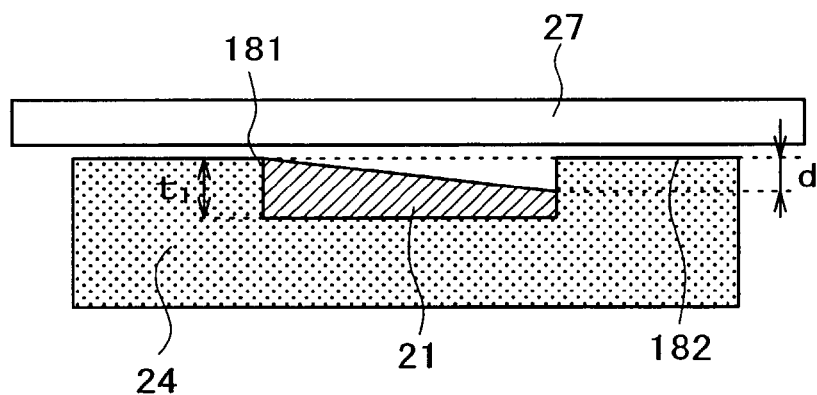
Figure 21C:
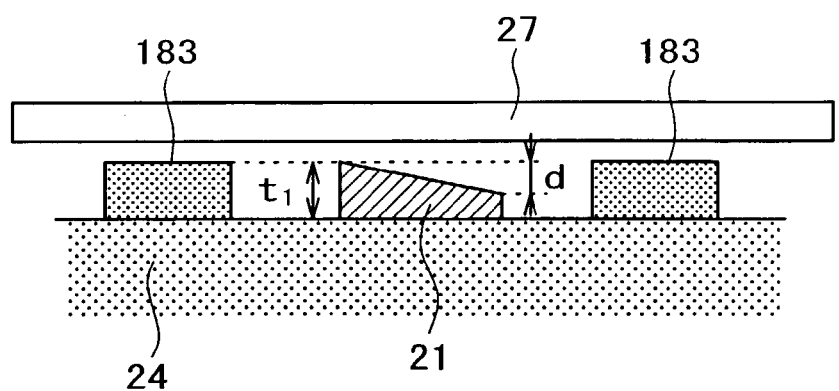

In the case where a planar scatterer arranged so that the surface thereof is substantially horizontal to the surface of the sample or medium is applied to a recording apparatus, even if the scatterer is shaped as shown in FIG. 21A, the vertex 181 becomes worn away because the recording medium is rotated at high speed. To prevent this, it is preferable to form the scatterer 21 so as to be embedded in the substrate 24, as shown in FIG. 21B, or to additionally form a pad 183 in the surroundings of the scatterer 181, as shown in FIG. 21C. In the case where the scatterer is embedded in the substrate, it is preferable that the vertex 181 at which the optical near-field is generated and a substrate surface 182 are substantially on the same plane, as shown in FIG. 21B. In the case where the pad is formed additionally, it is preferable that the vertex at which the optical near-field is generated and the pad surface are substantially on the same plane. Here, being substantially on the same plane means that the difference of their heights is within 10 nm. In this embodiment, the scatterer that had a length $L_1$ of 150 nm, an angle $\theta_1$ of 60 degrees, and a thickness $t_1$ of 30 nm, whose material was gold, whose shape was a triangle, and whose surface was etched by d=5 nm was formed on a glass substrate so as to be embedded below the surface thereof, as shown in FIG. 21B.

(Embodiment 3)

The embodiment 3 shows an example in which the scatterer is arranged perpendicular to the surface of the sample or medium.

Figure 22A:
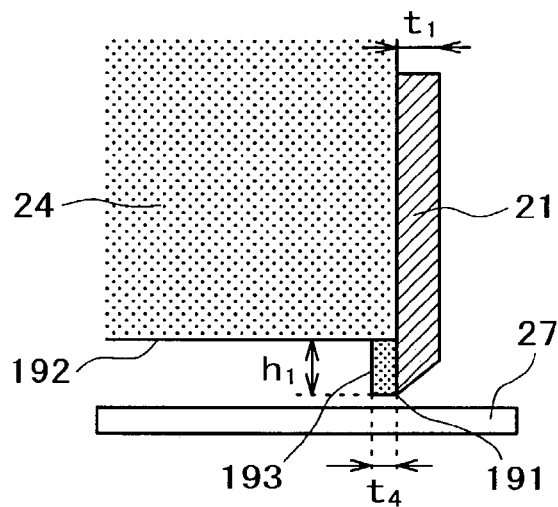
FIG. 22A is a view showing a measure for preventing wearing of the scatterer in the case where the scatterer is arranged perpendicular to the sample or recording medium where a reinforcement film is formed near the vertex at which the optical near-field is generated.
Figure 22B:
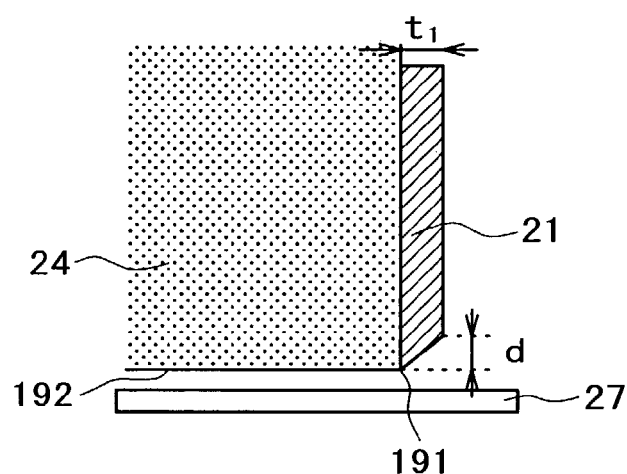
FIG. 22B is a view showing a measure for preventing wearing of the scatterer in the case where the scatterer is arranged perpendicular to the sample or recording medium where the vertex at which the optical near-field is generated and the substrate surface are substantially on the same plane.
Figure 22C:
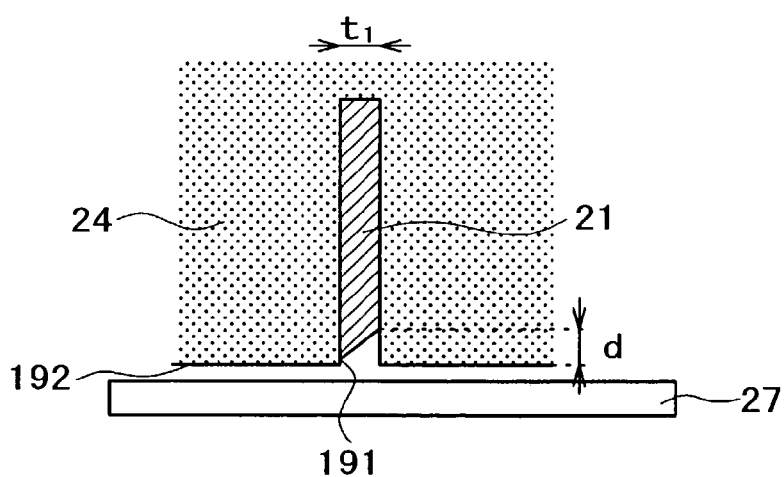
FIG. 22C is a view showing a measure for preventing wearing of the scatterer in the case where the scatterer is arranged perpendicular to the sample or recording medium where a scatterer is embedded below the substrate surface.

In the case where the planar scatterer arranged so that the surface thereof is perpendicular to the surface of the sample or medium is used to measure a sample having an uneven surface, it is preferable that a vertex 191 at which the optical near-field is generated is shaped so as to protrude from a substrate surface 192, as shown in FIGS. 22A, 22B, and 22C. This is because the vertex 191 can easily come into a recessed part. However, if the vertex 191 is protruded as described above, the scatterer may contact with the sample and be broken easily. To prevent this, it is preferable to cover the side faces of the scatterer with a material of high hardness as explained in the embodiment 2. In this embodiment, a scatterer of a rectangular shape that had a short-side length of 20 nm, the long-side length of 150 nm, and the width $t_1$ of 30 nm and whose material was gold was formed on a side of the glass substrate, and was etched to be a slope so that the etching depth d of the vicinity of the vertex 191 became 10 nm. The vertex 191 was formed so as to protrude from the substrate surface 192 by $h_3$=50 nm, and a film of a material selected from among carbon, diamond, Si, SiN whose width was $t_4$=10 nm was formed on the side faces of the scatterer to prevent breakage of the scatterer.

In the case where the planar scatterer arranged so that the surface thereof is perpendicular to the surface of the sample or medium is applied to a recording apparatus, even if the scatterer is formed as shown in FIG. 22A, a tip of the scatterer is worn out because the recording medium rotates at high speed. To prevent this, the scatterer is formed so that the vertex 191 at which the optical near-field is generated and the substrate surface 192 are substantially on the same plane, as shown in FIG. 22B. In this embodiment, a rectangular scatterer that had a short-side length of 20 nm, a long-side length of 150 nm, a width $t_1$ of 30 nm, whose material was gold, and that was etched to be a slope so that the etching depth d of the tip part became 10 nm was formed so that the vertex 181 and the substrate surface 182 were substantially on the same plane. Alternatively, the above-mentioned scatterer may be formed to be embedded in the substrate, as shown in FIG. 22C. In the case where it is embedded, it is preferable that the vertex 181 at which the optical near-field is generated and the substrate surface 182 are on the same plane. Here, being substantially on the same plane means that the difference in their height is within 10 nm.

(Embodiment 4)

The embodiment 4 shows an example in which a material of the vicinity of the vertex of the scatterer at which the optical near-field is generated was made different from a material of the remaining part. For example, if the material of the vicinity of the vertex at which the optical near-field is generated is chosen to be one whose hardness is higher than that of a material of the remaining part, durability of the scatterer can be improved. Further, the material of the vicinity of the vertex at which the optical near-field is generated may be chosen to be a luminescent material. Here, the luminescent material means any material that generates emission caused by photoluminescence, second harmonic generation, third order nonlinear response, Raman scattering, two photon absorption, and the like. By separating these emissions from excitation light using a filter or grating and detecting variation in the intensity or the amount of shift in the emission wavelength, it becomes possible to selectively detect only a signal from the vertex at which an optical near-field is generated. That is, this example can prevent background light from being detected, enabling improvement in contrast of an image. Further, if the luminescent material is chosen to be a material such that the emission intensity or emission wavelength changes upon reaction with a special material, the probe can be used as a minute sensor with a high spatial resolution.

Figure 23A:
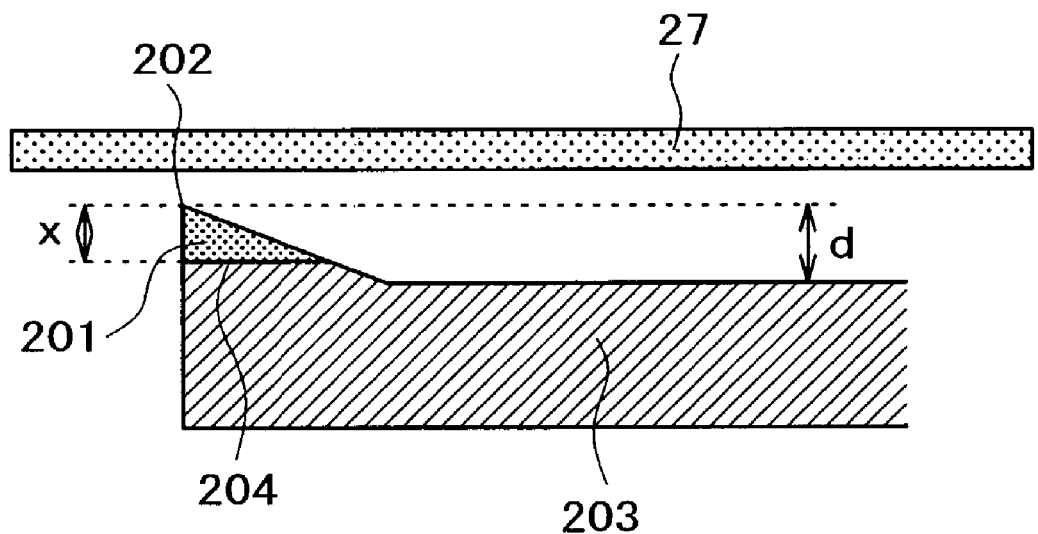
FIG. 23A is a cross-sectional view showing a scatterer such that a material of the vicinity of the vertex of the scatterer at which the optical near-field is generated is made different from that of a remaining part and that is arranged parallel to the sample or recording medium, where an interface between a part of changed material and a part of unchanged material is arranged parallel to the surface of the sample or recording medium.
Figure 23B:
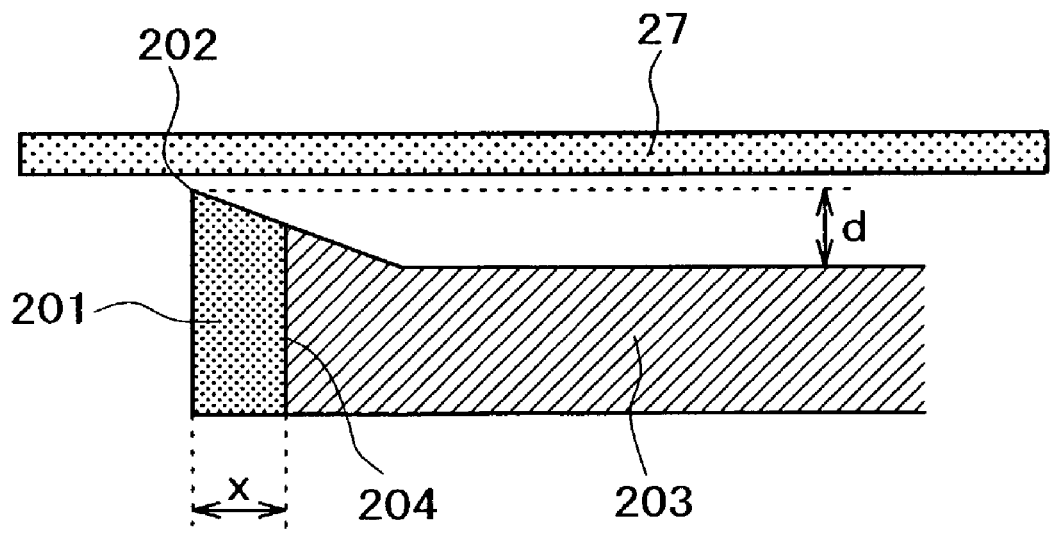
FIG. 23B is a cross-sectional view showing a scatterer such that a material of the vicinity of the vertex of the scatterer at which the optical near-field is generated is made different from that of a remaining part and that is arranged parallel to the sample or recording medium, where an interface between a part of changed material and a part of unchanged material is arranged perpendicular to the surface of the sample or recording medium.
Figure 24A:
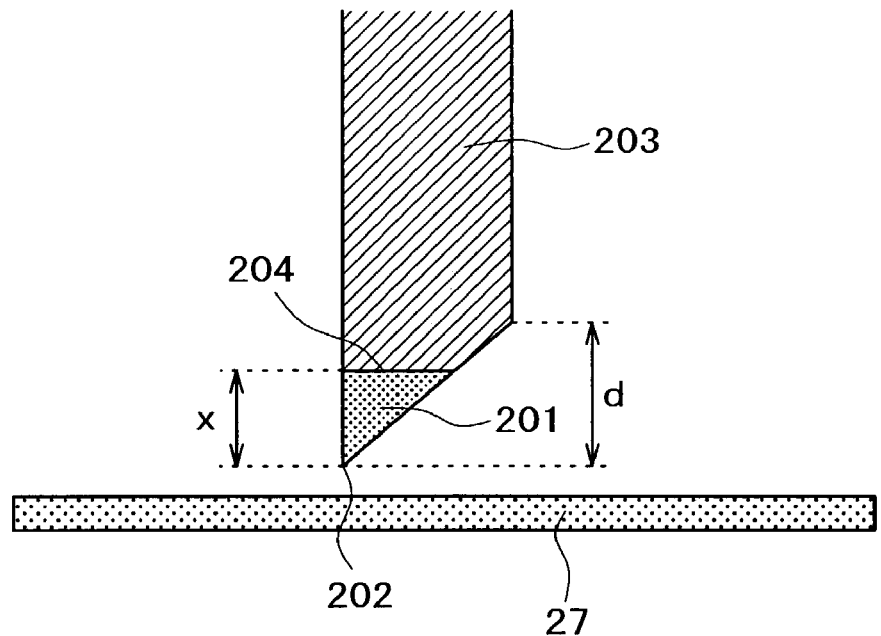
FIG. 24A is a cross-sectional view such that a material of the vicinity of the vertex at which the optical near-field is generated is made different from that of a remaining part and that is arranged perpendicular to the sample or recording medium, where an interface between a part of changed material and a part of unchanged material is arranged parallel to the surface of the sample or recording medium.
Figure 24B:
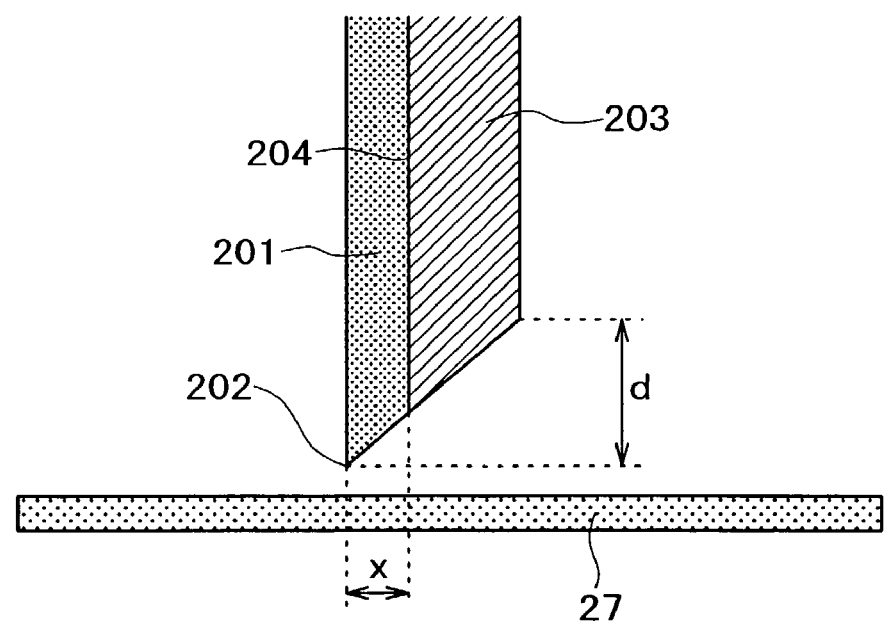
FIG. 24B is a cross-sectional view such that a material of the vicinity of the vertex at which the optical near-field is generated is made different from that of a remaining part and that is arranged perpendicular to the sample or recording medium, where an interface between a part of changed material and a part of unchanged material is arranged perpendicular to the surface of the sample or recording medium.

An embodiment in the case where a planar scatterer is used is shown in FIGS. 23A and 23B as well as FIGS. 24A and 24B.

In the embodiments of FIG. 23A and FIG. 24A, an interface 204 between the part of changed material and the part of unchanged material is set substantially parallel to the surface of the sample or recording medium. Here, being substantially parallel means that an angle formed by the interface 204 between the part of changed material and the part of unchanged material and the surface of the sample or recording medium is within 30 degrees. In this embodiment, in order to improve the durability of the scatterer, a material of a region 201 from a vertex 202 at which the optical near-field is generated to a location away from the vertex 202 by a width of x is chosen to be one selected from among Pt, Pd, Rh, Ir, Ti, Cr, Co, Si, and SiN. The material of the vicinity of the vertex 201 at which the optical near-field is generated can be any material of high hardness. However, a material that has the conductivity, such as metals and semiconductors, is preferable in order to generate the intense optical near-field. The region of the width x of the part of changed material 201 may be specified to be either not larger than the etching depth d or larger than the etching depth d. To prevent the part of changed material 201 from peeling off a part of unchanged material 203, it is preferable that the width x of the part of changed material 201 is set not less than the etching depth d and the contact area between the part of changed material 201 and the part of unchanged material 203 is enlarged. However, if the optical near-field intensity that is generated becomes smaller by changing the material of the vicinity of the vertex at which the optical near-field is generated (for example, a case where the conductivity of the material of the part of changed material 201 is lower than the conductivity of the material of the part of unchanged material 203), it is preferable that the width x of the part of changed material 201 is set not larger than the etching depth d to make the volume of the part of changed material 201 small. In this embodiment, the etching depth d was set to 10 nm and the width x of the part of changed material was set to 5 nm. Further, in this embodiment, in order to enhance the contrast of images, a material of a region 201 from the vertex 202 at which the optical near-field is generated to a depth x is chosen to be a fluorescent material or a nonlinear material. For the fluorescent material, one material selected from among dyes, such as Rhodamine, Coumarin, Pyridine, Fluorescein, and Styryl, and semiconductors, such as GaAs, GaN, and CdS was used. For the nonlinear material, one material selected from among CdS, CdTe, LiNbO$_3$, etc. was used. To realize high contrast, it is preferable that the width x of a part of changed material is set not larger than the etching depth d to make the volume of the phosphor small. In this embodiment, the etching depth d is set to 10 nm and the width x of the part of changed material is set to 5 nm.

A direction of the interface between the part of changed material and the part of unchanged material is arbitrary. For example, as shown in FIG. 23B and FIG. 24B, the interface 204 between the part of changed material and the part of unchanged material may be substantially perpendicular to the surface of the sample or recording medium. In this embodiment, both in the case of FIG. 23B and in the case of FIG. 24B, the scatterer was specified as follows: an angle formed by the interface 204 between the part of changed material and the part of unchanged material and the surface of the sample or recording medium was 90 degrees; the width x of the part of changed material was 5 nm; the etching depth d was 10 nm; and a material of the part of changed material was one selecting from among high-hardness materials, such as Pt, Pd, Rh, Ir, Ti, Cr, Co, Si, and SiN, dyes, such as Rhodamine, Coumarin, Pyridine, Fluorescein, and Styryl, semiconductor fluorescent materials, such as GaAs, GaN, and CdS, and nonlinear materials, such as CdS, CdTe, and $LiNbO_3$.

(Embodiment 5)

Figure 25A:
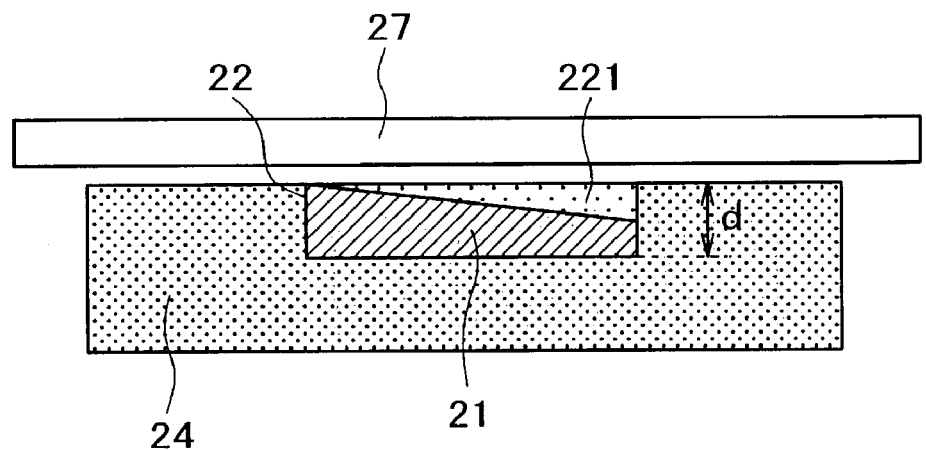
FIG. 25A is a cross-sectional view such that an etched part is filled with a material different from that of a scatterer, where the scatterer is arranged parallel to the sample or recording medium.
Figure 25B:
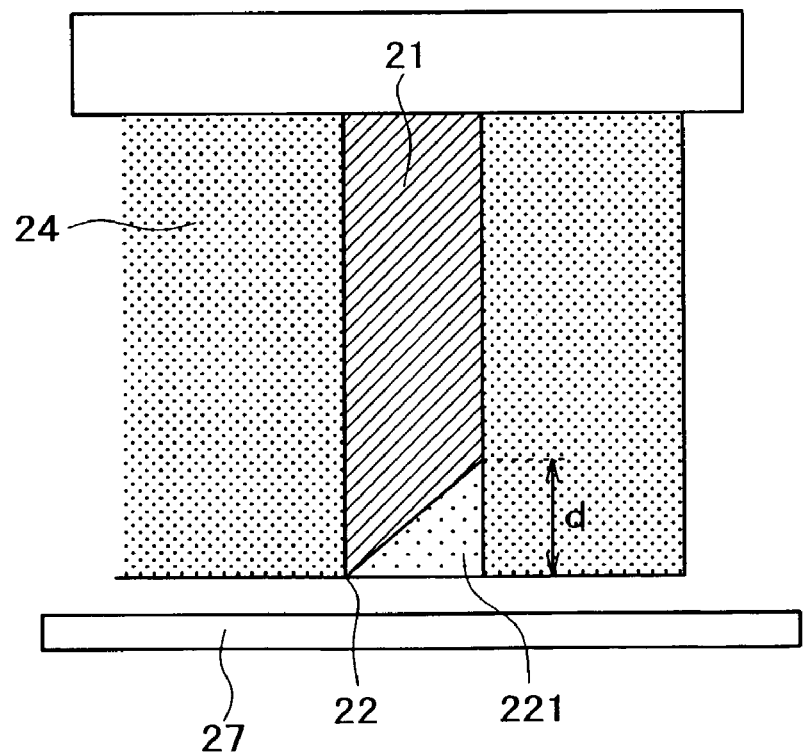
FIG. 25B is a cross-sectional view such that an etched part is filled with a material different from that of a scatterer, where the scatterer is arranged perpendicular to a sample or recording medium.

Embodiment 5 shows an example where an etched-way portion is filled with a predetermined material. FIGS. 25A and 25B show an example where a portion 221 of a top surface that was taken away by etching is filled with a material different from the material of the scatterer. For example, if the etched-away portion 221 is filled with a dielectric, such as $SiO_2$ and $Al_2O_3$, the penetration depth of optical near-field becomes small and hence it becomes more difficult for the optical near-fields that are generated at the parts except for the vertex 22 at which the optical near-field is generated to reach the sample or recording medium 27. In this embodiment, as shown in FIG. 25A or FIG. 25B, a scatterer of gold was etched from the surface by 5 nm, and a recess thus formed was filled with a dielectric of $SiO_2$, $Al_2O_3$, or $CrO_3$.

(Embodiment 6)

Figure 26A:
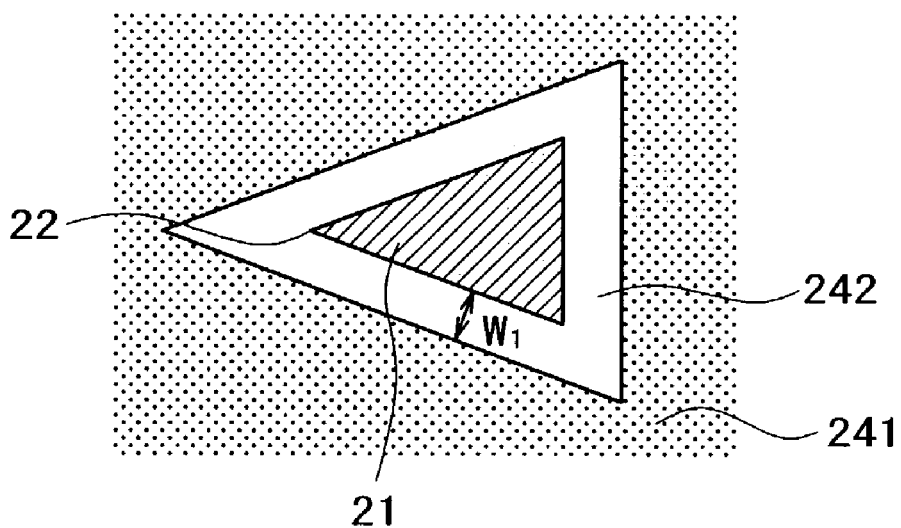
FIG. 26A is a view showing a scatterer such that a light-shielding film is formed in the surroundings of the scatterer, where the shape of the scatterer is a triangle.
Figure 26B:
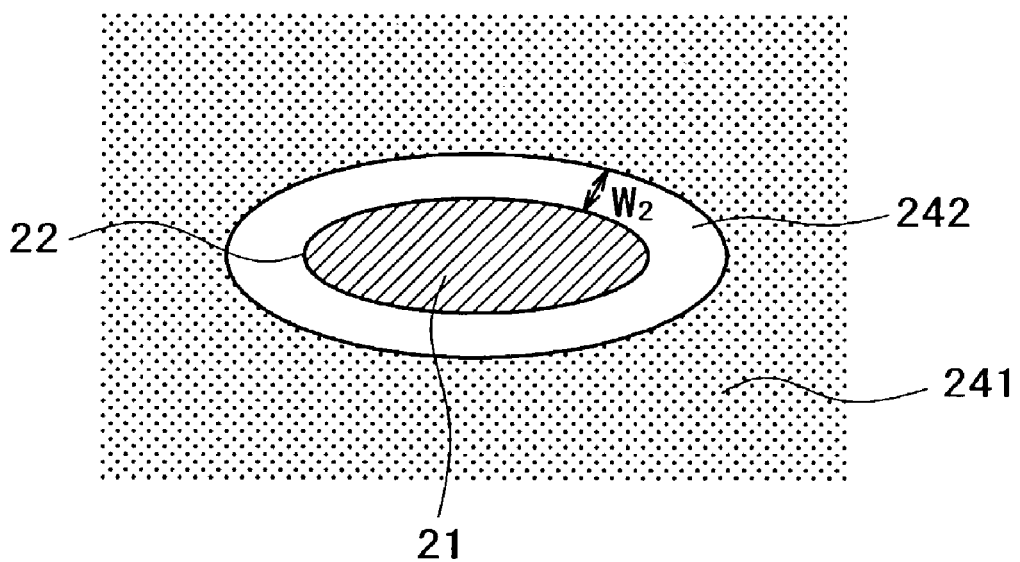
FIG. 26B is a view showing a scatterer such that a light-shielding film is formed in the surroundings of the scatterer, where the shape of the scatterer is an ellipse.

Next, an example in which the light-shielding film is used will be described. When the power of the light that passed through the probe is detected in order to detect the shape of a sample or the existence of the record mark formed on a recording medium, light that did not hit the scatterer is detected, as it is, by the detector. This light acts as the background light, causing the signal to noise ratio of detection to decrease. To prevent this, it is preferable to form a film with a light shielding effect (light-shielding film) 241 in the vicinity of the scatterer, as shown in FIGS. 26A and 26B. Here, the film with light shielding effect is defined as a film whose transmittance is 50% or less. For the material of this light-shielding film, a material selected from among metals, such as gold and silver, semiconductors, such as Si and GaAs, and dielectrics such as carbon is used. By setting spacing $W_1$ between the scatterer and the light-shielding film not larger than the light wavelength (in this embodiment, setting it to 50 nm), the occurrence of background light can be controlled. Note that in the case where a film with light absorptivity (a film that has low reflectance as well as low transmittance. Here it is defined as a film whose transmittance and reflectance are both 50% or less.) is used as the light-shielding film, not only an apparatus that uses a method for detecting transmitted light of the probe (Illumination mode) but also an apparatus that uses a method for detecting light coming back to the light source side (Illumination-Collection mode) can control the background light. In this embodiment, as shown in FIG. 26A and FIG. 26B, a scatterer in the shape of a triangle or ellipse whose surface was etched except for the vertex 22 at which the optical near-field was generated was formed and the light-shielding film 241 was formed around the scatterer. The materials of the scatterer and of the light-shielding film were both chosen to be gold and the spacing $W_1$ between the scatterer and the light-shielding film is set to 50 nm.

Figure 27A:
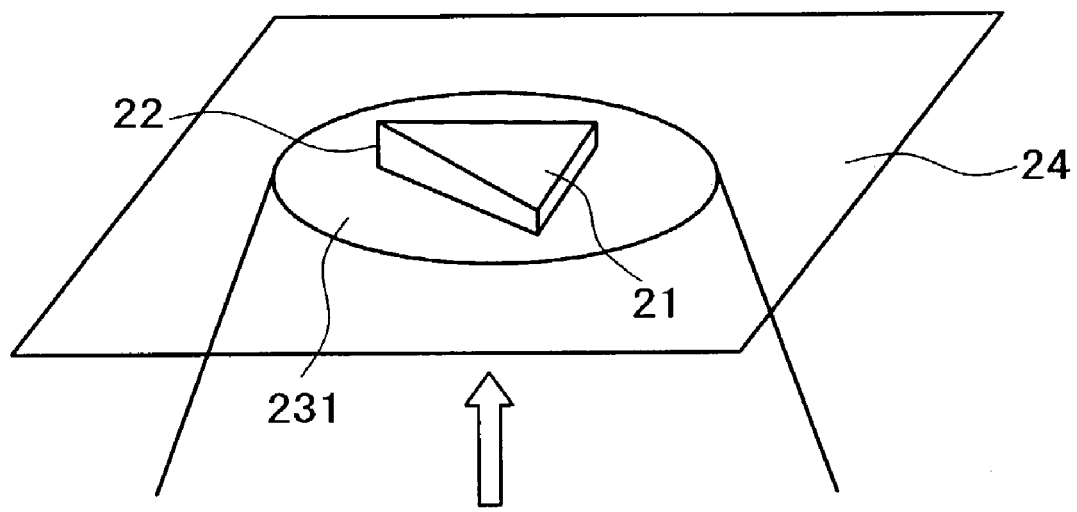
FIG. 27A is a view showing positions of a light spot and a scatterer where the center position of the light substantially coincides with the center of the scatterer.
Figure 27B:
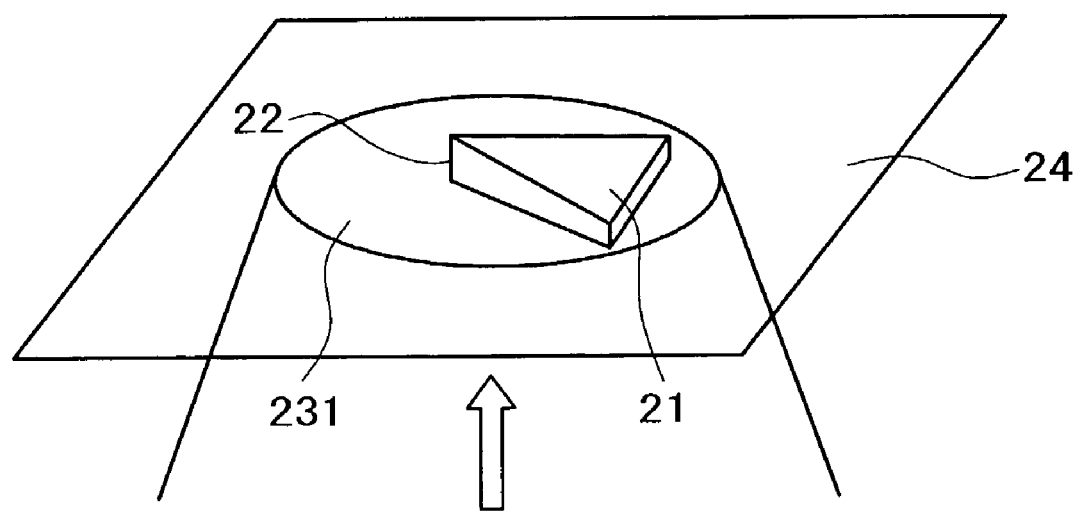
FIG. 27B is a view showing positions of a light spot and a scatterer where the center position of the light substantially coincides with the vertex at which the optical near-field is generated.

Incidentally, as is common to each embodiment, a center position of the light that is made to enter the above-mentioned scatterer is brought into substantially coincidence with a center of the scatterer, as shown in FIG. 27A, so that the light intensity on the scatterer becomes maximum. Alternatively, in order to make a position at which the optical near-field peaks in intensity coincide with the center position of the incident light, the center position of the incident light may be brought into substantially coincidence with the vertex 22 at which the optical near-field is generated, as shown in FIG. 27B. Here, substantial coincidence means that the distance between the center position of the incident light and the vertex is within ½ of the full width at half maximum of a light spot of the incident light.

(Embodiment 7)

The embodiment 7 shows an example in which the scatterer is formed on a specified element.

Figure 28A:
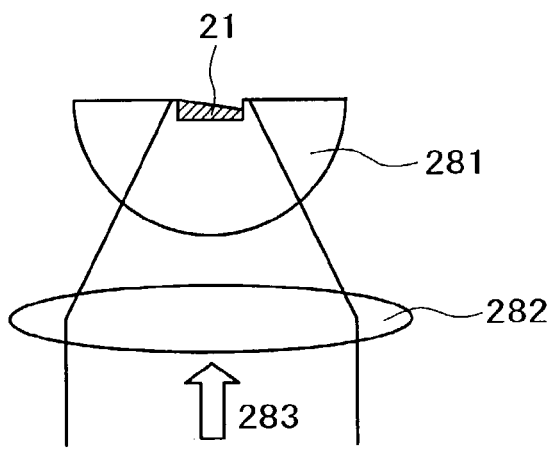
FIG. 28A is a view showing a scatterer formed on a solid immersion lens.
Figure 28B:
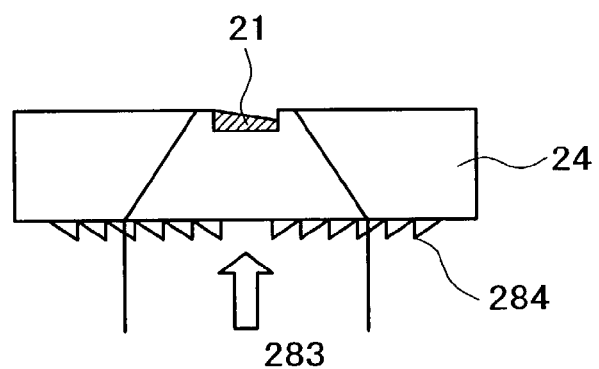
FIG. 28B is a view showing a scatterer formed on a Fresnel lens.
Figure 28C:
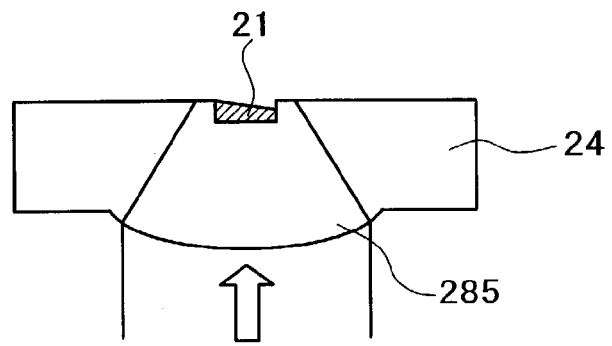
FIG. 28C is a view showing a scatterer formed on a convex lens.
Figure 28D:
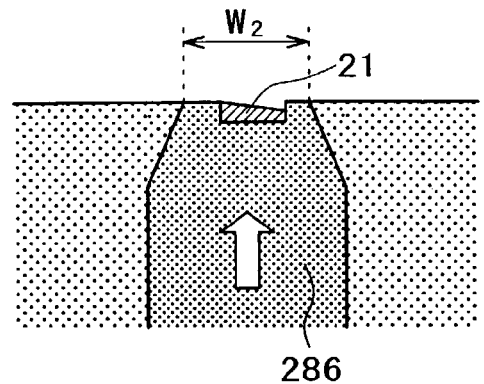
FIG. 28D is a view showing a scatterer formed on an end of a waveguide.
Figure 29A:
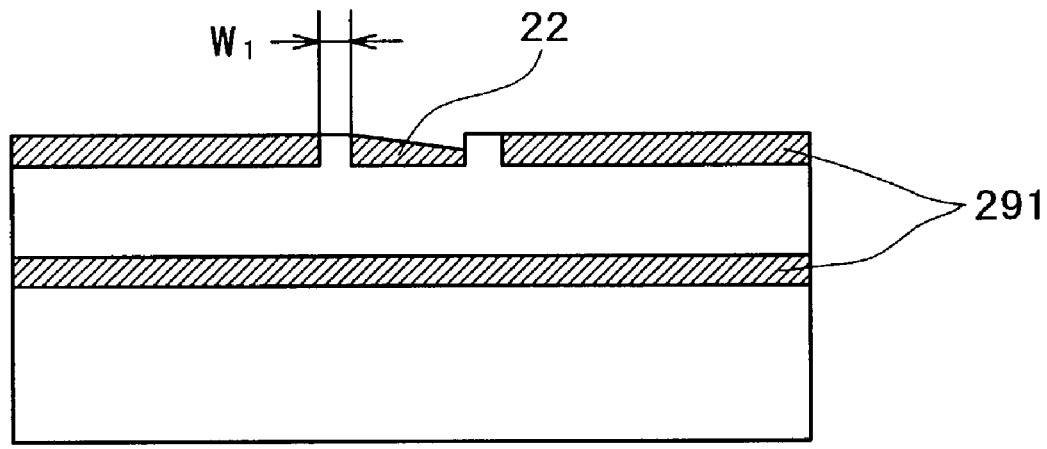
FIG. 29A is a view showing a scatterer formed on an end face of an optical cavity.
Figure 29B:
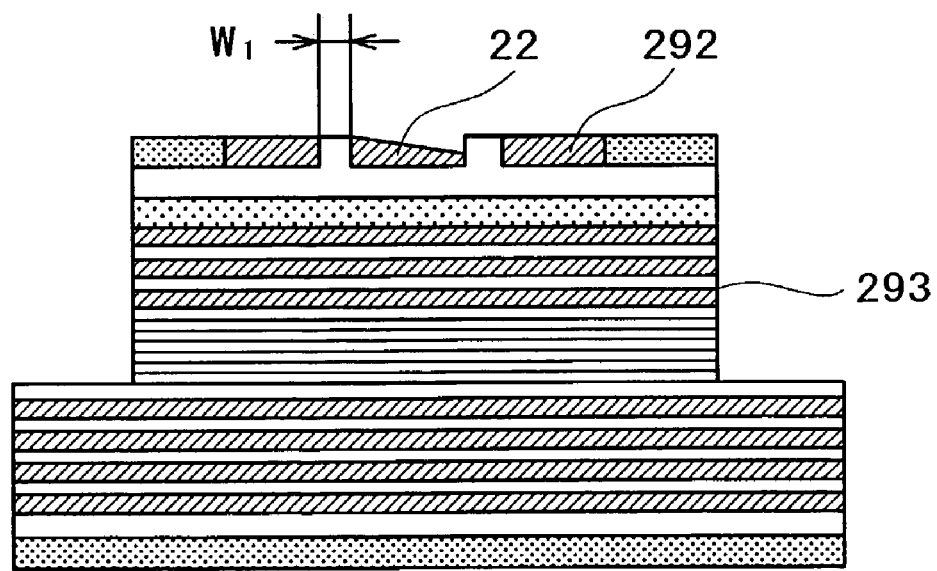
FIG. 29B is a view showing a scatterer formed on an end face of a vertical cavity surface emitting laser.

First, an example in which the scatterer is formed on a converging element will be described. The scatterer 21 is formed on a solid immersion lens 281 as shown in FIG. 28A, on the substrate 24 attached with a Fresnel lens as shown in FIG. 28B, on the substrate 24 attached with a convex lens 285 as shown in FIG. 28C, etc. In these examples, the scatterers are formed at a focusing point of the light. With this structure, position adjustment between the converging element and the scatterer becomes unnecessary. Further, as shown in FIG. 28D, the scatterer may be formed at the end of a waveguide 286. At this time, in order to make as much light as possible hit the scatterer, it is preferable to set the diameter $w_2$ of the end of the waveguide not larger than the light wavelength. However, if $w_2$ becomes ½ of the light wavelength or less, no propagation mode of light exists in the waveguide. Therefore, it is preferable to set $w_2$ to ½ of the wavelength in the waveguide or larger. Moreover, the scatterer may be formed in the vicinity of the exit face of the optical cavity, namely within 10 μm from the exit face. For example, as shown in FIG. 29A, reflection films 291 for making the light resonate are formed in the substrate, an aperture is formed in the reflection film 291, and the scatterer 21 is formed in the aperture. At this time, in order to suppress generation of the background light, it is preferable to set the spacing $w_1$ between the scatterer and the reflection coating not larger than the light wavelength. In this embodiment, $w_1$ was set to 50 nm. Thus, if the scatterer is formed in the vicinity of the exit face of the cavity, light that does not hit the scatterer is backed again by the cavity to irradiate the scatterer again; therefore light utilization efficiency can be improved. Further, the scatterer may be formed in the vicinity of the exit face of the semiconductor laser, namely within 10 μm from the exit face. For example, as shown in FIG. 29B, a scatterer 21 is formed in the vicinity of the exit face of a vertical cavity surface emitting laser 293. At this time, in order to suppress the background light, it is advisable to form a reflection film 292 on the exit face of the laser, form an aperture in the film, and form a scatterer in the aperture. At this time, it is preferable to set the spacing $w_1$ between the scatterer and the reflection coating not larger than the light wavelength. In this embodiment, $w_1$ was set to 50 nm. Forming the scatterer on the exit face of the semiconductor laser this way makes position adjustment between the light source and the scatterer unnecessary. Further, the scatterer may be formed in the vicinity of the light-receiving surface of a photodetector such as a photodiode, namely within 10 μm from the light-receiving surface. This arrangement eliminates the need for position adjustment between the detector and the scatterer.

Figure 30A:
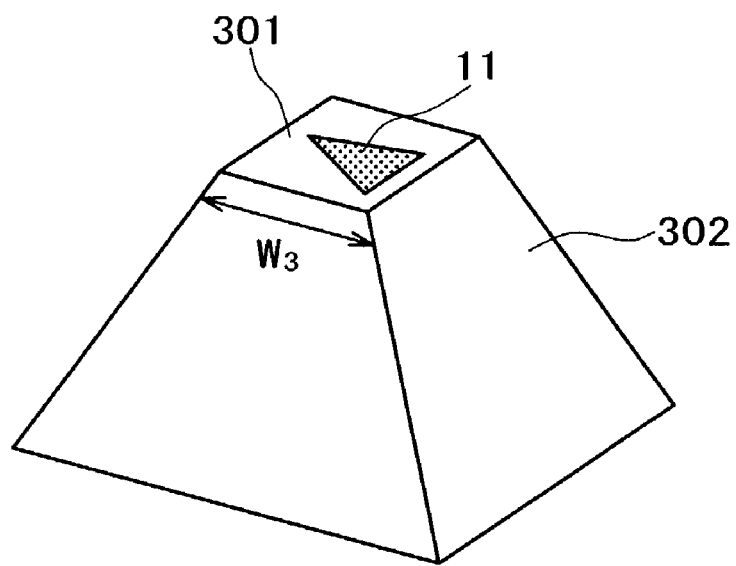
FIG. 30A is a view showing a probe whose scatterer is formed on a flat part formed on the top of a conical or pyramidal protrusion, such that side faces of the protrusion are not covered with the light-shielding film.
Figure 30B:
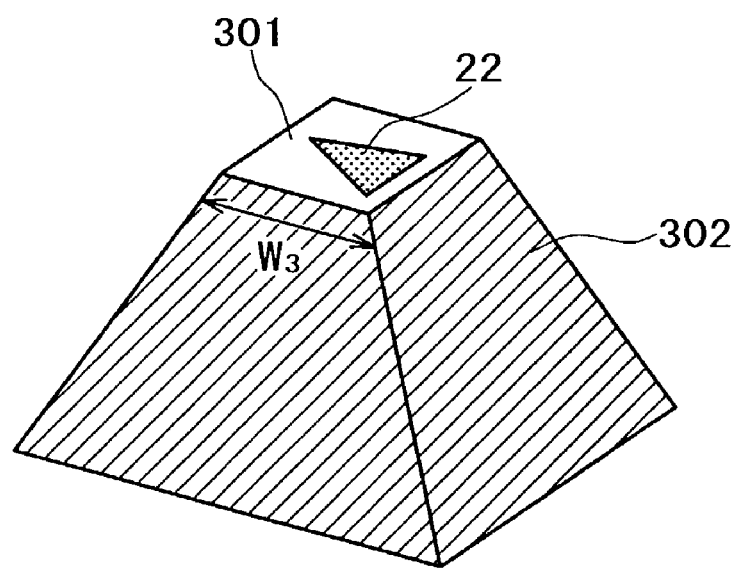
FIG. 30B is a view showing a probe whose scatterer is formed on a flat part formed on the top of a conical or pyramidal protrusion, such that side faces of the protrusion are covered with the light-shielding film.

As shown in FIG. 30A, the scatterer may be formed on a flat part 301 formed at the top of a protrusion in the shape of a cone or pyramid 302. At this time, in order to allow the scatterer to come close to a sample easily, it is preferable to make a minimum value $W_3$ of the width of the flat part as small as possible. Further, if the side face(s) of the cone or pyramid are covered with a metal, as shown in FIG. 30B, the protrusion of the cone or pyramid acts as an optical waveguide to concentrate the light to a part where the scatterer 21 exists. In this case, if the minimum value $W_3$ of the width of the flat part on the top is set not larger than the wavelength of the light propagating in the protrusion (expressing in terms of area, an area of the flat part on the top is set not larger than a square of the wavelength of the light propagating in the protrusion), occurrence of the background light that is generated from the surroundings of the scatterer can also be controlled. However, if the width $w_3$ of the flat part is set not larger than ½ of the wavelength of the light propagating in the protrusion, the amount of light emitting from the top is decreased (this is because if the size of the waveguide decreases to ½ of the light wavelength or less, there is no propagation mode of light); therefore it is better to set the width $w_3$ of the flat part not less than ½ of the wavelength of the light propagating in the protrusion (expressing in terms of area, to set an area of the flat part of the top not less than a square of ½ of the wavelength of the light propagating in the protrusion). In this embodiment, the side faces of the pyramidal protrusion of $SiO_2$ were covered with gold of a thickness of 100 nm, and the width $w_3$ of the top was set to 250 nm.

(Embodiment 8)

Figure 31A:
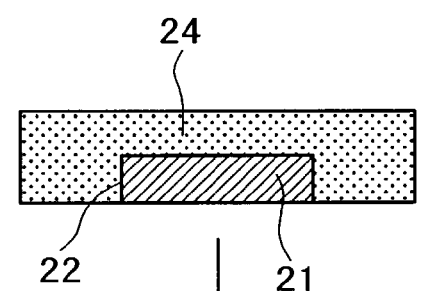
FIG. 31A shows a method for fabricating a probe such that the plane of a scatterer thereof is substantially parallel to the surface of the sample or medium, specifically, a process of fabricating a pattern embedded in a substrate.
Figure 31B:
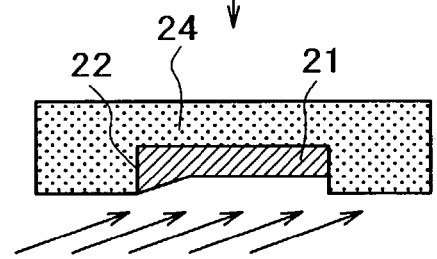
FIG. 31B shows a method for fabricating a probe such that the plane of a scatterer thereof is substantially parallel to the surface of the sample or medium, specifically, a process of anisotropic etching.
Figures 32A, 32B:
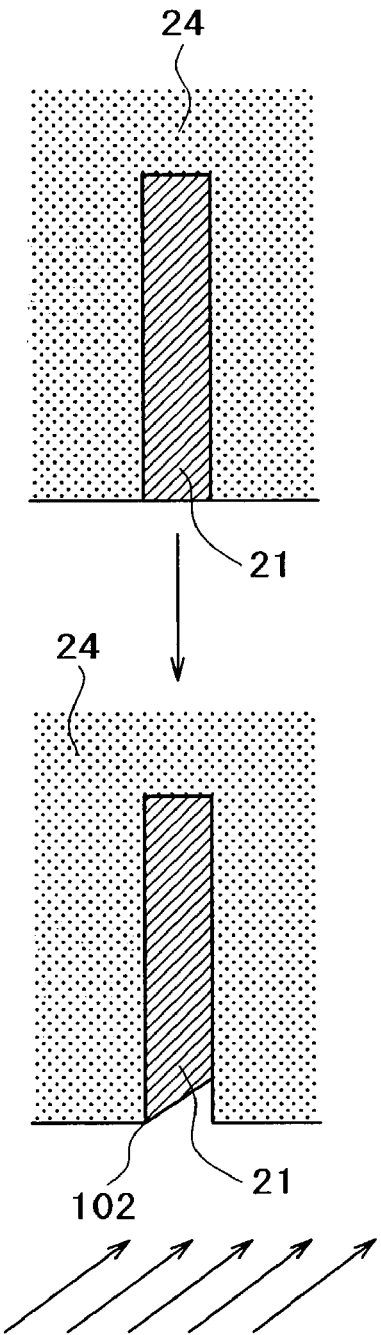
FIG. 32A shows a method for fabricating a probe such that the plane of a scatterer thereof is substantially perpendicular to the surface of the sample or medium, specifically, a process of fabricating a pattern embedded in a substrate.
FIG. 32B shows a method for fabricating a probe such that the plane of a scatterer thereof is substantially perpendicular to the surface of the sample or medium, specifically, a process of anisotropic etching.

Next, a method for fabricating the probe will be described. In the case where the plane of the scatterer is set substantially parallel to the surface of the sample or medium, first the scatterer 21 embedded in the substrate 24 is formed as shown in FIG. 31A. Next, as shown in FIG. 31B, the scatterer in the substrate is etched selectively and obliquely using anisotropic etching, such as ion milling and RIE (Reactive Ion Etching). At this time, since a part 22 at which the optical near-field is generated is in shadow of the substrate 24, it remains non-etched and only the remaining part is etched. In the case where the plane of the scatterer is set substantially perpendicular to the surface of the sample or medium, the scatterer can be manufactured in the same method as shown in FIGS. 32A and 32B.

Figure 33A:
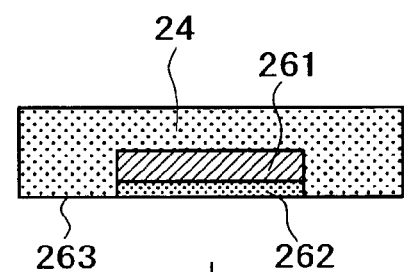
FIG. 33A shows a method for fabricating a scatterer such that a material in the vicinity of the vertex at which the optical near-field is generated is made different from that of a remaining part (an interface between different materials is substantially parallel to the substrate surface), specifically, a process of fabricating a pattern with two layers that is embedded in a substrate.
Figure 33B:
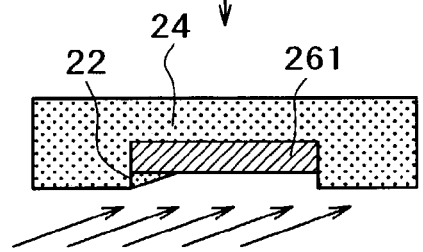
FIG. 33B shows a method for fabricating a scatterer such that a material in the vicinity of the vertex at which the optical near-field is generated is made different from that of a remaining part (an interface between different materials is substantially parallel to the substrate surface), specifically, a process of anisotropic etching.

Further, a scatterer such that the material of the vicinity of the vertex at which the optical near-field is generated is different from that of the remaining part is manufactured as shown in FIGS. 33A and 33B. First, as shown in FIG. 33A, a scatterer composed of two layers of films that are made up with a material 262 of the vicinity of the vertex at which the optical near-field is generated and a material 261 of the remaining part, respectively, is formed so that the interface between the different materials is substantially parallel to a substrate surface 263 and at the same time is embedded in the substrate 24. At this time, the plane of the scatterer may be substantially parallel to the substrate surface 263, namely the surface of the sample or medium, or may be substantially perpendicular thereto (FIGS. 33A and 33B show a case where the substrate surface is substantially parallel to the substrate surface.). Next, the scatterer in the substrate is etched obliquely using anisotropic etching, such as ion milling and RIE, as shown in FIG. 33B. At this time, since a part 22 at which the optical near-field is generated is in shadow of the substrate 24, it remains non-etched and only the remaining part is etched.

Figure 34A:
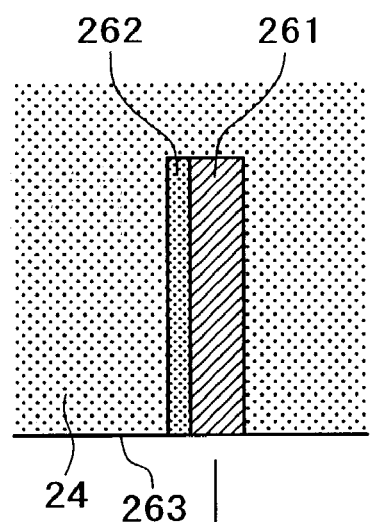
FIG. 34A shows a method for fabricating a scatterer such that a material in the vicinity of the vertex at which the optical near-field is generated is made different from that of a remaining part (an interface between the different materials is substantially perpendicular to the substrate surface), specifically, a process of fabricating a pattern with two layers that is embedded in a substrate.
Figure 34B:
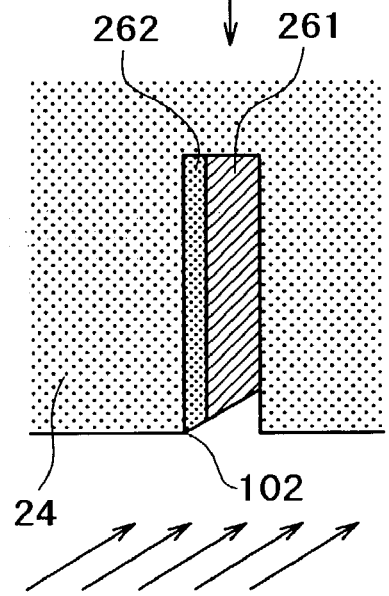
FIG. 34B shows a method for fabricating a scatterer such that a material in the vicinity of the vertex at which the optical near-field is generated is made different from that of a remaining part (an interface between the different materials is substantially perpendicular to the substrate surface), specifically, a process of anisotropic etching.

Further, the scatterer can be manufactured so that the interface between the different materials becomes substantially perpendicular to the substrate surface 263, as shown in FIG. 34A. Note that the plane of the scatterer may be substantially parallel to the substrate surface or may be substantially perpendicular thereto (FIGS. 34A and 34B show a case where the plane of the scatterer is substantially perpendicular to the substrate surface.). First, as shown in FIG. 34A, a scatterer composed of two layers of films that are made up with the material 262 of the vicinity of the vertex at which the optical near-field is generated and the material 261 of the remaining part is formed so as to be embedded in the substrate 24. Next, the scatterer in the substrate is etched obliquely using anisotropic etching, such as ion milling and RIE, as shown in FIG. 34B.

Figure 35A:
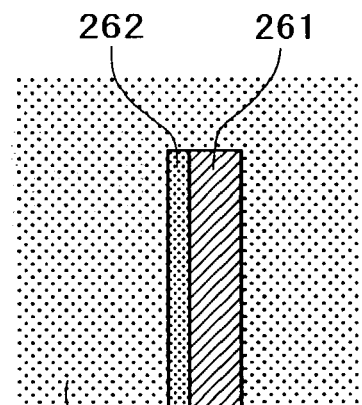
FIG. 35A shows a method for fabricating a scatterer such that a material in the vicinity of the vertex at which the optical near-field is generated is made different from that of a remaining part, specifically, a process of fabricating a pattern with two layers that is embedded in a substrate.
Figure 35B:
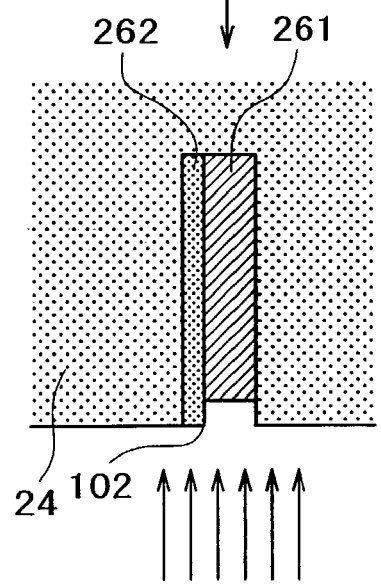
FIG. 35B shows a method for fabricating a scatterer such that a material in the vicinity of the vertex at which the optical near-field is generated is made different from that of a remaining part, specifically, a process of selective etchings.

Moreover, in the case where the interface between the different materials is substantially perpendicular to the substrate surface, while the part 262 made up with the material of the vicinity of the vertex at which the optical near-field is generated are left non-etched, only the remaining part 261 may be etched by selective etching, such as RIE, as shown in FIGS. 35A and 35B, instead of etching obliquely the whole of the scatterer in the substrate using anisotropic etching, such as ion milling and RIE.

Figure 36A:
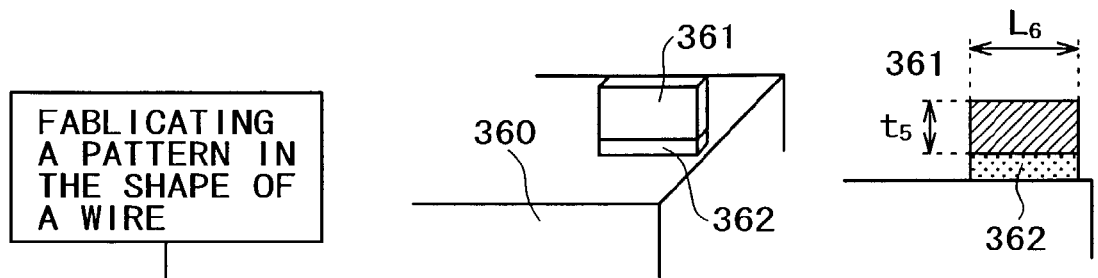
FIG. 36A shows a method for forming a scatterer at the end of a waveguide, specifically, a fine wire fabricating process.
Figure 36B:
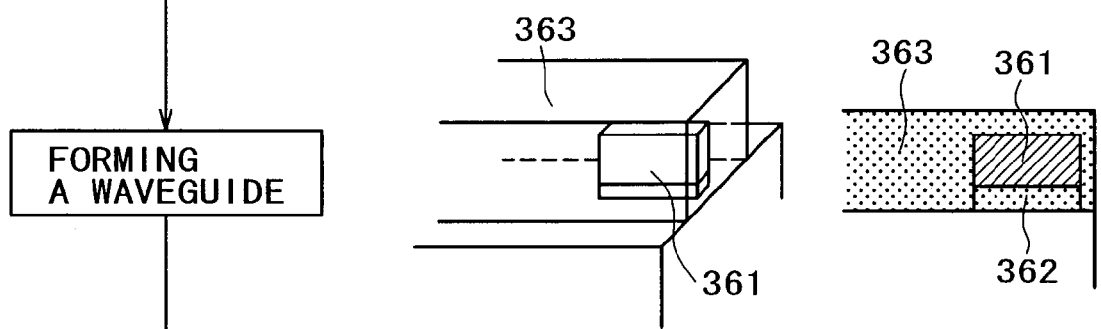
FIG. 36B shows a method for forming a scatterer at the end of a waveguide, specifically, a waveguide forming process.
Figure 36C:
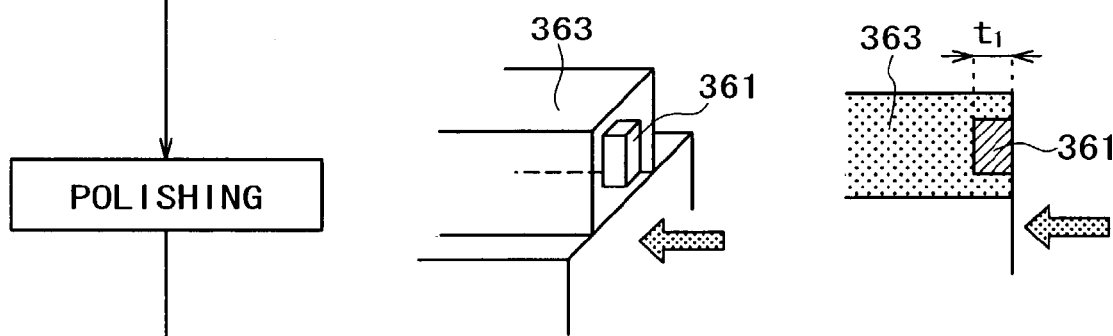
FIG. 36C shows a method for forming a scatterer at the end of a waveguide, specifically, a polishing process.
Figure 36D:
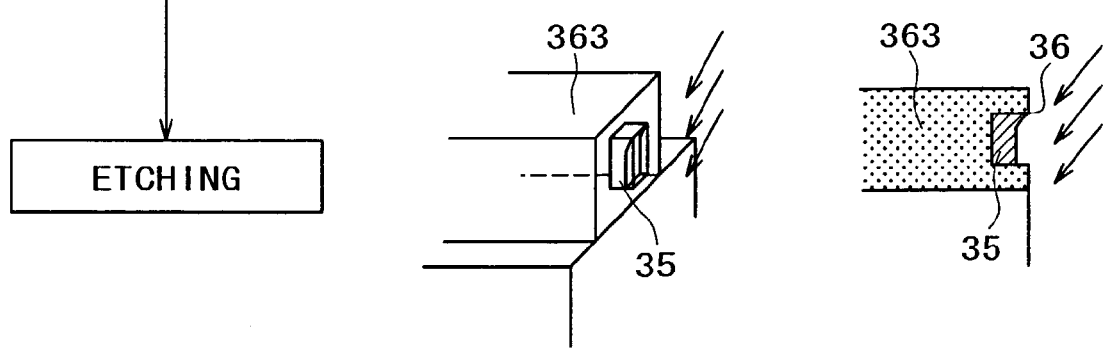
FIG. 36D shows a method for forming a scatterer at the end of a waveguide, specifically, an etching process.

FIGS. 36A, 36B, 36C, and 36D show a method for manufacturing the probe such that the scatterer is formed at the end of a waveguide. In this embodiment, a shape of the scatterer was chosen to be rectangular. First, on a substrate 360, a fine wire composed of two layers of a part 361 that is made up with a material of the scatterer and a part 362 that is made up with a material of the waveguide is fabricated (FIG. 36A). At this time, the fabrication is performed so that the thickness $t_5$ of the part 361 made up with a material of the scatterer is equal to the long-side length $L_4$ of the rectangle, and the length of the fine wire $L_6$ is larger than the thickness of the scatterer to manufacture. In this embodiment, the probe was specified as follows: the material of the substrate was a glass, the material of the scatterer was gold, the material of the waveguide was a glass into which an impurity was diffused, the thickness $t_5$ was 150 nm, and the length of the fine wire $L_6$ was 500 nm. Next, as shown in FIG. 36B, a waveguide 363 is formed to cover the fine wire, and subsequently is polished in a direction indicated by the arrow in FIG. 36C. At this time, the polishing is stopped when the length of the fine wire becomes equal to the thickness $t_1$ of the scatterer. Finally, based on the method illustrated in FIGS. 31A and 31B, the surface except for a point 36 at which the optical near-field is generated is etched by anisotropic etching, such as ion milling. Incidentally, in order to manufacture the scatterer in the shape of a triangle, the shape of the above-mentioned fine wire may be formed to a triangular prism.

(Embodiment 9)

Figure 37:
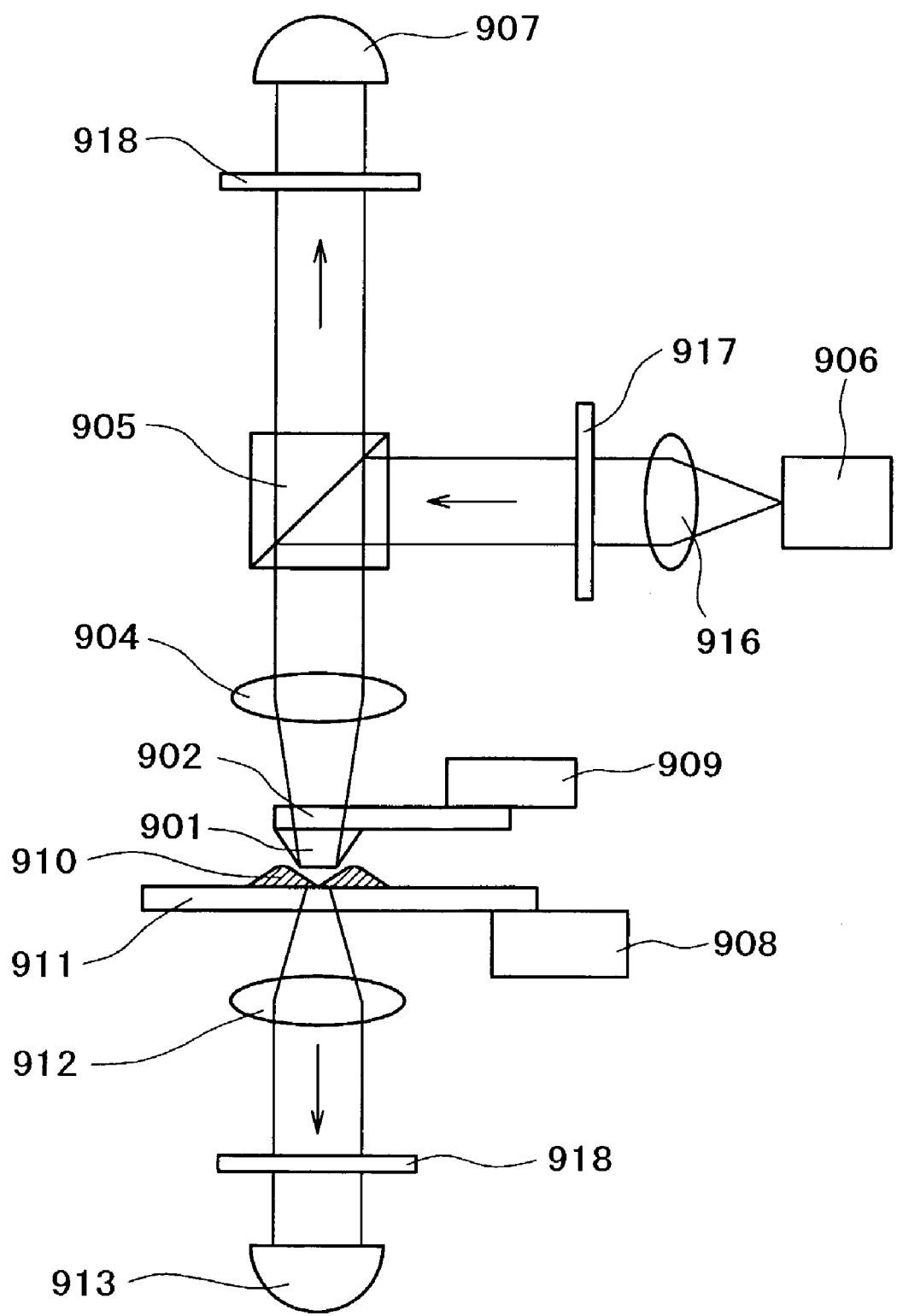
FIG. 37 is a view showing an application of the probe of this invention to a scanning near-field optical microscope.

The embodiment 9 describes application equipment. FIG. 37 shows an example in which the above-mentioned near-field optical probe is applied to a scanning near-field optical microscope. Here, shown is an example in which a probe formed at the tip of a cantilever of an atomic force microscope is used. A sample 910 was placed on a substrate 911, and the above-mentioned near-field optical probe 901 is brought close to the surface of the sample 910. Light emitted from a laser 906 was collimated by a lens 916, and was made to enter an objective lens 904 after passing through a beam splitter 905. Th light is focused by the objective lens to converge at a minute structure part of a metal. The microscope was configured so that light from the probe is converged by the objective lens 904 and detected by a detector 907, or is converged by an objective lens 912 disposed on the opposite side of the sample and detected by a detector 913. When the sample is scanned horizontally using a piezoelectric translator 908, the intensity of scattered light generated on the sample surface varies. By recording this variation, an image of the sample was obtained. Here, in the case where the polarization direction of a signal from the sample is different from the polarization direction of the incident light, the contrast can be improved by disposing polarizers 917, 918 in the optical path (if the laser is linearly polarized, only the polarizer 918 is used.) and setting the polarization direction of the polarizer 918 orthogonal to the polarization direction of the incident light. Further, if a luminescent material is formed in the vicinity of the vertex of the above-mentioned scatterer at which the optical near-field is generated, a band-pass filter is disposed in front of the detector to allow the detector to detect only emission.

It is necessary to set a gap between the above-mentioned probe tip and the sample surface less than a few tens of nanometers that is the penetration depth of optical near-field, and the gap is controlled by measuring an atomic force that works between the probe tip and the sample surface. That is, the probe is vibrated using a piezoelectric translator 909 in a longitudinal direction with an amplitude of a few nanometers, and the gap between the probe tip and the sample surface is controlled so that the amplitude becomes fixed. Measurement of variation in the amplitude is performed by making other light than the light emitted form the laser 906 hit a top face 902 of the cantilever and detecting reflected light therefrom with a PSD (Position Sensing Detector).

Figure 38A:
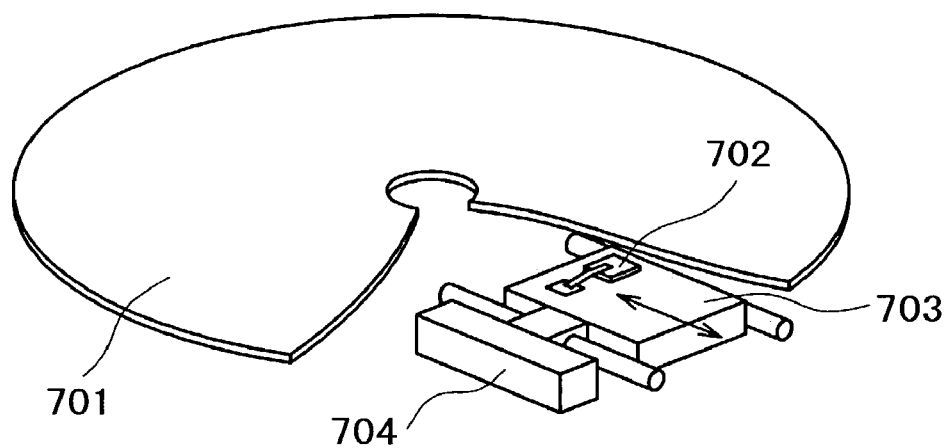
FIG. 38A is a general view showing an application of the probe of this invention to a near-field recording/reproducing apparatus.
Figure 38B:
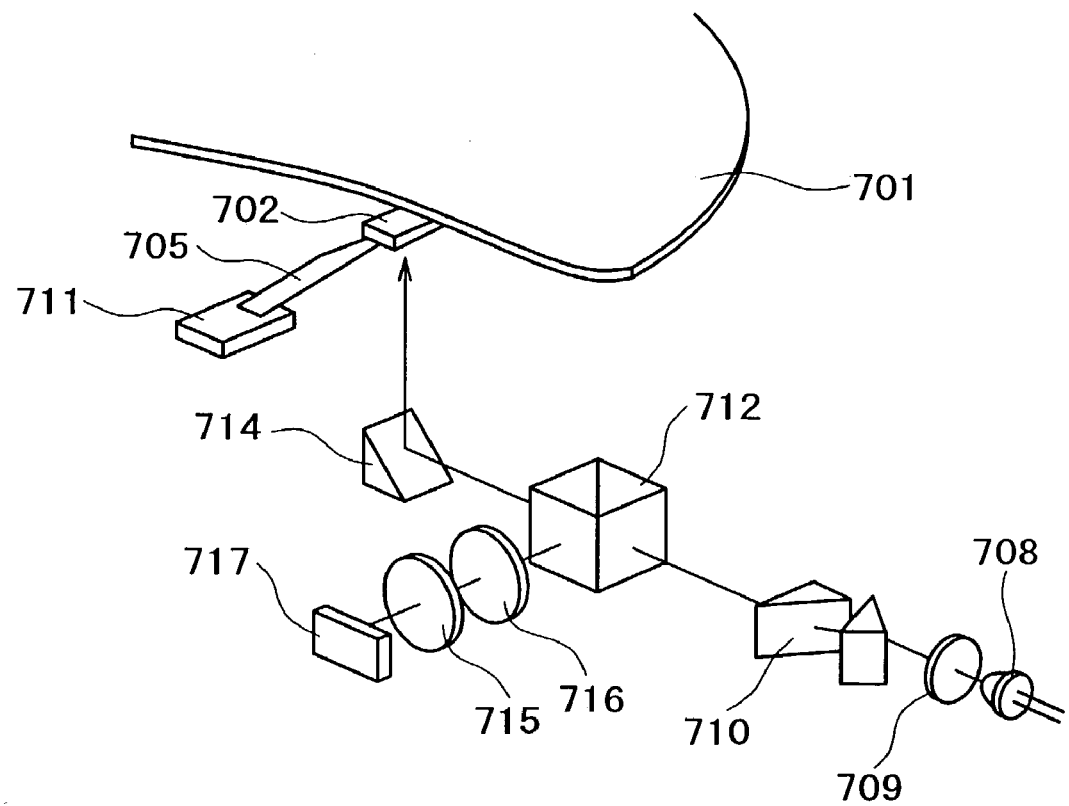
FIG. 38B is a view showing an application of the probe of this invention to a near-field recording/reproducing apparatus, showing an optical system.
Figure 39A:
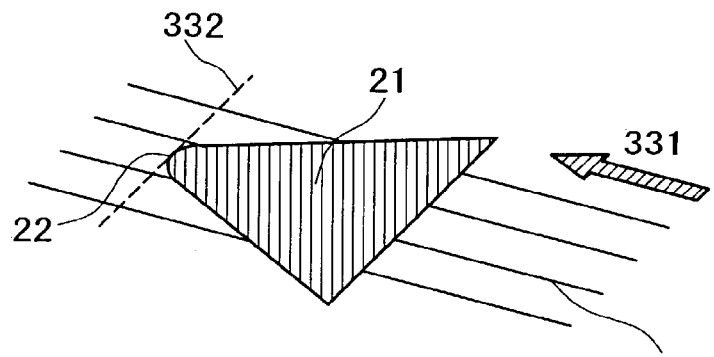
FIG. 39A is a view showing a relationship between a direction of a scatterer and a track direction for a case where the shape of the scatterer is a triangle.
Figure 39B:
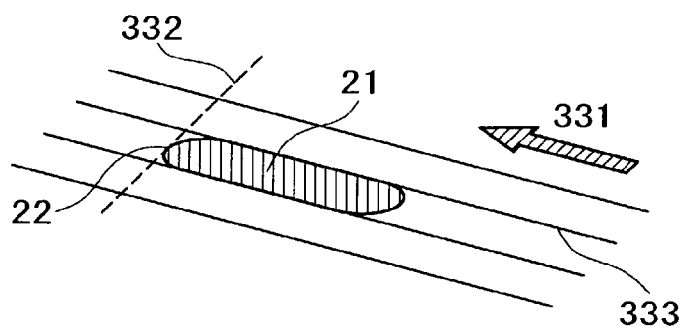
FIG. 39B is a view showing a relationship between a direction of a scatterer and a track direction for a case where the shape of the scatterer is a circle or ellipse.
Figure 39C:
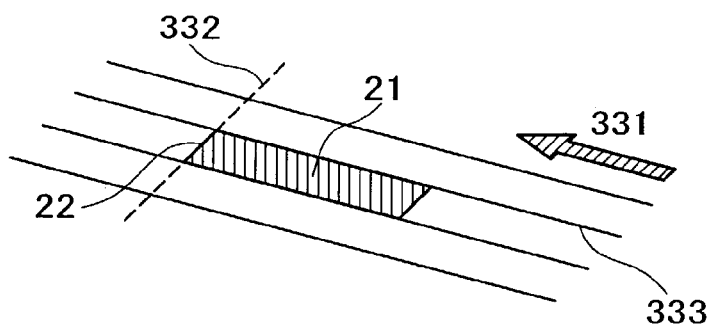
FIG. 39C is a view showing a relationship between a direction of a scatterer and a track direction for a case where the shape of the scatterer is a rectangle.
Figure 39D:
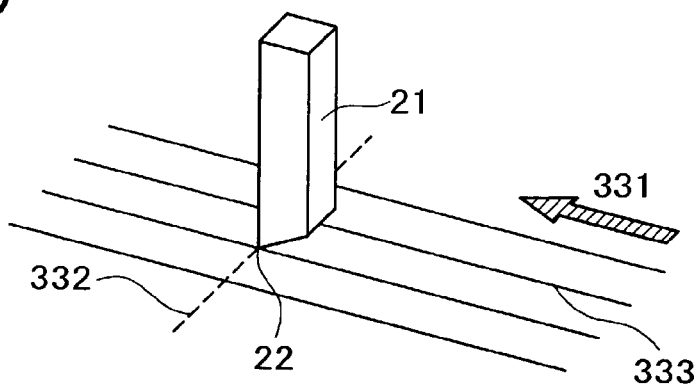
FIG. 39D is a view showing a relationship between a direction of a scatterer and a track direction for a case where the scatterer of a rectangular shape is arranged perpendicular to a recording medium.

FIGS. 38A and 38B show an application of the above-mentioned near-field optical probe to a recording/reproducing apparatus. In order to make the scatterer scan at high speed while keeping the gap between the scatterer and the recording medium less than a few tens of nanometers, the scatterer was formed on a slider 702, into which light from the optical head 703 equipped with a light source, a detector, etc. was made to enter. In this embodiment, a converging element was integrated in the slider, to which a collimated light beam is made to enter. The optical head was made capable of being moved in a radial direction using a carriage actuator 704. An optical system inside the optical head was configured as shown in FIG. 38B. A semiconductor laser 708 was used as the light source (a semiconductor laser of a wavelength of 780 nm and of an output of 30 mW was used) and its emission was converted to a circular collimated beam using a collimator lens 709 and an anamorphic prism 710. This beam was made to enter the near-field optical probe 702 after passing through a beam splitter 712 and a mirror 714. In order to fine adjust the position of the near-field optical probe for tracking, a piezoelectric translator 711 was used. The probe 702 was attached on a suspension 705 and was pressed to a disk 701 by the force of this suspension. In this embodiment, a phase-change medium was used as the optical disk 701, and the recording marks were formed by converting the crystalline phase to the amorphous phase with the optical near-field generated by the near-field optical probe. Reproduction was performed by detecting variation in the intensity of light coming back from the disk. That is, as a ratio at which the optical near-field is scattered varies according to the existence of the recording mark, the detection was done by detecting variation in the intensity of the scattered light. Practically, light from the disk (signal light) was separated into the incident light and the scattered light by the beam splitter 712, which was detected by a detector 717 after making it pass through a converging lens 715. Here, if the polarization direction of the signal light form the disk is different from the polarization direction of the incident light, the contrast can be improved by disposing a polarizer 716 in the optical path and adjusting the polarizer 716 so that the polarization direction thereof becomes orthogonal to the polarization direction of the incident light.

In the case where the probe is applied to the above-mentioned recording/reproducing apparatus, it is preferable that the scatterer is arranged so that a tangential direction 332 of the vertex 22 of the scatterer at which the optical near-field is generated is at right angles to a direction parallel to the track 331, as shown in FIGS. 39A, 39B, 39C, and 39D. The reason of this arrangement is as follows. As shown in FIGS. 5A and 5B as well as FIG. 15, the intensity distribution of the optical near-field has a shape extended in a tangential direction of the vertex 22 at which the optical near-field is generated. In the recording/reproducing apparatus, in order to facilitate tracking servo, such a shape of the recording mark as is elongated in a direction perpendicular to the track direction is preferable. Therefore, to record such marks, it is preferable that the scatterer is arranged so that the tangential direction 332 of the vertex 22 of the scatterer at which the optical near-field is generated is at right angles to the direction parallel to the track 331.

Figure 40:
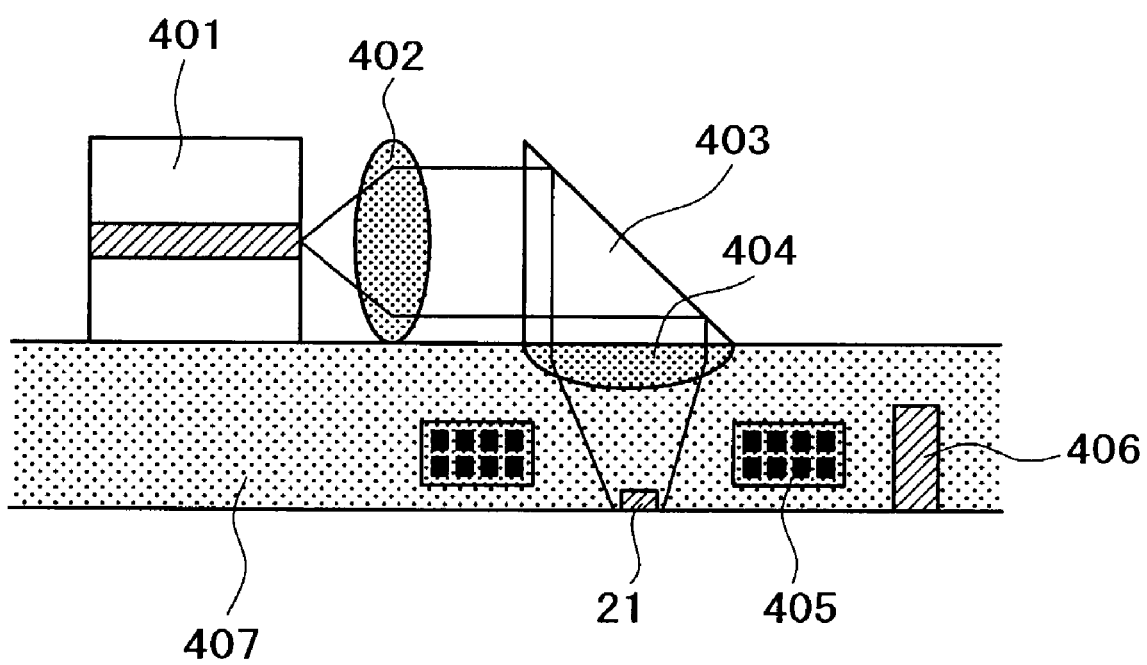
FIG. 40 is a view showing a recording head for magnetic medium in the case where a scatterer is installed at the center of a magnetic-field applying coil.

In the above-mentioned recording/reproducing apparatus, the magnetic medium may be used as the medium. FIG. 40 shows an example of a head for magnetic medium. The scatterer 21 was formed on the surface of a slider 407, and a magnetic field applying coil 405 was formed around the scatterer 21. A semiconductor laser 401 acting as a light source was formed on the slider, and light that generates therefrom was made to enter the scatterer 21 after passing through a collimator lens 402, a mirror 403, and a converging lens 404. Incidentally, in the above-mentioned recording/reproducing apparatus, a magnetic reproducing head may be used for reproduction. The use of the magnetic reproducing head makes it possible to miniaturize the apparatus because an optical system for light detection becomes unnecessary. In the embodiment of FIG. 40, a giant magneto-resistive head 406 was installed near the scatterer.

Figure 41A:
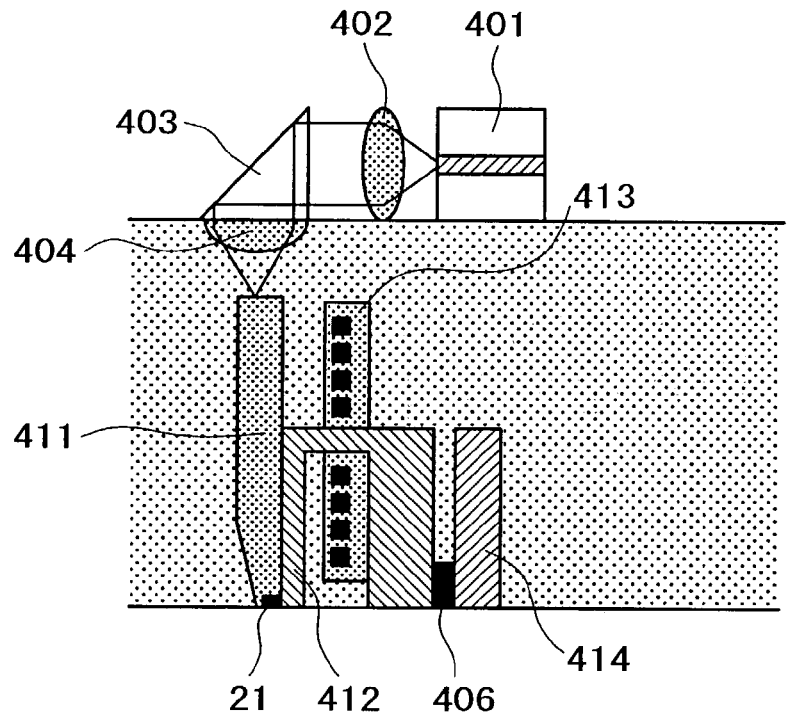
FIG. 41A is a view showing a recording head for magnetic medium for a case where a scatterer is arranged near the magnetic recording head.
Figure 41B:
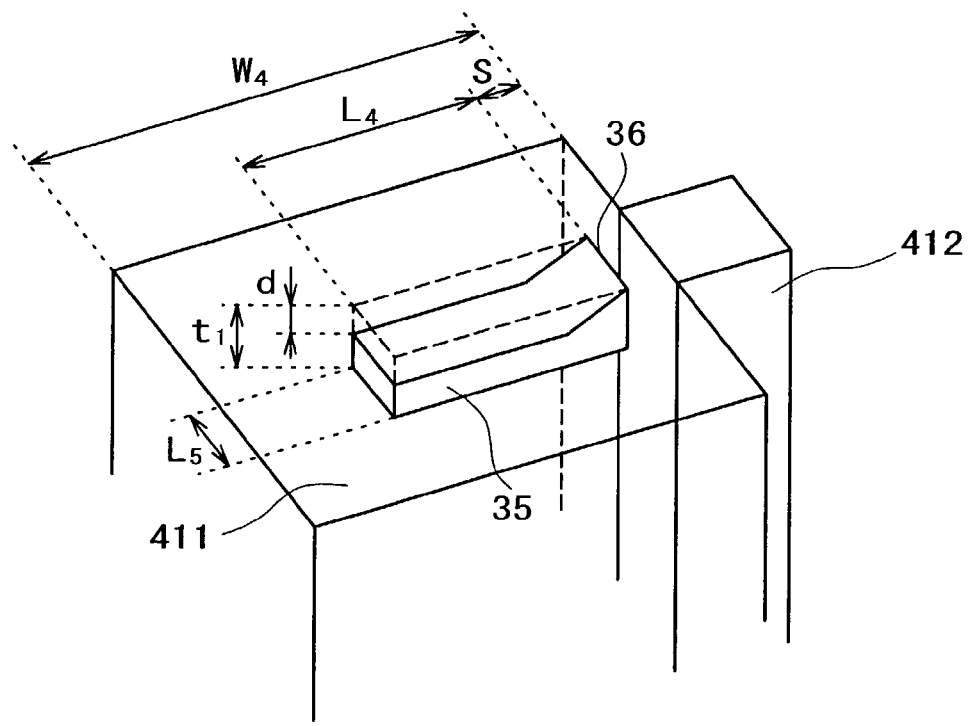
FIG. 41B is another view showing a recording head for magnetic medium for a case where a scatterer is arranged near the magnetic recording head.

In the recording/reproducing apparatus that uses the above-mentioned magnetic medium, the recording head used in the magnetic recording apparatus may be used as a magnetic-field applying device. FIG. 41A shows its embodiment. In this embodiment, a waveguide 411 was formed in contact with a magnetic pole 412, and the scatterer 21 was formed on the tip of the waveguide 411. A semiconductor laser 401 acting as a light source was formed on a slider, and light emitted therefrom was made to enter the waveguide 411 after passing through the collimator lens 402, the mirror 403, and the converging lens 404. The reproduction was performed with the giant magneto-resistive head 406. FIG. 41B shows an enlarged view of the scatterer and its surroundings. In this embodiment, the scatterer was specified as follows: the shape of the scatterer was a rectangle; the long-side length of the rectangle $L_4$ was 100 nm; the short-side length $L_5$ was 20 nm; the thickness $t_1$ was 40 nm; and the etching depth d was 10 nm. Since an area where the temperature rises by light irradiation and an area on which the magnetic field is applied need to overlap, it is better that the point 36 at which the optical near-field is generated is placed as close to the magnetic pole 412 as possible, so it was specified to be 5 nm in this embodiment. The size $W_4$ of the end of the waveguide was set to 300 nm.

Figure 42A:
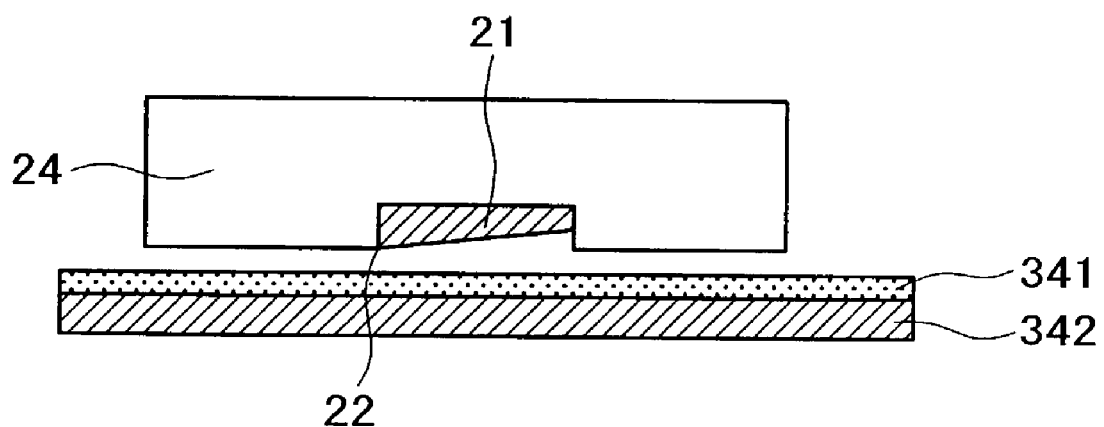
FIG. 42A is a view showing an application of the probe of this invention to exposure equipment for a case where the scatterer is arranged parallel to the recording medium.
Figure 42B:
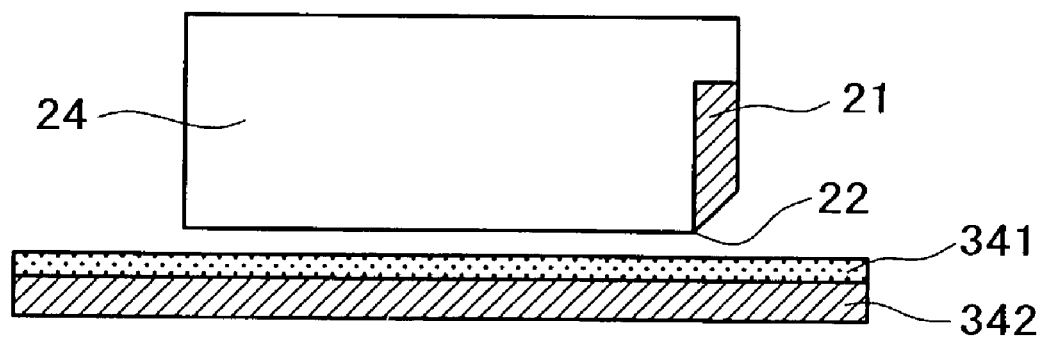
FIG. 42B is a view showing an application of the probe of this invention to exposure equipment for a case where the scatterer is arranged perpendicular to the recording medium.
Figure 43A:
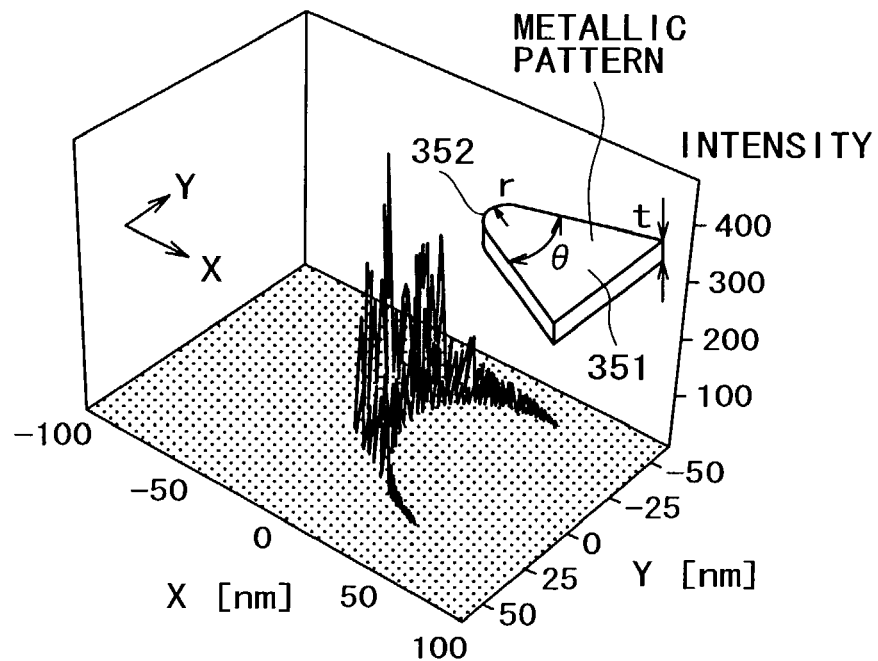
FIG. 43A is a view showing a probe that uses the conventional planar metal scatterer for a case of a single scatterer.
Figure 43B:
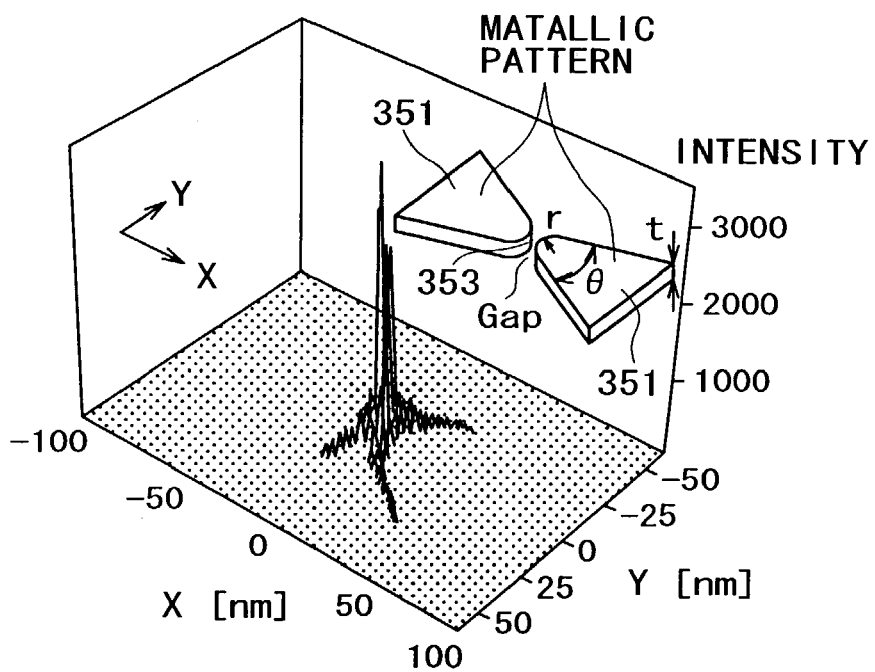
FIG. 43B is a view showing a probe that uses the conventional planar metal scatterer for a case of a combination of two scatterers.

The above-mentioned near-field optical probe can also be applied to exposure equipment for optical lithography. FIGS. 42A and 42B show its embodiments. A substrate to be processed 342 is coated with photoresist 341, and a probe having the scatterer 21 is brought close thereto. When light capable of exposing the photoresist is made to enter the probe, the intense optical near-field is generated at the vertex 22 to effect exposure of that part. Here, it is preferable that the wavelength of the incident light is set to a wavelength at which the photoresist is exposed and the plasmon resonance is excited. In this embodiment, a material of the scatterer 21 was chosen to be aluminum and light of a 442 nm wavelength was made to enter it. If the probe of this invention is used this way, a minute pattern that has sizes smaller than a few tens of nanometers can be exposed at high speed.

Note that the present invention includes the following constructions.

1. A recording or reproducing apparatus that uses an optical near-field generator comprising: a light source; and a conductive scatterer that generates the optical near-field, wherein the surfaces of the parts except for one vertex on the scatterer at which the optical near-field is generated are etched.

2. A recording or reproducing apparatus as described in the above-mentioned No. 1 structure, wherein a tangential direction of the vertex of the scatterer at which the optical near-field is generated is arranged to be at right angles to a direction of the recording track.

3. A scanning near-field optical microscope that uses an optical near-field generator comprising a light source and a conductive scatterer that generates an optical near-field, wherein the surfaces of the parts except for one vertex on the scatterer at which the optical near-field is generated are etched.

4. Exposure equipment that uses an optical near-field generator comprising: a light source; and a conductive scatterer that generates an optical near-field, wherein the surface of the parts except for one vertex on the scatterer at which the optical near-field is generated are etched.

[Non-Patent Reference 2]

Journal of Optical Society of America A, Vol. 12, No. 9, pp. 1974-1983, 1995

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An optical near-field generator comprising:
a light source;
a waveguide which propagates light emitted by the light source; and
an electroconductive scatterer configured to generate an optical near-field by plasmon resonance, the plasmon resonance being excited by light entered into the electroconductive scatterer from the waveguide,
wherein the electroconductive scatterer includes a first generation point region configured to generate an optical near-field by plasmon and a region other than the first generation point region,
wherein the first generation point region is thicker than the region other than the first generation point region,
wherein a length of the electroconductive scatterer between a first generation point of the optical near-field and a second generation point of the optical near-field is not longer than a wavelength of the light entered into the electroconductive scatterer, and material of the electroconductive scatterer are set so as to generate the optical near-field by plasmon resonance, and
wherein the first generation point is in the first generation point region and the second generation point is in the region other than the first generation point region.

2. The optical near-field generator of claim 1, wherein a distance between a medium irradiated by the optical near-field and the region other than the first generation point region of the electroconductive scatterer are not less than a penetration depth of the optical near-field.

3. The optical near-field generator of claim 1,
wherein the electroconductive scatterer is a planar electroconductive scatterer, and
wherein the electroconductive scatterer is arranged substantially parallel to a surface of a medium placed to be irradiated by the optical near-field.

4. The optical near-field generator of claim 1,
wherein the electroconductive scatterer is a planar electroconductive scatterer including,
a first plane including a first vertex adjacent to the surface of a medium, and
a second plane on an opposite side of the first plane,
wherein the second plane includes a second vertex adjacent to the surface,
wherein the electroconductive scatterer is arranged so that a direction of a plane of the electroconductive scatterer becomes substantially perpendicular to the surface of the medium placed to be irradiated by the optical near-field, and
wherein the generation point region includes one of: the first vertex, or a vertex existing between the first vertex and the second vertex.

5. The optical near-field generator of claim 1, wherein the electroconductive scatterer is one of:
a planar electroconductive scatterer having widths that decrease with decreasing distance from the generation point region;
a planar electroconductive scatterer in the shape of a circle;
a planar electroconductive scatterer in the shape of an ellipse; or
a planar electroconductive scatterer in the shape of a rectangle.

6. The optical near-field generator of claim 1, further comprising:
another electroconductive scatterer in a vicinity of the generation point region, wherein said another electroconductive scatterer includes a third generation point region, and
wherein a gap between the generation point region and the third generation point region is not more than a wavelength of the light entered into the electroconductive scatter.

7. The optical near-field generator of claim 1, wherein the electroconductive scatterer has the shape of one of:
a sphere or hemisphere having a diameter smaller than a wavelength of the light; or
an ellipsoid or hemispheroid having a major-axis length smaller than the wavelength of the light entered into the electroconductive scatter.

8. The optical near-field generator of claim 1,
wherein the generation point region is formed of a first material,
wherein the region other than the first generation point region is formed of other materials, and
wherein the first material is different than said other materials.

9. The optical near-field generator of claim 8, wherein hardness of the first material is greater than hardness of said other materials.

10. An optical near-field generator according to claim 8, wherein the first material is a luminescent material.

11. An optical near-field generator according to claim 1, wherein the electroconductive scatterer is embedded in a substrate and both the generation point region and a surface of the substrate are on a substantially same plane.

12. The optical near-field generator of claim 1, wherein the electroconductive scatterer is formed on a substrate, a pad part is formed in surroundings of the electroconductive scatterer of the substrate, and both the generation point region and a surface of the pad part are on a substantially same plane.

13. The optical near-field generator of claim 1, wherein a material different from a material that makes up the electroconductive scatterer is filled in a part of the electroconductive scatterer where a surface of the electroconductive scatterer is removed.

14. The optical near-field generator of claim 1, wherein a center position of light incident on the electroconductive scatterer substantially coincides with either a center position of the electroconductive scatterer or the first generation point region.

15. The optical near-field generator of claim 1, wherein a light-shielding film is formed in a vicinity of the electroconductive scatterer and spacing between the electroconductive scatterer and the light-shielding film is less than a wavelength of the light entered into the electroconductive scatterer.

16. The optical near-field generator of claim 1, wherein the electroconductive scatterer is formed at one of:
   a focusing point on a converging element;
   an end of an optical waveguide;
   a point in a vicinity of an optical cavity;
   a point in a vicinity of an exit face of a semiconductor laser;
   a point in a vicinity of a light-receiving plane of a photodetector; or
   a tip of a protrusion of a cone or pyramid.

17. A near-field optical probe comprising:
   an electroconductive scatterer configured to generate an optical near-field by plasmon resonance, the plasmon resonance being excited by light entered into the electroconductive scatterer,
   wherein the electroconductive scatterer includes a first generation point region configured to generate an optical near-field by plasmon and a region other than the first generation point region,
   wherein the generation point region is thicker than the region other than the first generation point region,
   wherein a length of the electroconductive scatterer between a generation point of the optical near-field and a second generation point of the optical near-field is not longer than a wavelength of the light entered into the electroconductive scatterer, and material of the electroconductive scatterer are set so as to generate the optical near-field by plasmon resonance, and
   wherein the first generation point is in the first generation point region and the second generation point is in the region other than the first generation point region.

18. An optical near-field application apparatus, comprising:
   a light source;
   an electroconductive scatterer configured to generate an optical near-field at a predetermined point by plasmon resonance, the plasmon resonance being excited by light entered into the electroconductive scatterer from the light source; and
   a substrate configured to support a medium that is to be irradiated with the optical near-field,
   wherein a gap between a region of the electroconductive scatterer except for the predetermined point and the medium is not less than a penetration depth of the optical near-field, and
   wherein a length of the electroconductive scatterer between a first generation point of the optical near-field and a second generation point of the optical near-field is not longer than a wavelength of the light entered into the electroconductive scatterer, and material of the electroconductive scatterer are set so as to generate the optical near-field by plasmon resonance.

19. The optical near-field generator of claim 2, wherein the medium is a recording medium.

20. The optical near-field generator of claim 3, wherein the medium is a recording medium.

21. The optical near-field generator of claim 4, wherein the medium is a recording medium.

22. The optical near-field application apparatus of claim 18, wherein the medium is a recording medium.

23. The optical near-field generator of claim 1, wherein a material of the scatterer comprises metal or semiconductor.

24. A near field optical probe of claim 17, wherein a material of the scatterer comprises metal or semiconductor.

25. The optical near-field application apparatus of claim 18, wherein a material of the scatterer comprises metal or semiconductor.

26. An optical near-field generator comprising:
   a light source;
   means for propagating light emitted by the light source; and
   an electroconductive scatterer configured to generate an optical near-field by plasmon resonance, the plasmon resonance being excited by light entered into the electroconductive scatterer from the means for propagating light emitted by the light source,
   wherein the electroconductive scatterer includes a first generation point region and a region other than the generation point region, and the first generation point region is thicker than the region other than the first generation region,
   wherein a length of the electroconductive scatterer between a generation point of the optical near-field and a second generation point of the optical near-field is not longer than a wavelength of the light entered into the electroconductive scatterer, and material of the electroconductive scatterer are set so as to generate the optical near-field by plasmon resonance, and
   wherein the first generation point is in the first generation point region and the second generation point is in the region other than the first generation point region.

27. The optical near-field generator of claim 26, wherein a distance between a medium irradiated by the optical near-field and the region other than the first generation point region of the electroconductive scatterer are not less than a penetration depth of the optical near-field.

28. The optical near-field generator of claim 26, wherein the electroconductive scatterer is a planar electroconductive scatterer, and wherein the electroconductive scatterer is arranged substantially parallel to a surface of a medium placed to be irradiated by the optical near-field.

29. The optical near-field generator of claim 26, wherein the electroconductive scatterer is a planar electroconductive scatterer including, a first plane including a first vertex adjacent to the surface of a medium, and a second plane on an opposite side of the first plane, wherein the second plane includes a second vertex adjacent to the surface, wherein the electroconductive scatterer is arranged so that a direction of a plane of the electroconductive scatterer becomes substantially perpendicular to the surface of the medium placed to be irradiated by the optical near-field, and
   wherein the first generation point region includes the first vertex or a vertex existing between the first vertex and the second vertex.

30. The optical near-field generator of claim 26, wherein the electroconductive scatterer is one of:
   a planar electroconductive scatterer having widths that decrease with decreasing distance from the generation point region;
   a planar electroconductive scatterer in the shape of a circle;
   a planar electroconductive scatterer in the shape of an ellipse; or a planar electroconductive scatterer in the shape of a rectangle.

31. The optical near-field generator of claim 26, further comprising: another electroconductive scatterer in a vicinity of the first generation point region,
wherein said another electroconductive scatterer includes a third generation point region, and
wherein a gap between the first generation point region and the third generation point region is not more than a wavelength of the light entered into the electroconductive scatterer.

32. The optical near-field generator of claim 26, wherein the electroconductive scatterer has the shape of one of:
a sphere or hemisphere having a diameter smaller than a wavelength of the light; or
an ellipsoid or hemispheroid having a major-axis length smaller than the wavelength of the light.

33. The optical near-field generator of claim 26,
wherein the first generation point region is formed of a first material,
wherein the region other than the first generation point are formed of other materials, and
wherein the first material is different than said other materials.

* * * * *